(12) United States Patent
Seol et al.

(10) Patent No.: US 9,536,970 B2
(45) Date of Patent: Jan. 3, 2017

(54) THREE-DIMENSIONAL SEMICONDUCTOR MEMORY DEVICES AND METHODS OF FABRICATING THE SAME

(75) Inventors: Kwang Soo Seol, Yongin-si (KR); Chanjin Park, Yongin-si (KR); Kihyun Hwang, Seongnam-si (KR); Hanmei Choi, Banpo-dong (KR); Dongchul Yoo, Seongnam-si (KR); Sunghoi Hur, Gangnam-gu (KR); Wansik Hwang, Hwaseong-si (KR); Toshiro Nakanishi, Gyeonggi-do (KR); Kwangmin Park, Seoul (KR); Juyul Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 1295 days.

(21) Appl. No.: 13/072,078

(22) Filed: Mar. 25, 2011

(65) Prior Publication Data

US 2011/0233648 A1    Sep. 29, 2011

(30) Foreign Application Priority Data

Mar. 26, 2010   (KR) .................. 10-2010-0027449
Jun. 10, 2010   (KR) .................. 10-2010-0055098
(Continued)

(51) Int. Cl.
*H01L 29/792*      (2006.01)
*H01L 29/423*      (2006.01)
(Continued)

(52) U.S. Cl.
CPC ... *H01L 29/42348* (2013.01); *H01L 21/32137* (2013.01); *H01L 27/0688* (2013.01);
(Continued)

(58) Field of Classification Search
CPC .......... H01L 21/32137; H01L 27/0688; H01L 27/11551; H01L 27/11556; H01L 27/11578; H01L 29/792; H01L 27/11582; H01L 29/42348; H01L 29/511; H01L 29/517; H01L 2924/0002; H01L 2924/00
See application file for complete search history.

(56) References Cited

U.S. PATENT DOCUMENTS 5,382,548 A    1/1995   Lee
7,620,921 B2   11/2009  Foreman et al.
(Continued)

FOREIGN PATENT DOCUMENTS

CN    101241914 A    8/2008
JP    2007-266143 A  10/2007
(Continued)

OTHER PUBLICATIONS

"Form", Merriam-Webster, Retrieved Date: Sep. 8, 2015, From URL: http://www.merriam-webster.com/dictionary/form (7 pages).
(Continued)

*Primary Examiner* — Hrayr A Sayadian
(74) *Attorney, Agent, or Firm* — Myers Bigel, P.A.

(57) ABSTRACT

Three-dimensional semiconductor memory devices and methods of fabricating the same. The three-dimensional semiconductor devices include an electrode structure with sequentially-stacked electrodes disposed on a substrate, semiconductor patterns penetrating the electrode structure, and memory elements including a first pattern and a second pattern interposed between the semiconductor patterns and the electrode structure, the first pattern vertically extending to cross the electrodes and the second pattern horizontally extending to cross the semiconductor patterns.

12 Claims, 70 Drawing Sheets

(30) Foreign Application Priority Data

| Jul. 5, 2010 | (KR) | 10-2010-0064413 |
|---|---|---|
| Jul. 5, 2010 | (KR) | 10-2010-0064415 |
| Aug. 31, 2010 | (KR) | 10-2010-0084971 |

(51) Int. Cl.
  *H01L 21/3213* (2006.01)
  *H01L 27/06* (2006.01)
  *H01L 27/115* (2006.01)
  *H01L 29/51* (2006.01)

(52) U.S. Cl.
  CPC .. *H01L 27/11551* (2013.01); *H01L 27/11556* (2013.01); *H01L 27/11578* (2013.01); *H01L 27/11582* (2013.01); *H01L 29/511* (2013.01); *H01L 29/517* (2013.01); *H01L 29/792* (2013.01); *H01L 2924/0002* (2013.01)

(56) References Cited

U.S. PATENT DOCUMENTS

| 7,956,408 | B2 | 6/2011 | Enda et al. |
|---|---|---|---|
| 2008/0067554 | A1 | 3/2008 | Jeong et al. |
| 2008/0179659 | A1 | 7/2008 | Enda et al. |
| 2008/0270953 | A1 | 10/2008 | Foreman et al. |
| 2009/0121271 | A1 | 5/2009 | Son et al. |
| 2009/0154240 | A1 | 6/2009 | Park et al. |
| 2009/0242966 | A1 | 10/2009 | Son et al. |
| 2009/0242967 | A1 | 10/2009 | Katsumata et al. |
| 2009/0296476 | A1 | 12/2009 | Shin et al. |
| 2009/0310415 | A1 | 12/2009 | Jin et al. |
| 2010/0019312 | A1 | 1/2010 | Sekine et al. |
| 2010/0078701 | A1 | 4/2010 | Shim et al. |
| 2010/0200906 | A1 | 8/2010 | Kidoh et al. |
| 2010/0283097 | A1 | 11/2010 | Endoh et al. |
| 2011/0033995 | A1 | 2/2011 | Katsumata et al. |

FOREIGN PATENT DOCUMENTS

| JP | 2008181978 A | 8/2008 |
|---|---|---|
| JP | 2009-027134 A | 2/2009 |
| JP | 2009094214 A | 4/2009 |
| JP | 2009-117843 A | 5/2009 |
| JP | 2009111049 A | 5/2009 |
| JP | 2009146954 A | 7/2009 |
| JP | 2009158775 A | 7/2009 |
| JP | 2009206451 A | 9/2009 |
| JP | 2009-224465 A | 10/2009 |
| JP | 2009224466 A | 10/2009 |
| JP | 2009224574 A | 10/2009 |
| JP | 2009272513 A | 11/2009 |
| JP | 2009277770 A | 11/2009 |
| JP | 2009295617 A | 12/2009 |
| JP | 2010-056533 A | 3/2010 |
| JP | 2010-182947 A | 8/2010 |
| KR | 20090047614 A | 5/2009 |
| KR | 20090093770 A | 9/2009 |
| KR | 20090103055 A | 10/2009 |
| KR | 20090123481 A | 12/2009 |
| KR | 20100007254 A | 1/2010 |
| KR | 20100009628 A | 1/2010 |
| KR | 10-2011-0042619 | 4/2011 |
| KR | 10-2011-0070142 | 6/2011 |
| KR | 10-2011-0086405 | 7/2011 |
| KR | 10-2011-0090056 | 8/2011 |
| KR | 10-2011-0094985 | 8/2011 |

OTHER PUBLICATIONS

"Pattern", Merriam-Webster, Retrieved Date: Sep. 8, 2015, From URL: http://www.merriam-webster.com/dictionary/pattern (6 pages).

Feb. 12, 2005 US Office Action issued in related U.S. Appl. No. 13/972,533.

THREE-DIMENSIONAL SEMICONDUCTOR MEMORY DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application Nos. 10-2010-0027449, filed on Mar. 26, 2010, 10-2010-0055098, filed on Jun. 10, 2010, 10-2010-0084971, filed on Aug. 31, 2010, 10-2010-0064413, filed on Jul. 5, 2010, and 10-2010-0064415, filed on Jul. 5, 2010, each filed in the Korean Intellectual Property Office (KIPO), the entire contents of each hereby incorporated by reference.

BACKGROUND

1. Field

Example embodiments of the inventive concepts relate to semiconductor devices and methods of fabricating the same, and more particularly, to three-dimensional semiconductor memory devices including three-dimensionally arranged memory cells and methods of fabricating the same.

2. Description of the Related Art

A 3D-IC memory technique may be used for increasing a memory capacity. 3D-IC memory technique refers generally to technologies related to arranging memory cells three-dimensionally. In addition to a 3D-IC memory technique, a memory capacity may be increased through (1) a pattern miniaturization technique; and (2) a multi-level cell (MLC) technique. However, the use of a pattern miniaturization technique may be limited due to high cost and the capacity increase achieved by the MLC technique may be limited to the number of bits to be increased in each cell. The pattern miniaturization technique and the MLC techniques may be combined with the 3D-IC technique, in terms of realizing a more increased memory capacity, and may be expected to develop separately from the 3D-IC technique.

One 3D-IC technique is a punch-and-plug technique. The punch-and-plug technique includes sequentially forming multi-layered thin layers on a substrate and then forming plugs to penetrate the thin layers. Through this technique, without a drastic increase of manufacturing costs, a memory capacity of a three-dimensional memory device may be achieved.

SUMMARY

Example embodiments of the inventive concepts may provide three-dimensional semiconductor devices increasing thicknesses of three-dimensionally-arranged conductive patterns, three-dimensional semiconductor devices reducing resistances of three-dimensionally arranged conductive patterns, three-dimensional semiconductor devices preventing and/or decreasing a reduction of operating current and an increase of string resistance, and methods of fabricating three-dimensional semiconductor devices preventing and/or decreasing a reduction of operating current and increase of string resistance.

According to example embodiments of the inventive concepts, three-dimensional semiconductor devices may include an electrode structure with sequentially-stacked electrodes and disposed on a substrate, semiconductor patterns penetrating the electrode structure and memory elements including a first pattern and a second pattern and interposed between the semiconductor patterns and the electrode structure, the first pattern vertically extending to cross over the electrodes and the second pattern horizontally extending to cross over the semiconductor patterns.

In some example embodiments, the second pattern may be substantially formed with a conformal thickness on a top surface and a bottom surface of the electrode and a sidewall of the electrode adjacent to the semiconductor pattern. In other example embodiments, the three-dimensional semiconductor device may further include interlayer insulating layers interposed between the electrodes at a vertical position, the first pattern continuously and vertically extending from between the semiconductor pattern and sidewalls of the electrode to be interposed between the interlayer insulating layer and the sidewalls of the semiconductor pattern and the second pattern continuously and horizontally extending from between the semiconductor pattern and sidewalls of the electrode to be interposed between the interlayer insulating layer and horizontal surfaces of the semiconductor pattern.

In still other example embodiments, the three-dimensional semiconductor may further include a capping layer disposed between the semiconductor pattern and the interlayer insulating layer, the capping layer being formed of a different material than the interlayer insulating layer. In even other example embodiments, the capping layer vertically may extend to be disposed between the electrode and the semiconductor pattern and a thickness of the capping layer may be thinner between the electrode and the semiconductor pattern than between the interlayer insulating layer and the semiconductor pattern. In yet other example embodiments, the second pattern directly may contact a sidewall of the first pattern and the capping layer may include portions separated vertically by the second pattern.

In further example embodiments, the first pattern and the second pattern may be substantially the same in terms of at least one of a chemical composition or an electrical property. In still further example embodiments, two kinds of atoms having the highest content of the second pattern may be identical to those having the highest content of the first pattern. In even further example embodiments, the memory element may include a charge storing layer, a tunnel insulating layer, and a blocking insulating layer, the tunnel insulating layer including at least one insulating layer and being interposed between the charge storing layer and the semiconductor pattern, the blocking insulating layer including at least one insulating layer and being interposed between the charge storing layer and the electrode.

In yet further example embodiments, the first pattern may include the tunnel insulating layer and the second pattern may include the charge storing layer and the blocking insulating layer. In yet further example embodiments, the first pattern may include the tunnel insulating layer and the charge storing layer and the second pattern may include the blocking insulating layer. In yet further example embodiments, the first pattern may be formed of a different material than the charge storing layer and further may include a capping layer interposed between the charge storing layer and the blocking insulating layer. In yet further example embodiments, both the second pattern and the first pattern may constitute one of the tunnel insulating layer, the blocking insulating layer, and the charge storing layer.

In yet further example embodiments, the second pattern and the first pattern may contact each other between the electrode and the sidewalls of the semiconductor pattern and two kinds of atoms having the highest content of the second pattern may be identical to those having the highest content of the first pattern contacting the second pattern. In yet further example embodiments, at least one of insulating layers constituting the tunnel insulating layer and at least one of insulating layers constituting the blocking insulating layer may be formed of materials having a higher band gap than the charge storing layer and at least one of insulating layers constituting the blocking insulating layer may have a larger dielectric constant than the tunnel insulating layer.

In yet further example embodiments, the tunnel insulating layer may include at least one silicon oxide layer; the charge storing layer may include one of insulating layers having a higher density of a trap site than a silicon oxide layer and insulating layers having intrinsic conductive nano particles and the blocking insulating layer may include at least one of an aluminum oxide layer, a hafnium oxide layer, a zirconium oxide layer, a tantalum oxide layer, a titanium oxide layer, a silicon nitride layer, a silicon oxynitride layer, or a silicon oxide layer. In yet further example embodiments, the electrodes may include at least one of doped silicon, metal materials, metal nitrides, or metal silicides. In yet further example embodiments, the electrodes may be formed of a conductive material having a lower resistivity than doped silicon.

In yet further example embodiments, the semiconductor pattern may include a spacer portion to be inserted in the first pattern and a body portion to be inserted in the semiconductor spacer, a bottom surface of the body portion being lower than that of the spacer portion. In yet further example embodiments, the body portion directly may contact the substrate and the spacer portion may be spaced from the substrate. In yet further embodiments, the body portion may include a core region covering an inner wall of the semiconductor spacer and a connection region extending from the core region to be inserted into a top surface of the substrate. In yet further example embodiments, a connection region of the body portion may extend horizontally to have a broader width than the spacer portion.

In yet further example embodiments, a connection region of the body portion may pass below the memory element to directly contact an inner sidewall of the substrate, thereby covering a bottom surface of the first pattern. In yet further example embodiments, the substrate may be formed of a semiconductor material having less crystal defects than the body portion. In yet further example embodiments, the spacer portion may protrude downwardly compared to a bottom surface of the first pattern. In yet further example embodiments, the three-dimensional semiconductor devices may further include a selection structure interposed between the electrode structure and the substrate, the selection structure including selection lines and a selection active pattern penetrating the selection lines to connect the semiconductor pattern with the substrate. A bottom surface of the first pattern is formed above the uppermost surface of the selection lines.

In yet further example embodiments, the first pattern may include a charge storing layer, a tunnel insulating layer between the charge storing layer and the semiconductor pattern, and a capping layer between the charge storing layer and the electrode, the charge storing layer protruding more downward than the capping layer and the tunnel insulating layer and a bottom surface of the capping layer being formed more adjacent to a top surface of the substrate than a bottom surface of the tunnel insulating layer. In yet further example embodiments, the substrate may include a contact region contacting the semiconductor pattern and a source region spaced from the contact region, the contact region having the same conductive type as the semiconductor pattern and the source region having a different conductive type than the contact region. In yet further example embodiments, the three-dimensional semiconductor devices may further include a source conductive pattern penetrating the electrode structure to contact the source region.

According to other example embodiments of the inventive concepts, methods of fabricating a three-dimensional semiconductor device may include forming a mold structure on a substrate, the mold structure including sequentially and alternately stacked mold layers and sacrificial layers, forming an opening penetrating the mold structure, forming a first pattern and a semiconductor pattern covering an inner wall of the opening sequentially, forming recess regions between the mold layers by removing the sacrificial layers and forming a second pattern and an electrode covering an inner wall of the recess region sequentially.

In some example embodiments, the forming of the first pattern may include forming a tunnel insulating layer and the forming of the second pattern may include sequentially forming a charge storing layer and a blocking insulating layer. The tunnel insulating layer and the blocking insulating layer may be formed of a material having a larger band gap than the charge storing layer and the blocking insulating layer may be formed of a material having a larger dielectric constant than the tunnel insulating layer. In other example embodiments, the forming of the first pattern may include forming a charge storing layer and a tunnel insulating layer sequentially and the forming of the second pattern may include forming a blocking insulating layer. The tunnel insulating layer and the blocking insulating layer may be formed of a material having a larger band gap than the charge storing layer and the blocking insulating layer being formed of a material having a larger dielectric constant than the tunnel insulating layer.

In still other example embodiments, the tunnel insulating layer may be formed after the forming of the charge storing layer and the blocking insulating layer may be formed after the forming of the charge storing layer. In even other example embodiments, the forming of the first pattern may include forming a capping layer before the forming of the charge storing layer, the capping layer being formed of a different material than the charge storing layer. In yet other example embodiments, the forming of the recess region may include isotropically etching the sacrificial layer by using an etch recipe having an etch selectivity with respect to the mold layer and the capping layer. In further example embodiments, the method may further include, before the forming of the second pattern, exposing an outer wall of the first pattern by etching the capping layer exposed by the recess region. In still further example embodiments, by substantially forming the second pattern and the first pattern with a material having the same chemical composition, two kinds of atoms having the highest content of the second pattern may be identical to those having the highest content of the first pattern.

In even further example embodiments, the forming of the first pattern and the semiconductor pattern may include forming a first layer and a first semiconductor layer covering an inner wall of the opening sequentially, forming a first semiconductor pattern exposing the first layer at a bottom of the opening by isotropically etching the first semiconductor layer, and isotropically etching the first layer by using the first semiconductor pattern as an etch mask. In yet further example embodiments, the methods may further include, before the isotropically etching of the first layer, opening again a bottom surface of the opening by anisotropically etching the first layer by using the first semiconductor pattern as an etch mask. In yet further example embodiments, the methods may further include, before the forming of the mold layer, forming a selection active pattern connecting the semiconductor pattern with the substrate.

According to still other example embodiments of the inventive concepts, three-dimensional semiconductor devices include an electrode structure including electrodes stacked sequentially on a substrate, interlayer insulating layers interposed between the electrodes at a vertical position, a semiconductor pattern penetrating the electrode structure, a second pattern interposed between the electrode and the semiconductor pattern and between the electrode and the interlayer insulating layer, and a first pattern interposed in a region between the semiconductor pattern and the interlayer insulating layer. The second pattern and the first second pattern are substantially the same in terms of at least one of a chemical composition or an electrical property. In some example embodiments, the first pattern vertically may extend to be interposed in a region between sidewalls of the second pattern and the semiconductor pattern. In other example embodiments, two kinds of atoms having the highest content of the second pattern may be identical to those having the highest content of the first pattern.

According to even other example embodiments of the inventive concepts, three-dimensional semiconductor devices include a selection structure and a memory structure stacked sequentially on a semiconductor substrate. The selection structure includes selection lines, a selection active pattern, and a selection gate insulating layer, the selection active pattern penetrating the selection lines to contact the semiconductor substrate, the selection gate insulating layer being disposed between the selection lines and the selection active pattern. The memory structure includes word lines, a memory active pattern, and a memory gate insulating layer, the memory active pattern penetrating the word lines to contact the selection active pattern, the memory gate insulating layer being disposed between the word lines and the memory active pattern, and a portion of the memory gate insulating layer extending to cover a top surface and a bottom surface of the word line.

In some example embodiments, a bottom region of the selection active pattern may be inserted at a predetermined depth in a top surface of the semiconductor substrate, with the selection gate insulating layer being locally formed between the selection active pattern and sidewalls of the selection line so that an inserted portion of the selection active pattern all directly contacts the semiconductor substrate. In other example embodiments, the semiconductor substrate may include a recess region into which the selection active pattern is inserted and a width of the recess region of the semiconductor substrate may be identical to that of the selection active pattern inserted into the recess region. In still other example embodiments, the selection active pattern may be formed of a semiconductor having the same conductive type as a region of the semiconductor substrate that the selection active pattern contacts or an intrinsic semiconductor, and the selection active pattern may be formed of a semiconductor having the same conductive type as the memory active pattern.

In even other example embodiments, the selection active pattern may include a sidewall penetrating the selection lines and a bottom extending horizontally and continuously from a bottom region of the sidewall to cover a top surface of the semiconductor substrate. A horizontal thickness of the sidewall may be substantially formed with the same thickness as a vertical thickness of the bottom so that the selection active pattern has a U-shaped section. In yet other example embodiments, the selection active pattern may have a rectangular or trapezoidal section at least below the lowest bottom surface of the memory active pattern. In further example embodiments, the memory gate insulating layer may include a blocking insulating layer adjacent to the word line, a tunnel insulating layer adjacent to the memory active pattern, and a charge storing layer interposed between the blocking insulating layer and the tunnel insulating layer, with the selection gate insulating layer being different from the memory gate insulating layer in terms of at least one of material or thickness.

In still further example embodiments, the selection gate insulating layer may be substantially identical to the blocking insulating layer in terms of at least one of material or thickness. In even further example embodiments, the tunnel insulating layer may cross over a plurality of vertically-stacked word lines and the blocking insulating layer may cross over a plurality of horizontally-arranged memory active patterns. In yet further example embodiments, the selection active pattern may be formed of silicon and the selection gate insulating layer may be a silicon oxide layer formed in a local region between the selection active pattern and the selection line. The selection active pattern being thicker on or below the selection line than around the selection gate insulating layer.

According to yet other example embodiments of the inventive concepts, methods of fabricating three-dimensional structure devices may include forming a mold structure on a substrate, forming an opening penetrating the mold structure to recess a top surface of the substrate at a predetermined depth, sequentially forming a first layer and a first semiconductor layer to cover an inner wall of the opening, forming a penetrating dent penetrating the first semiconductor layer and the first layer at a bottom of the opening to again expose a top surface of the substrate, forming an under-cut region exposing a sidewall of the substrate recessed by the opening by isotropically etching the first layer exposed through the penetrating dent, and forming a second semiconductor layer in the under-cut region to connect the substrate and the first semiconductor layer.

In some example embodiments, the first layer and the first semiconductor layer may be sequentially formed to substantially cover an inner wall of the opening with a conformal thickness, and the sum of deposition thicknesses of the first layer and the first semiconductor layer may be less than the half of a width of the opening. The forming of the penetrating dent may include forming a semiconductor spacer to expose a top surface of the first layer at a bottom of the opening by anisotropically etching the first semiconductor layer and anisotropically etching the first layer exposed by the semiconductor spacer.

In other example embodiments, the forming of the penetrating dent may further include, before the anisotropically etching of the first semiconductor layer, forming a protective layer spacer to expose a bottom surface of the first semiconductor layer in an inner sidewall of the first semiconductor layer, and the protective layer spacer may be formed of a material having an etch selectivity with respect to the first semiconductor layer and may be formed with a thinner thickness than the half of a difference between the half of a width of the opening and the sum of deposition thicknesses of the first layer and the first semiconductor layer. In still other example embodiments, the methods may further include, before the forming of the under-cut region, isotropically etching the first semiconductor layer by using the protective layer spacer as an etch mask.

In even other example embodiments, the protective layer spacer may be removed during the forming of the under-cut region. In yet other example embodiments, the first layer may include a capping layer, a charge storing layer, and a tunnel layer, which sequentially cover an inner wall of the opening. The forming of the under-cut region may include forming a first under-cut region to expose the capping layer and the tunnel layer by isotropically etching the charge storing layer exposed by the penetrating dent, and forming a second under-cut region by isotropically etching the capping layer and the tunnel layer exposed by the first under-cut region. In further example embodiments, the first layer may include a capping layer, a charge storing layer, and a tunnel layer, which sequentially cover an inner wall of the opening. The forming of the under-cut region may include forming a first under-cut region to expose the charge storing layer by isotropically etching the tunnel layer and the capping layer exposed by the penetrating dent and forming a second under-cut region by isotropically etching the charge storing layer exposed by the first under-cut region.

According to further example embodiments of the inventive concepts, methods of fabricating three-dimensional structure devices include forming a multi-layered structure on a substrate, forming an opening penetrating the multi-layered structure to recess a top surface of the substrate at a predetermined depth, sequentially forming a first layer and a first semiconductor layer to cover an inner wall of the opening, forming a protective layer spacer in an inner sidewall of the first semiconductor layer to expose a bottom surface of the first semiconductor layer, forming an under-cut region to expose a sidewall of the substrate recessed by the opening by sequentially and isotropically etching the first semiconductor layer and the first layer using the protective layer spacer as an etch mask, and forming a second semiconductor layer in the under-cut region to connect the substrate with the first semiconductor layer.

In some example embodiments, the isotropically etching of the first semiconductor layer may include exposing a surface of the first layer by dry-etching an exposed surface of the first semiconductor layer, the dry-etching being performed at atmosphere without intentionally-generated plasma. In other example embodiments, the dry-etching may be performed using (1) first gas including fluorine atoms, (2) second gas including chlorine atoms, and/or (3) carrier gas including at least one of argon, helium or nitrogen. In still other example embodiments, the dry-etching may be performed under a pressure condition of less than 1 atmospheric pressure and a temperature condition of about 350° C. to about 500° C. In even other example embodiments, the isotropically etching of the first layer may include etching a surface of the first layer by using an etchant, the surface of the first layer being exposed by etching the first semiconductor layer.

In yet other example embodiments, the etchant may include liquid materials having an etch selectivity with respect to the first semiconductor layer and used for etching the first layer. In further example embodiments, the first layer may include a plurality of thin layers covering an inner wall of the opening and at least one of the thin layers constituting the first layer is a silicon oxide layer or a silicon nitride layer. In still further example embodiments, the first layer may include a capping layer, a charge storing layer, and a tunnel insulating layer, which sequentially cover an inner wall of the opening and the isotropically etching of the first layer includes sequentially and isotropically etching the tunnel insulating layer, the charge storing layer, and the capping layer. The etching of the tunnel insulating layer and the capping layer is performed using an etchant including fluorine acid and the etching of the charge storing layer is performed using an etchant including phosphoric acid. In even further example embodiments, the protective layer spacer may be etched and removed during the isotropically etching of the first layer.

According to one or more example embodiments, a three-dimensional semiconductor device includes an electrode structure including a stacked plurality of electrodes on a substrate, a plurality of semiconductor patterns penetrating the electrode structure and a plurality of memory elements between the semiconductor patterns and the electrode structure, the memory elements including a first pattern extending in a first direction to cross the plurality of electrodes and a second pattern extending in a second direction orthogonal to the first direction to cross the plurality of semiconductor patterns.

According to one or more example embodiments, a three-dimensional semiconductor device includes an electrode structure including a plurality of electrodes stacked sequentially on a substrate, a plurality of interlayer insulating layers between the plurality of electrodes, respectively, a semiconductor pattern penetrating the electrode structure, a first pattern between the electrodes and the semiconductor pattern and between the electrodes and the interlayer insulating layers, and a second pattern between the semiconductor pattern and the interlayer insulating layer, at least one of a chemical composition and an electrical property of the first pattern substantially identical to a corresponding one of a chemical composition and an electrical property of the second pattern.

According to one or more example embodiments, a three-dimensional semiconductor device includes a selection structure on a semiconductor substrate, the selection structure including a plurality of selection lines, a selection active pattern, and a selection gate insulating layer, the selection active pattern penetrating the selection lines to contact the semiconductor substrate, the selection gate insulating layer between the selection lines and the selection active pattern, and a memory structure stacked on the selection structure, the memory structure including a plurality of word lines, a memory active pattern, and a memory gate insulating layer, the memory active pattern penetrating the word lines to contact the selection active pattern, the memory gate insulating layer between the word lines and the memory active pattern, at least a portion of the memory gate insulating layer covering at least a portion of opposing surfaces of each of the word lines.

According to one or more example embodiments, a method of fabricating a three-dimensional semiconductor device includes forming a mold structure including a plurality of mold layers alternately stacked with a plurality of sacrificial layers on a substrate, forming an opening penetrating the mold structure, sequentially forming a first pattern and a semiconductor pattern on an inner wall of the mold structure inside the opening, forming recess regions between the mold layers by removing the sacrificial layers, and sequentially forming a second pattern and an electrode between the mold layers in the recess region.

According to one or more example embodiments, a method of fabricating a three-dimensional semiconductor device includes forming a mold structure on a substrate, forming an opening penetrating through the mold structure and a surface of the substrate so that a recess is formed in the substrate, sequentially forming a first layer and a first semiconductor layer to cover an inner wall of the mold structure in the opening and the substrate in the recess, forming a penetrating dent to penetrate through the first semiconductor layer and the first layer to expose a surface of the substrate in the recess, forming an under-cut region exposing a sidewall of the substrate in the recess by isotropically etching the first layer exposed by the penetrating dent, and forming a second semiconductor layer in the under-cut region to connect the substrate and the first semiconductor layer.

According to one or more example embodiments, a method of fabricating a three-dimensional semiconductor device includes forming a multi-layered structure on a substrate, forming an opening penetrating the multi-layered structure and recessing a surface of the substrate, sequentially forming a first layer and a first semiconductor layer to cover an inner wall of the multi-layered structure and the recessed substrate in the opening, forming a protective layer spacer on an inner sidewall of the first semiconductor layer, forming an under-cut region to expose a sidewall of the recessed substrate in the opening by sequentially and isotropically etching the first semiconductor layer and the first layer using the protective layer spacer as an etch mask, and forming a second semiconductor layer in the under-cut region to connect the substrate with the first semiconductor layer.

BRIEF DESCRIPTION OF THE DRAWINGS

Example embodiments will be more clearly understood from the following brief description taken in conjunction with the accompanying drawings.

FIGS. 1-11 are perspective views illustrating methods of fabricating three-dimensional semiconductor devices according to example embodiments of the inventive concepts;

FIG. 93 is a block diagram illustrating information processing systems including memory systems according to example embodiments of the inventive concepts.

Figure 1:
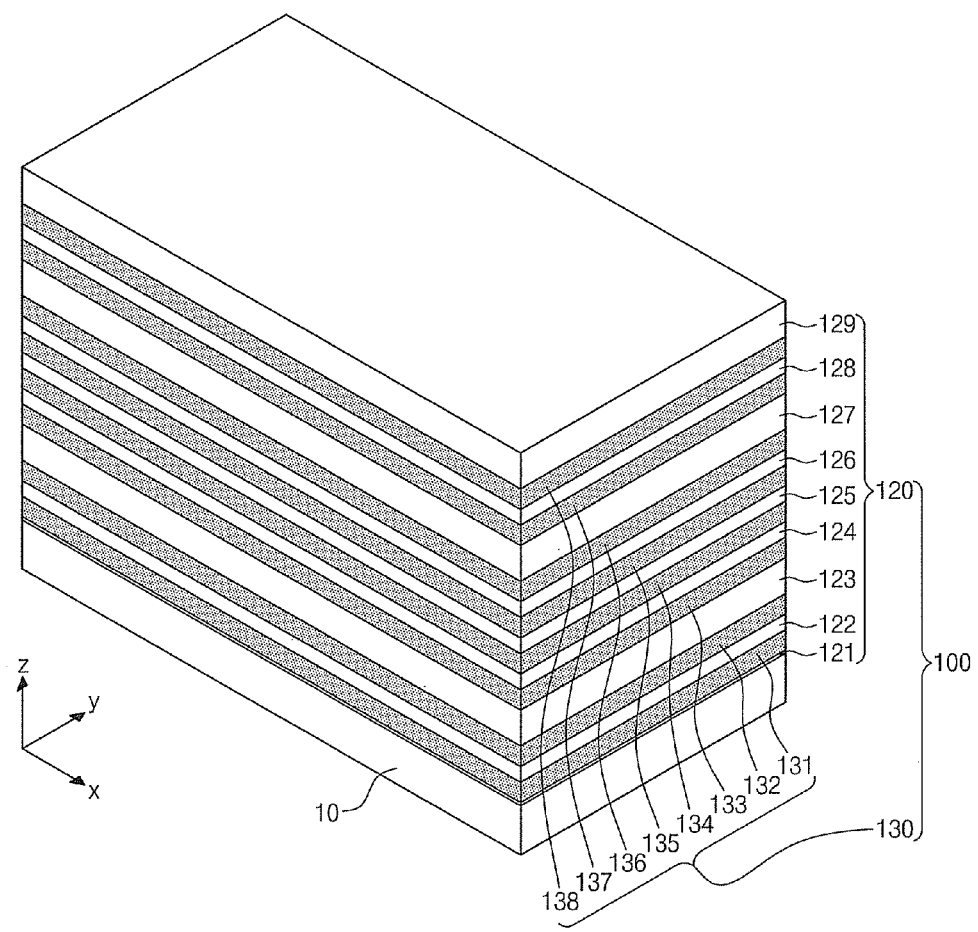
FIGS. 1-93 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A three-dimensional semiconductor device according to example embodiments of the inventive concepts may include a cell array region, a peripheral circuit region, a sense amp region, a decoding circuit region and a connection region. A plurality of memory cells and bit lines and word lines for electrical connection to the plurality of memory cells may be in the cell array region. Circuits for driving the plurality of memory cells may be in the peripheral circuit region, and circuits for reading information stored in the plurality of memory cells may be in the sense amp region. The connection region may be between the cells array region and the decoding circuit region, and a wiring structure for electrically connecting the word lines with the decoding circuit region may be between the word lines and the decoding region.

Hereinafter, technical features related partially to a cell array region of a three-dimensional device will be mainly described. In addition, Korean Patent Application Nos. 2009-0126854, filed on Dec. 18, 2009, 2010-0014751, filed on Feb. 18, 2010, 2010-0006124, filed on Jan. 22, 2010, and 2009-0099370, filed on Oct. 19, 2009, and U.S. patent application Ser. No. 12/480,399, filed on Jun. 8, 2009, may disclose technical features related to the cell array region and other regions (e.g., a peripheral region or a connection region). The entire contents disclosed in Korean Patent Application Nos. 2009-0126854, 2010-0014751, 2010-0006124 and 2009-0099370, and U.S. patent application Ser. No. 12/480,399 are hereby incorporated as part of this application.

Furthermore, Korean Patent Application No. 2010-0006124, the disclosure of which is incorporated by reference herein in its entirety, may disclose a multi-layered memory structure obtained by repeatedly forming a memory structure. That is, in some embodiments of the inventive concept, a multilayered memory structure may be formed by repeatedly stacking a memory structure, which will be explained in the following description, using ways disclosed in the Korean Patent Application No. 2010-0006124.

FIGS. 1-11 are perspective views illustrating methods of fabricating three-dimensional semiconductor devices according to example embodiments of the inventive concepts. Referring to FIG. 1, a mold structure 100 may be formed on a substrate 10. The substrate 10 may be, for example, a material having semiconductor property, an insulation material, a semiconductor, a conductor, and/or one or more of these materials covered by an insulation material. For example, the substrate 10 may be a silicon wafer. According to example embodiments, a substrate may include one or more layers supported by another layer and/or structure. For example, a semiconductor substrate may include a semiconductor layer on a material having semiconductor property, an insulation material, a semiconductor, a conductor, and/or one or more of these materials covered by an insulation material.

According to example embodiments, a bottom structure (not shown) including at least one transistor may be disposed between the substrate 10 and the mold structure 100. In the following description, for easier understanding of example embodiments of the inventive concepts, example embodiments may be described with a mold structure 100 directly formed on a substrate 10. However, example embodiments of the inventive concepts are not limited thereto.

The mold structure 100 may include an insulating layer group 120 including a plurality of insulating layers (e.g., insulating layers 121-129) and a sacrificial layer group 130 including a plurality of sacrificial layers (e.g., sacrificial layers 131-138). The insulating layers 121-129 and the sacrificial layers 131-138 may be stacked in an alternating. The sacrificial layer group 130 may include at least one material with an etch selectivity to the insulating layer group 120. The insulating layer group 120 may include a material that is etched at a slower rate than a material of the sacrificial layer group 130 with respect to a sacrificial layer material etchant.

The etch selectivity may be quantitatively expressed as a ratio of an etch speed of a material of the sacrificial layer group 130 to a material of the insulating layer group 120. According to example embodiments, the sacrificial layer 130 may be one or more materials providing an etch selectivity of 1:10 to 1:200 (e.g., 1:30 to 1:100) with respect to one or more materials of the insulating layer group 120. For example, the insulating layer group 120 may be at least one of a silicon oxide and a silicon nitride, and the sacrificial layer group 130 may be at least one of silicon, a silicon oxide, a silicon carbide and silicon nitride. The sacrificial layer group 130 may be selected to be a different material from the insulating layer group 120. In the following description, for easier understanding of example embodiments of the inventive concepts, example embodiments will be described with respect to a silicon oxide insulating layer group 120 and a silicon nitride sacrificial layer group 130. However, example embodiments are not limited to silicon oxide and silicon nitride, and each layer group is not limited to a single material.

According to example embodiments, the sacrificial layers 131-138 may be formed to substantially the same thickness. Thicknesses of the insulating layers 121-129 may not be substantially the same. For example, in the insulating layer group 120, the insulating layer 121 may be thinner than each of the sacrificial layers 131-138. The insulating layer 123 and the insulating layer 128 may be thicker than each of the sacrificial layers 131-138. Each of the insulating layers 122, 124-127 and 129 of the insulating layer group 120 may be thicker, thinner or substantially a same thickness as any of the sacrificial layers 131-138. However, the thicknesses of the insulating layers 121-129 may be modified from the drawings and the number of layers constituting the mold structure 100 may be diversely modified.

Hereinafter, for ease of explanation, each insulating layer 121-129 of the insulating layer group 120 will be described and depicted in the drawings as an insulating layer 120 and each sacrificial layer 131-138 of the sacrificial layer group 130 will be described and depicted as a sacrificial layer 130.

Figure 2:
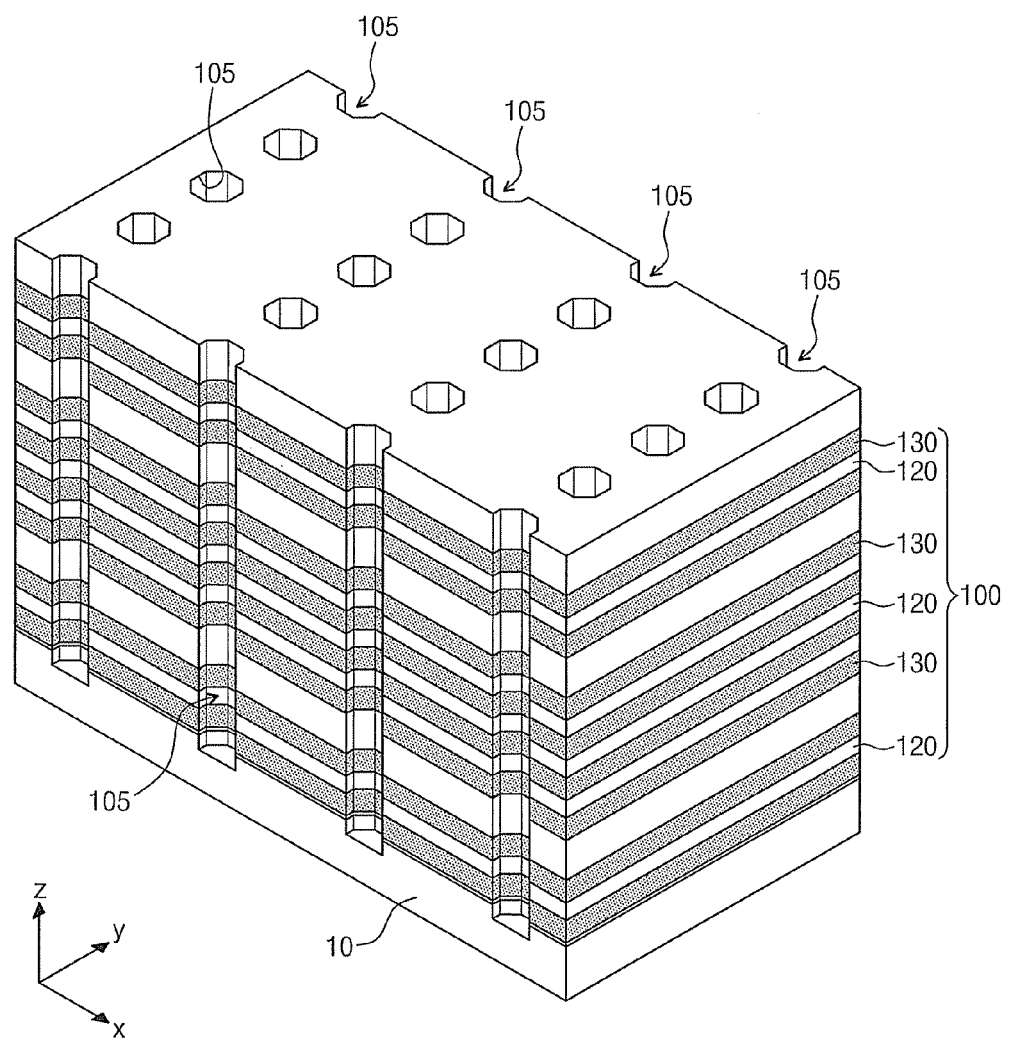
Figure 3:
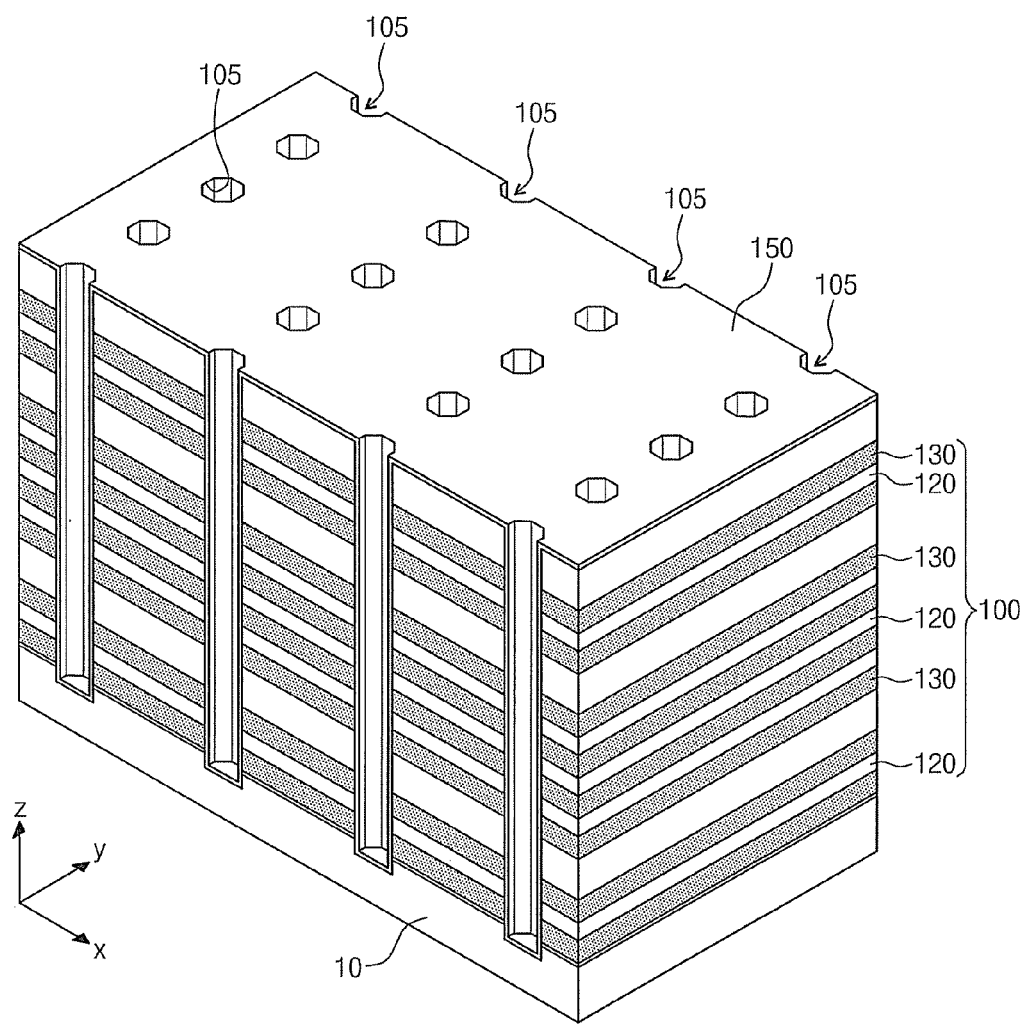

Referring to FIGS. 2 and 3, openings 105 may be formed to penetrate the mold structure 100. A vertical layer 150 may be formed to conformally cover the inner walls of the openings 105. The vertical layer 150 may extend horizontally from the openings 105 to cover the top surface of the mold structure 100. According to example embodiments, the openings 105 may be formed with, for example, a hole shape. Each of the openings 105 may be formed with a shape in which its depth may be at least five times its width (e.g., an aspect ratio of 5). According to example embodiments, the openings 105 may be two-dimensionally formed on the top surface (i.e., the xy plane) of the substrate 10. For example, each opening 105 may be an isolated region spaced apart from other openings 105 along x and y directions.

The forming of the openings 105 may include forming a mask pattern defining positions of the openings 105 on the mold structure 100 and, for example, anisotropically etching the mold structure 100 using the mask pattern as an etch mask. Because the mold structure 100 may include two kinds of different layers, the sidewall of the opening 105 may not be completely uniform from the top surface of the substrate 10. For example, as the opening 105 is closer to the top surface of the substrate 10 the width of the opening 105 may be reduced. This non-uniform width of the opening 105 may cause non-uniformity in operational characteristics of three-dimensionally arranged transistors. Detailed description of this non-uniformity and methods of improving the same may be disclosed in U.S. patent application Ser. No. 12/420,518, the entire contents of which are incorporated as part of this application.

A mold structure 100 may be directly formed on the substrate 10. The opening 105 may be formed to expose the top surface of the substrate 10 as illustrated. The substrate 10 below the opening 105 may be recessed due to over-etch during the anisotropic etching of the mold structure 100. The vertical layer 150 may include one thin layer or a plurality of thin layers. For example, the vertical layer 150 may include at least one of thin layers used as a memory element of a charge trap type nonvolatile memory transistor. Example embodiments of the inventive concepts may be diversely classified according to the thin layers of the vertical layer 150.

Figure 4:
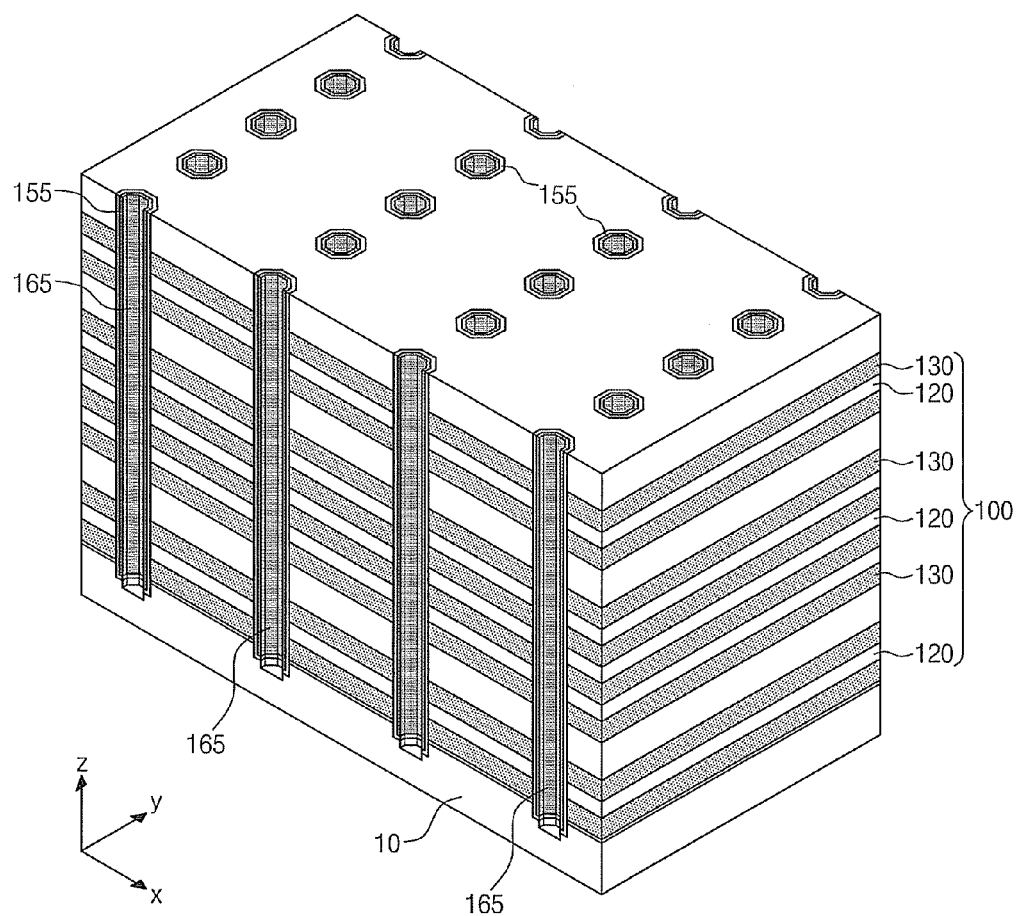

Referring to FIG. 4, a vertical pattern 155 and a semiconductor spacer 165 may be formed on each inner wall of the openings 105. The forming of the vertical pattern 155 and a semiconductor spacer 165 may include forming a first semiconductor layer (not shown) that conformally covers the hole 105 with the vertical layer 150, and anisotropically etching the first semiconductor layer and the vertical layer 150 to expose the top surface of the substrate 10 at the bottom of the openings 105. The vertical pattern 155 and the semiconductor spacer 165 may be formed with, for example, a cylindrical shape with open ends. The top surface of the substrate 10 exposed by the semiconductor spacer 165 may be recessed by over etching during the anisotropic etching of the first semiconductor layer.

Figure 24:
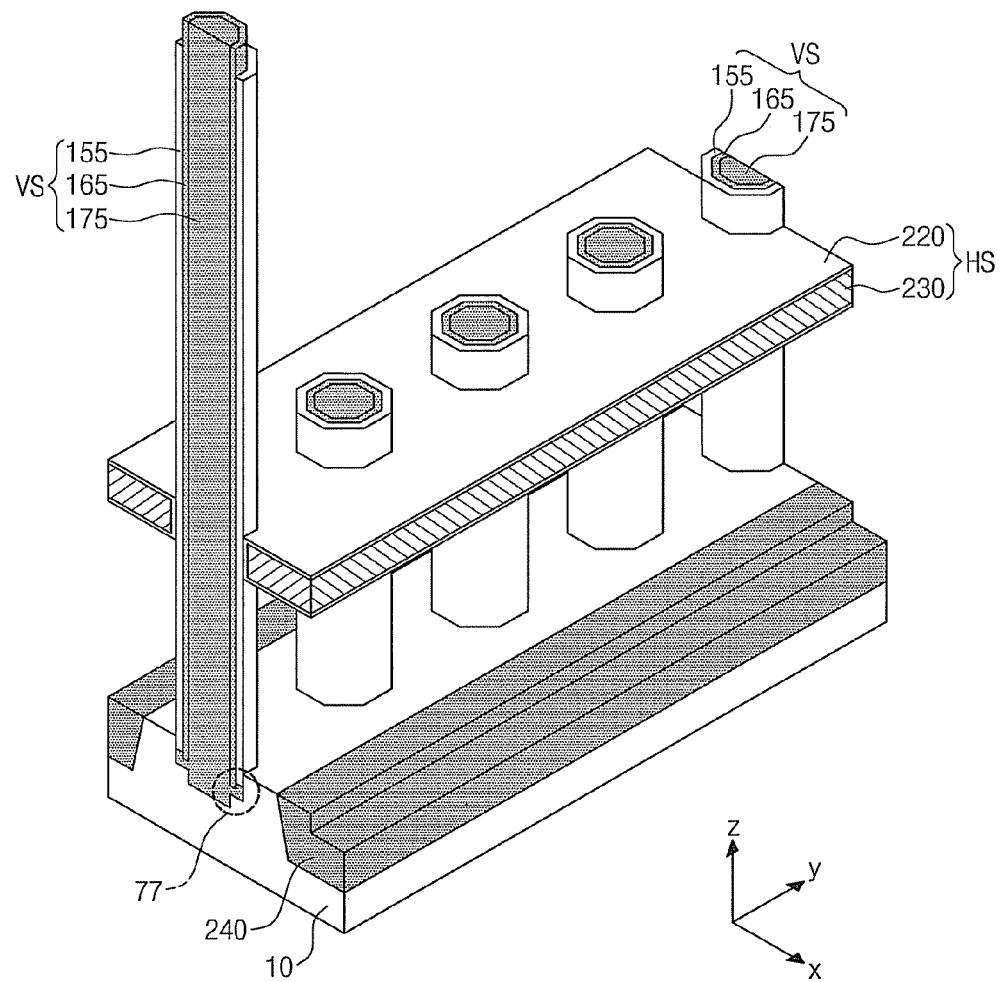

During the anisotropic etching of the first semiconductor layer and the vertical layer 150, the vertical layer 150 under the semiconductor spacer 165 may not be fully etched, and the vertical pattern 155 may include a bottom portion between the bottom surface of the semiconductor spacer 165 and the top surface of the substrate 10. Example embodiments may include etching the exposed surface of the vertical pattern 155 using the semiconductor spacer 165 as an etch mask. As illustrated in FIG. 24, an under-cut region may be formed below the semiconductor spacer 165 and the length of the vertical pattern 155 may be shorter than that of the semiconductor spacer 165.

The top surface of the mold structure 100 may be exposed by the anisotropic etching of the first semiconductor layer and the vertical layer 150. Each of the vertical patterns 155 and the semiconductor spacers 165 may be localized in the openings 105. The vertical patterns 155 and the semiconductor spacers 165 may be two-dimensionally arranged on the xy plane.

The first semiconductor layer may be a silicon layer (e.g., a polycrystalline silicon layer) formed using one of, for example, atomic layer deposition (ALD) and chemical vapor deposition (CVD). The first semiconductor layer may be formed, for example, with a thickness ranging from about $1/50$ to $1/5$ of the width of the opening 105. The first semiconductor layer may be formed using an epitaxial technique. Korean Patent Application No. 2010-0009628, filed on Feb.

2, 2010, the disclosure of which is incorporated by reference herein in its entirety, may disclose epitaxial techniques. According to example embodiments of the inventive concepts, the first semiconductor layer may be, for example, one of an organic semiconductor layer and carbon nano structures.

Figure 5:
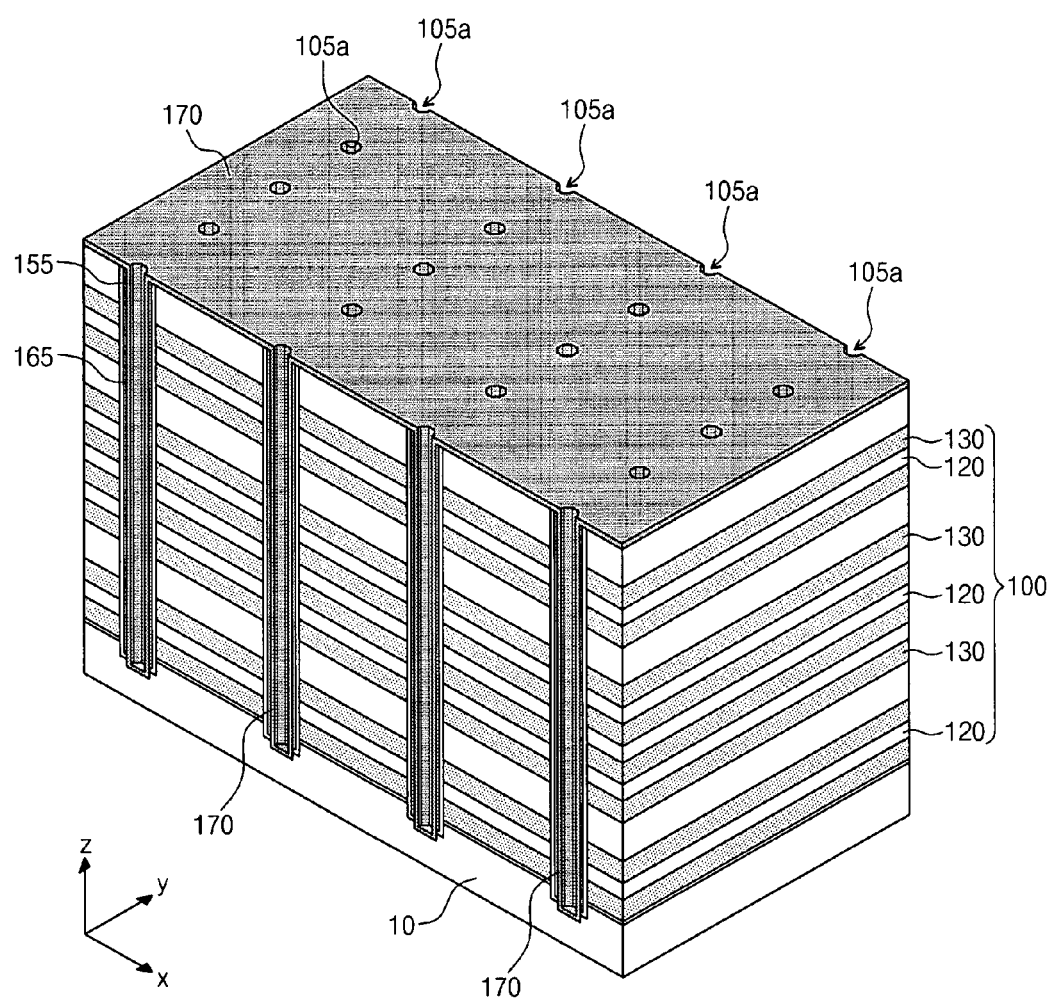
Figure 6:
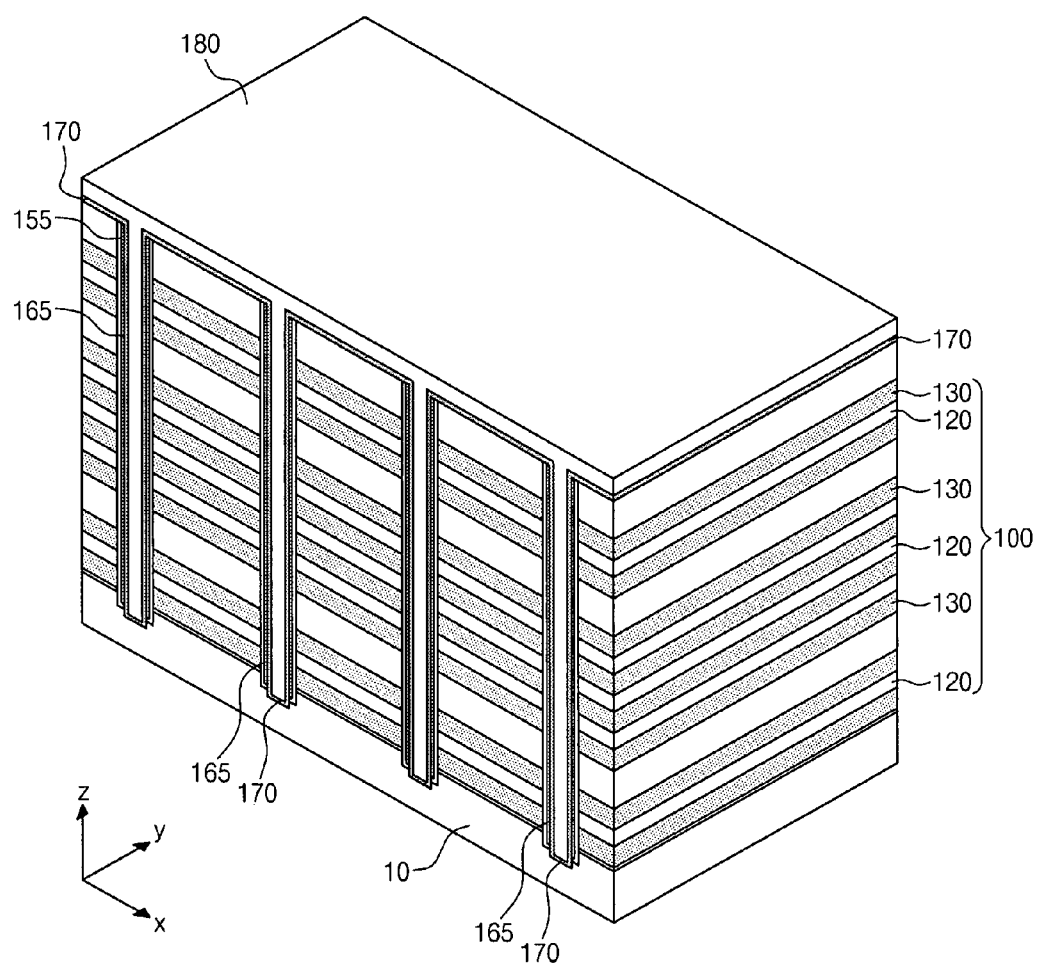

Referring to FIGS. 5 and 6, a second semiconductor layer 170 and a buried insulating layer 180 may be formed on the structure including the vertical pattern 155 (e.g., sequentially deposited). The second semiconductor layer 170 may be a silicon layer (e.g., a polycrystalline silicon layer) formed using, for example, ALD and/or CVD. According to example embodiments, the second semiconductor layer 170 may be conformally formed to a thickness that does not completely bury the opening 105. The second semiconductor layer 170 may define a hole 105a in the opening 105.

The buried insulating layer 180 may be formed to fill the hole 105a and may an insulation material formed by, for example, using spin-on-glass (SOG) and/or forming a silicon oxide layer. According to example embodiments a hydrogen annealing step for thermally treating the structure including the second semiconductor layer 170 under a gas atmosphere including hydrogen and/or heavy hydrogen may be performed (e.g., before the forming of the buried insulating layer 180). Crystal defects in the semiconductor spacer 165 and the second semiconductor layer 170 may be cured and/or reduced during the hydrogen annealing.

Figure 7:
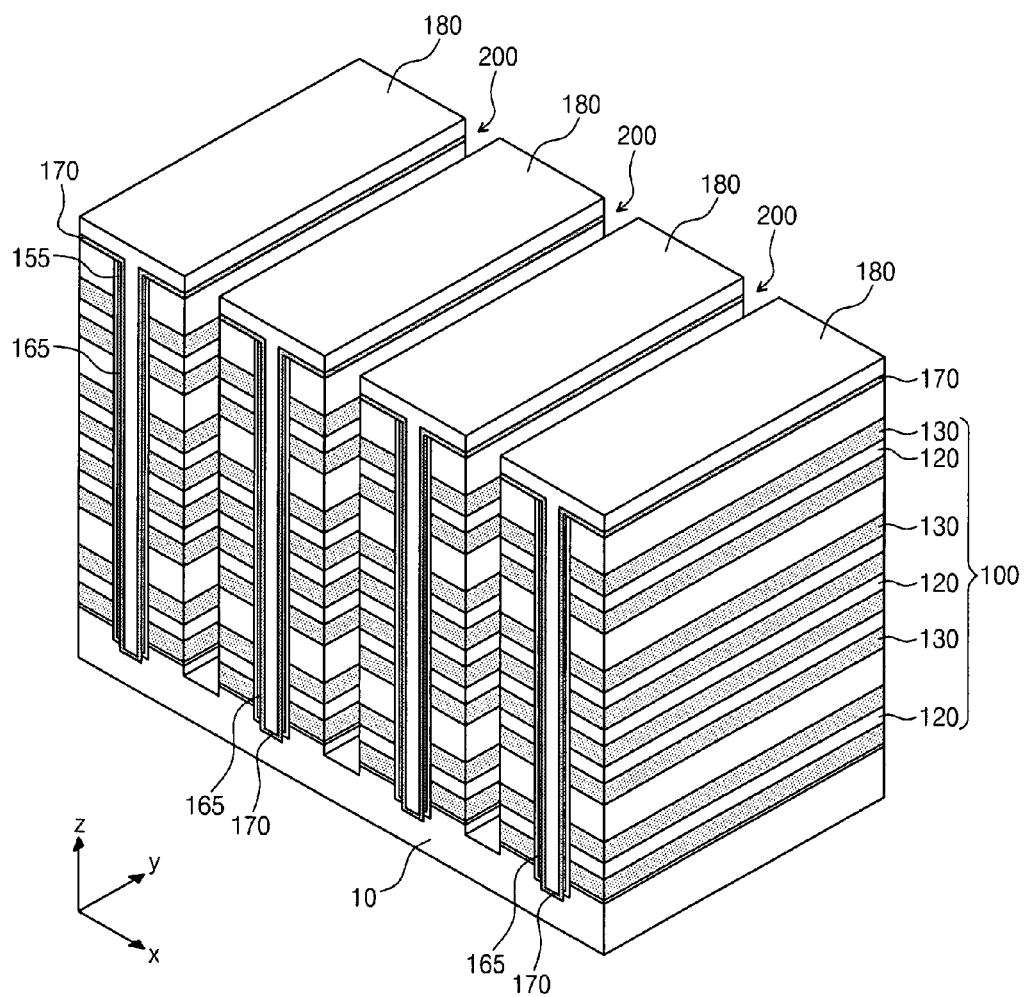
Figure 23:
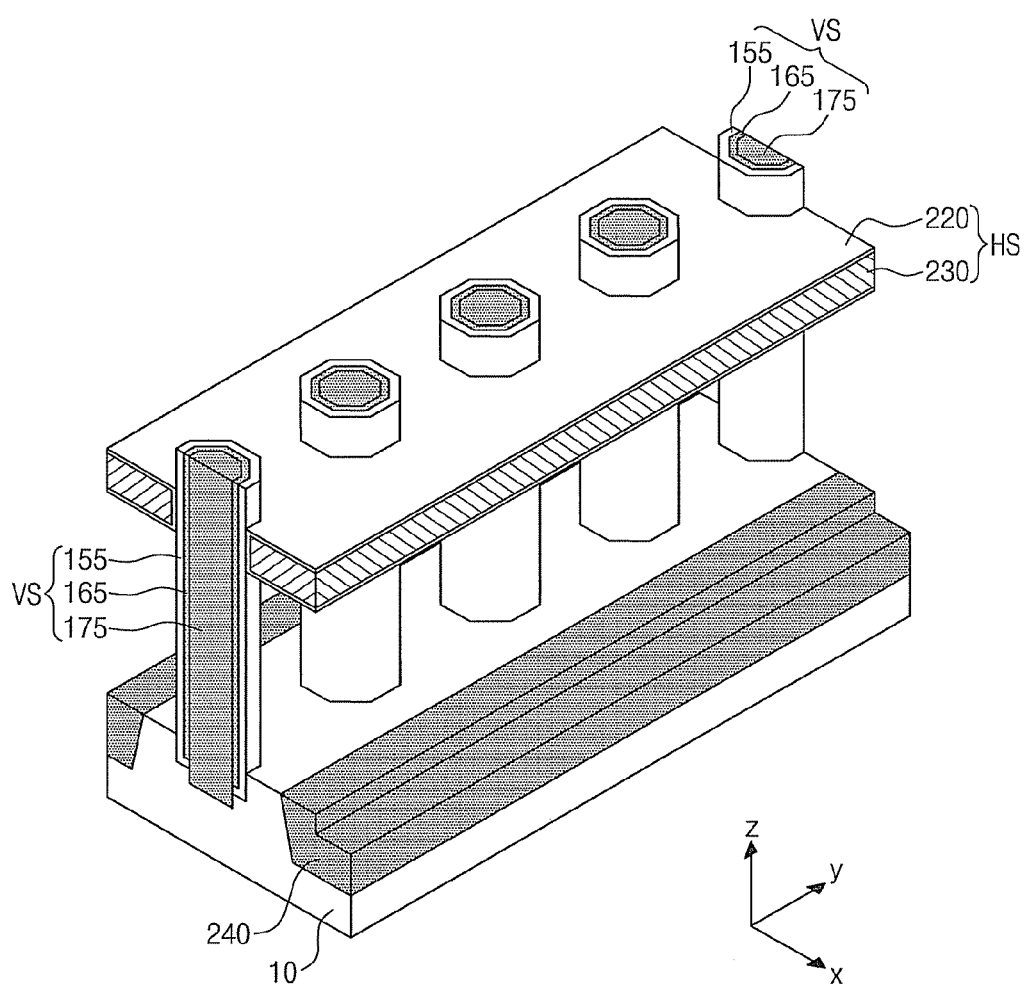

According to example embodiments of the inventive concepts, the second semiconductor layer 170 may be formed to fill the openings 105 in which the semiconductor spacers 165 are formed, and the forming of the buried insulating layer 180 may be omitted as illustrated in FIGS. 23 and 24. Referring to FIG. 7, trenches 200 penetrating the mold structure 100 and exposing the sidewalls of the sacrificial layers 130 and the insulating layers 120 may be formed. The trenches 200 may be spaced apart from and cross over between the openings 105.

The forming of the trenches 200 may include forming an etch mask on the mold structure 100 and/or on the buried insulating layer 180 and anisotropically etching layers below the etch mask to, for example, expose the top surface of the substrate 10. The second semiconductor layer 170 and the buried insulating layer 180 may be patterned to define top entrances of the trenches 200 above the mold structure 100. The substrate 10 under the trench 200 may be recessed by over-etching during anisotropic etching of the layers below the etch mask. Because the opening 105 and the trenches 200 may be formed by etching the same layers, similar to the opening 105, the closer to the top surface of the substrate 10, the narrower the trench may be (e.g., may have a reduced width). This non-uniform width of the trench 200 may cause non-uniformity in operational characteristics of three-dimensionally arranged transistors. Detailed description of this non-uniformity and improving methods thereof may be disclosed in U.S. patent application Ser. No. 12/420,518, the entire contents of which are incorporated as part of this application.

According to example embodiments, a pair of trenches 200 may be formed at both sides of each of the openings 105. The number of the openings 105 with the same y coordinate and arranged along the x-axis may be substantially equal to that of the trenches 200. However, example embodiments of the inventive concepts are not limited thereto and the number of openings with the same y coordinate and arranged along the x-axis may be different than the number of trenches. For example, Korean Patent Application No. 2009-0126854, filed on Dec. 18, 2009, discloses embodiments related to a relative arrangement of trenches with respect to openings, the entire contents of which is hereby incorporated as part of this application.

Figure 8:
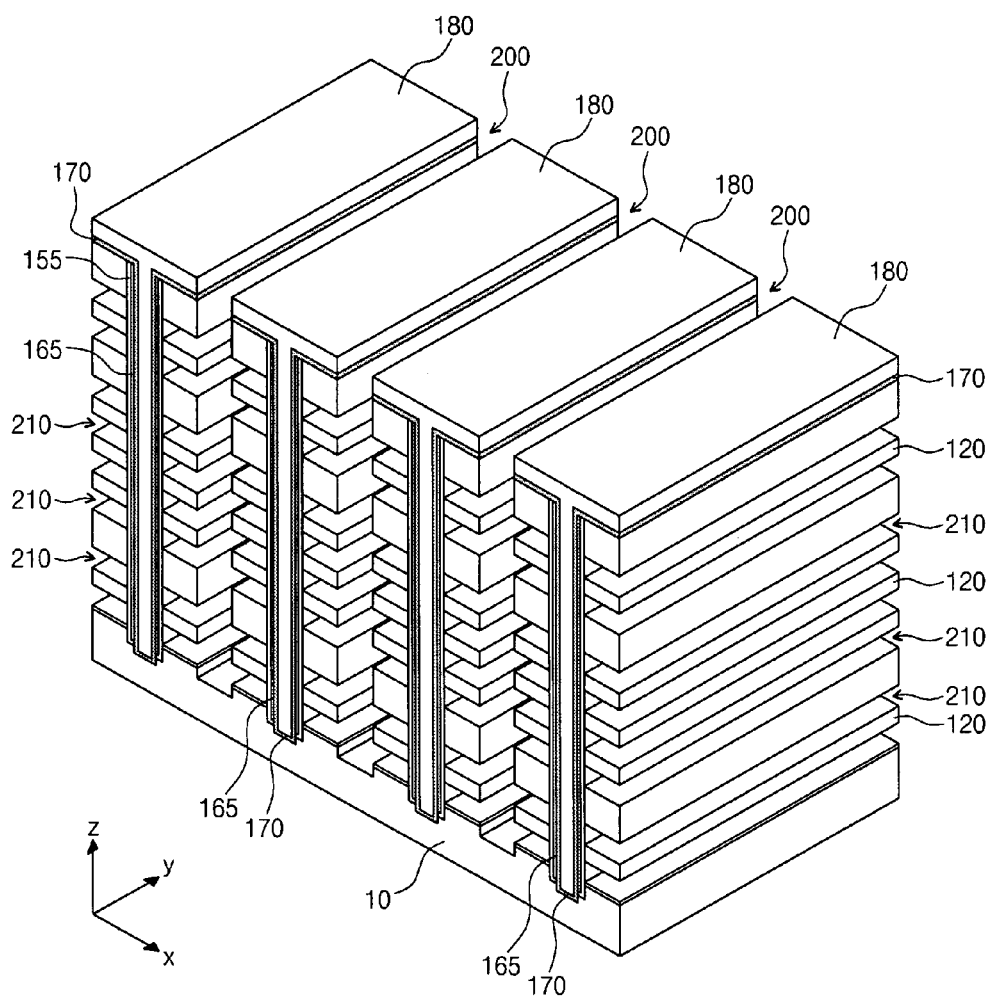

Referring to FIG. 8, recess regions 210 may be formed between the insulating layers 120 by selectively removing the exposed sacrificial layers 130. The recess regions 210 may be gap regions extending laterally from the trenches 200, and may be formed to expose the sidewalls of the vertical patterns 155. An outer boundary of the recess region 210 may be defined by the insulating layers 120 and the trenches 200 at both sides of the outer boundary. An internal boundary of the recess region 210 may be defined by the vertical patterns 155 vertically penetrating the internal boundary. The forming of the recess regions 210 may include horizontally etching the sacrificial layers 130 using, for example, an etchant and/or etch process with etch selectivity to the insulating layers 120 and the vertical patterns 155. For example, if the sacrificial layers 130 are silicon nitride layers and the insulating layers 120 are silicon oxide layers, the horizontal etch may be performed using an etchant including phosphoric acid.

Figure 9:
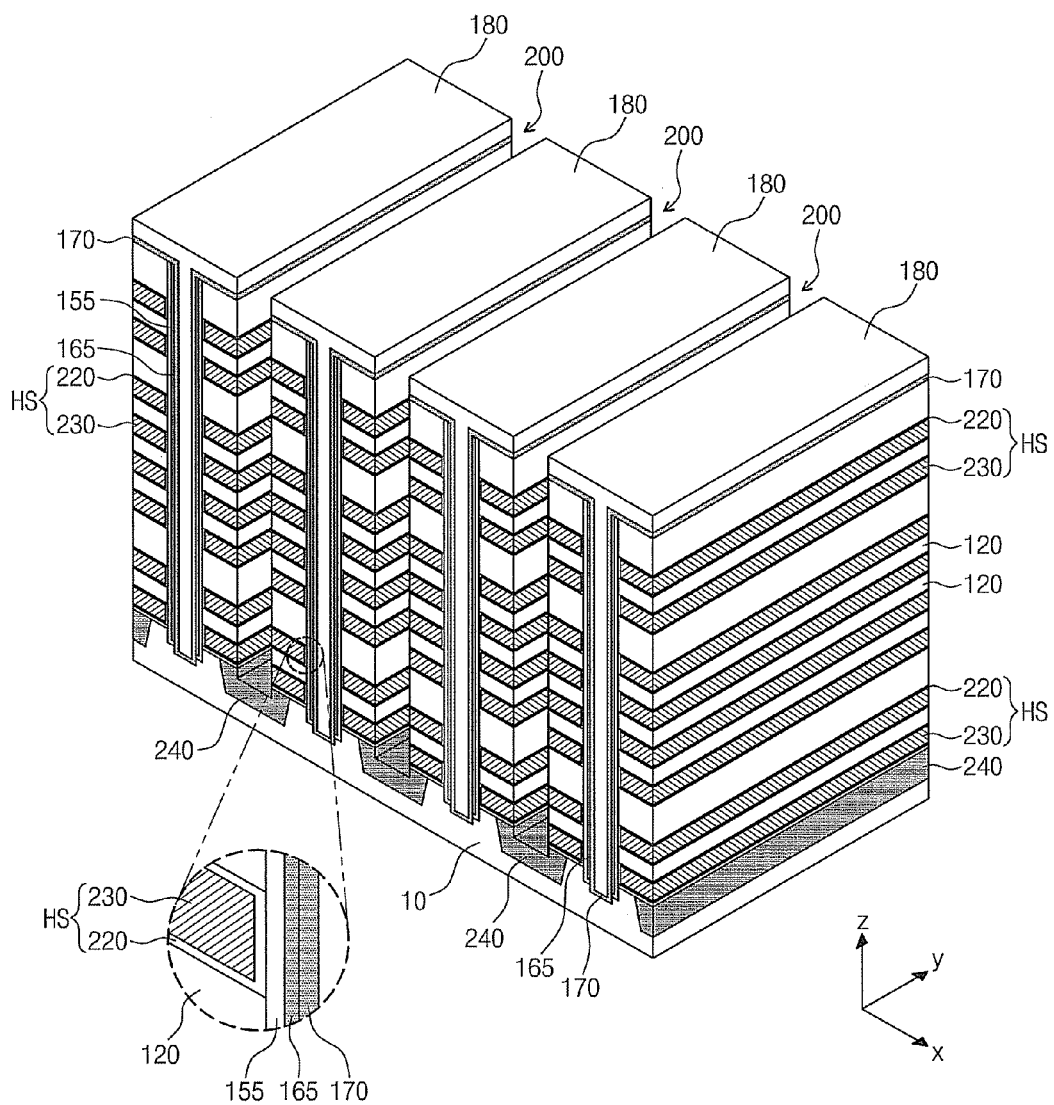

Referring to FIG. 9, horizontal structures HS filling the recess regions 210 are formed. The horizontal structure HS may include horizontal patterns 220 covering the inner walls of the recess region 210 and a conductive pattern 230 filling the remaining space. The forming of the horizontal structures HS may include forming a horizontal layer and a conductive layer (not shown) to fill the recess regions 210 (e.g., sequentially forming), and removing the conductive layer in the trenches 200 so that the conductive patterns 230 remain in the recess regions 210. The horizontal layer or the horizontal pattern 220 may be one thin layer and/or a plurality of thin layers (e.g., similarly to the vertical layer 150). According to example embodiments, the horizontal pattern 220 may include a blocking dielectric layer of a charge trap type nonvolatile memory transistor. Example embodiments of the inventive concepts may be diversely classified according to the thin layers used as the vertical layer 150 and the horizontal pattern 220.

The conductive layer may be formed to fill the recess regions 210 covered by the horizontal layer. The trenches 200 may be completely and/or partially filled by the conductive layer. The conductive layer may include, for example, doped silicon, metallic materials, metal nitride layers, and/or metal silicide. For example, the conductive layer may include a tantalum nitride layer and/or tungsten. According to example embodiments, the conductive layer may be formed to conformally cover the inner walls of the trench 200, and the forming of the conductive pattern 230 may include removing the conductive layer in the trench 200 using, for example, an isotropic etch. According to example embodiments, the conductive layer may be formed to fill the trench 200 and the forming of the conductive pattern 230 may include, for example, an isotropic etch of the conductive layer in the trench 200.

According to example embodiments of the inventive concepts with respect to a flash memory, impurity regions 240 may be formed. The impurity regions 240 may be formed through an ion implantation process, and may be formed in the substrate 10 exposed through the trench 200. The impurity regions 240 may be a different conductive type than the substrate 10. A region (hereinafter, a contact region) of the substrate 10 contacting the second semiconductor layer 170 may be the same conductive type as the substrate 10. The impurity regions 240 and the substrate 10 and/or the second semiconductor layer 170 may form a P-N junction. According to example embodiments, the impurity regions

240 may be connected to each other and may be in an equipotential state. According to example embodiments, the impurity regions 240 may be at different electric potentials and may be electrically separated from each other. According to example embodiments, the impurity regions 240 may be a plurality of separate source groups including different impurity regions and the source groups may be electrically separated from each other to be at different electric potentials.

Figure 10:
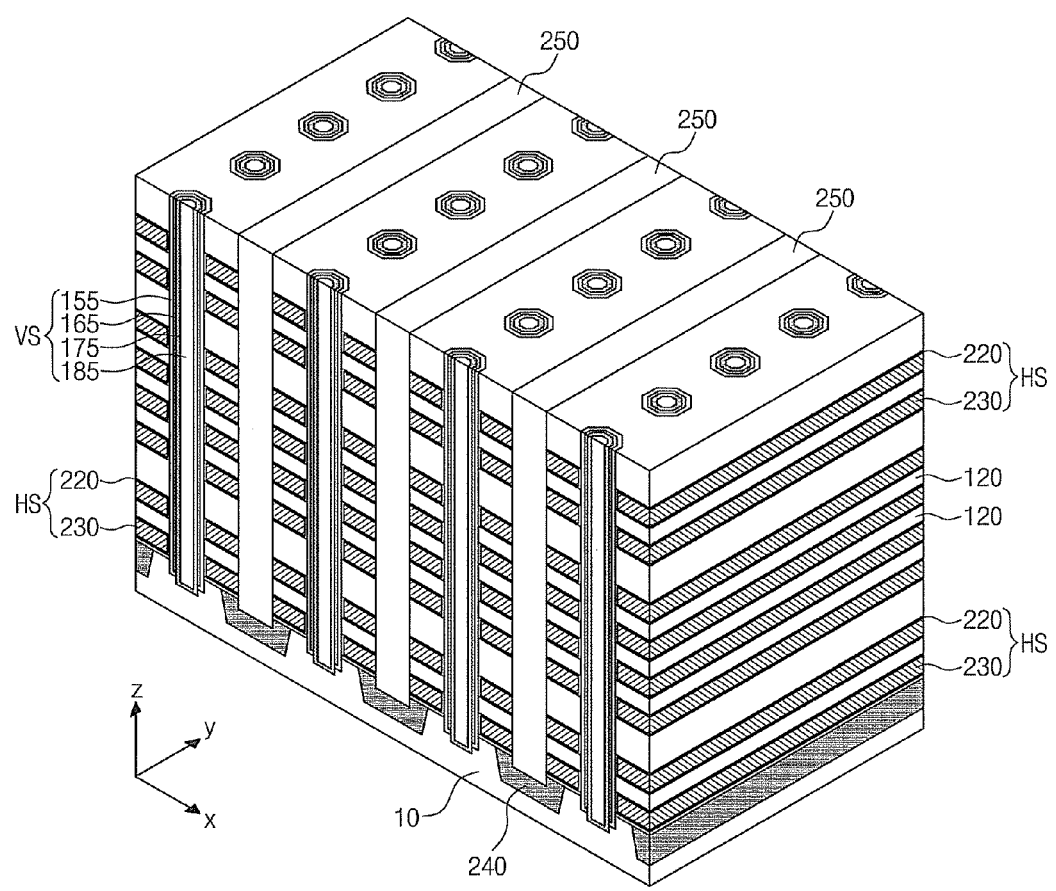

Referring to FIG. 10, an electrode separation pattern 250 may be formed to fill the trenches 200. The forming of the electrode separation pattern 250 may include forming an electrode separation layer (not shown) on the structure including the impurity regions 240 and etching to expose the top surface of the mold structure 100. The electrode separation layer may be formed of, for example, at least one of a silicon oxide layer, a silicon nitride layer and a silicon oxynitride layer. The etch step may be performed using a planarization technique, for example, a chemical-mechanical polishing technique and/or an etch-back technique. The buried insulating layer 180 and the second semiconductor layer 170 may form buried patterns 185 and semiconductor body portions 175 in each of the openings 105.

According to example embodiments of the inventive concepts, a plurality of vertical structures VS penetrating the mold structure 100 may be two-dimensionally formed on the substrate 10. Each of the vertical structures VS may include the vertical pattern 155, the semiconductor spacer 165, the semiconductor body portion 175 and/or the buried patterns 185. Positions of the vertical structures VS may be defined by the openings 105.

Figure 11:
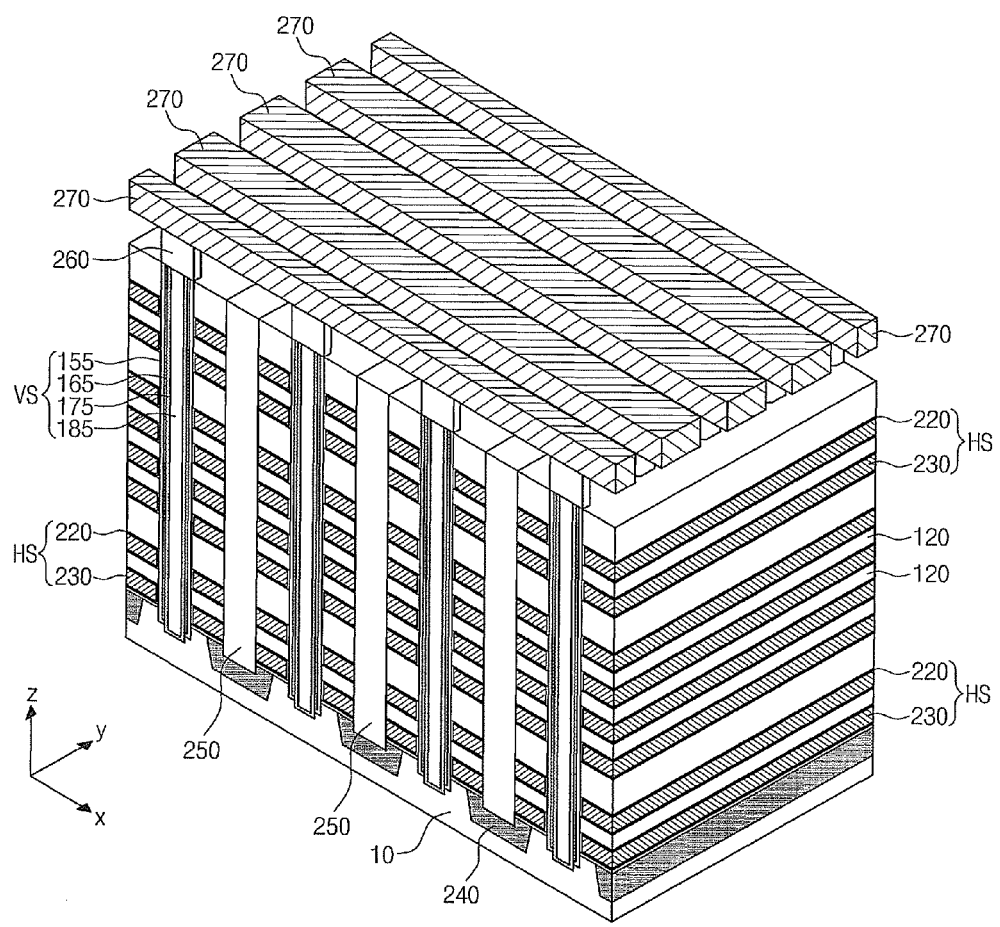

Referring to FIG. 11, upper plugs 260 may be formed on each of the vertical structures VS and upper wirings 270 may be formed on the upper plugs 260 to connect the vertical structures VS and upper wirings 270. According to example embodiments, the top regions of the semiconductor spacer 165 and the semiconductor body portion 175 may include an upper impurity region (not shown). The bottom of the upper impurity region may be higher than the top surface of the uppermost layer in the horizontal structures HS. The upper impurity region may be doped with a different conductive type than a portion of the semiconductor spacer 165 below the upper impurity region. The upper impurity region and a bottom region thereof may form a diode. According to example embodiments, the upper plugs 260 may be, for example, doped silicon and/or metallic materials.

According to example embodiments, the upper plugs 260 may be, for example, a silicon layer of a different conductive type than the semiconductor spacer 165 and the semiconductor body portion 175. The upper plugs 260 may form a P-N junction with the semiconductor spacer 165 and the semiconductor body portion 175. Each of the upper wirings 270 may be electrically connected to the semiconductor spacer 165 and the semiconductor body portion 175 through the upper plug 260, and may cross over the horizontal structures HS. According to example embodiments of a NAND flash memory, the upper wirings 270 may be used as bit lines contacting one end of a plurality of cell strings.

Figure 12:
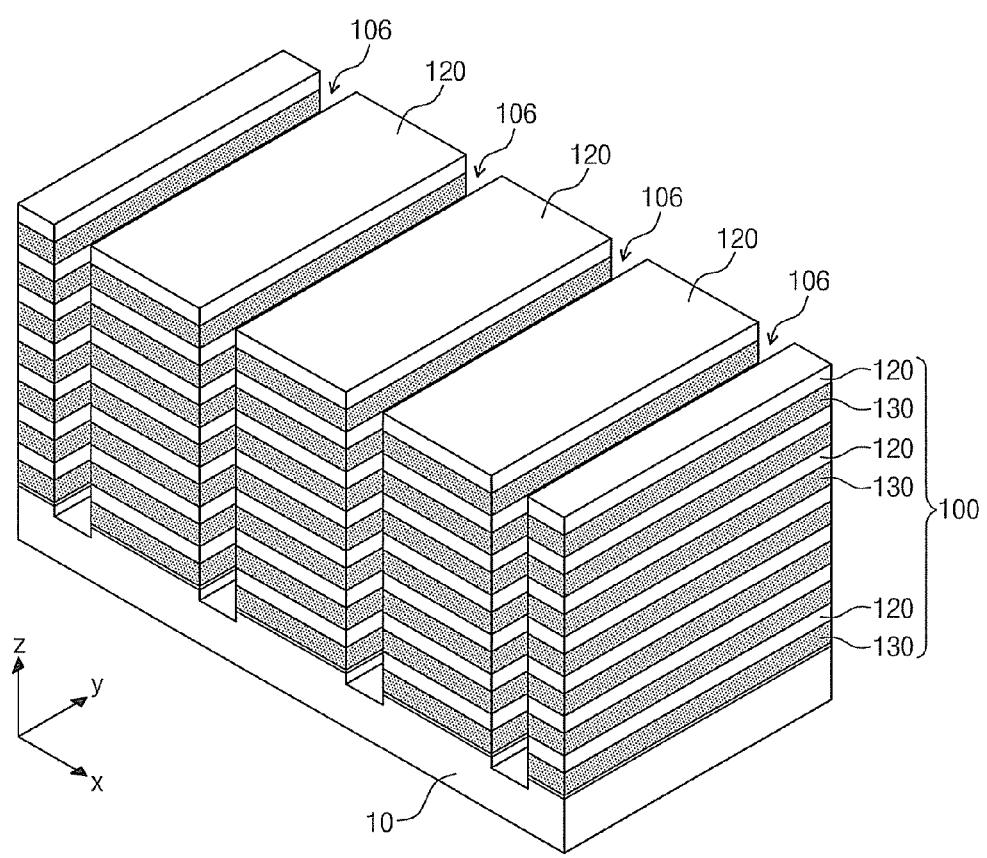
FIGS. 12-21 are perspective views illustrating methods of fabricating three-dimensional semiconductor devices according to example embodiments of the inventive concepts.

FIGS. 12-21 are perspective views illustrating methods of fabricating three-dimensional semiconductor devices according to example embodiments of the inventive concepts. For conciseness, elements which may be substantially identical to those of example embodiments described with reference to FIGS. 1-11 may be omitted in the following description. Referring to FIGS. 1 and 12, openings 106 penetrating the mold structure 100 may be formed. According to example embodiments, a portion of the openings 106 may be, for example, a hexahedral shape where aspect ratios of sections projected on the xy plane and the xz plane are greater than about 5. The lengths in the y and z directions of the opening 106 may be five times of that in the x direction thereof.

Figure 13:
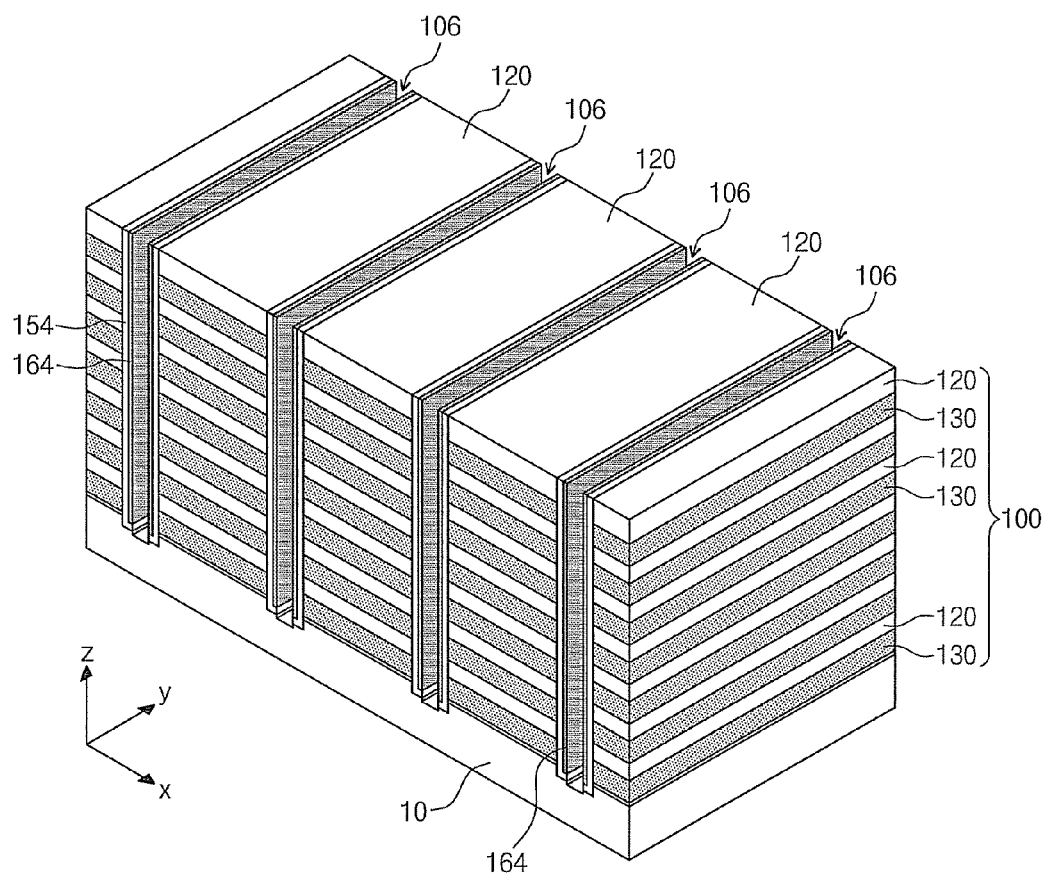

Referring to FIG. 13, a preliminary vertical pattern 154 and a preliminary semiconductor spacer 164 covering the inner wall of each of the openings 106 may be formed (e.g., sequentially formed). A vertical layer (not shown) and a first semiconductor layer (not shown) may be formed to cover the inner walls of the openings 106. The first semiconductor layer may be, for example, anisotropically etched to expose a top surface of the substrate 10 at the bottom of the openings 106. The top surface of the substrate 10 exposed by the preliminary semiconductor spacer 164 may be recessed by over-etching during the anisotropic etch of the first semiconductor layer. The vertical layer may include one thin layer and/or a plurality of thin layers. Example embodiments of the inventive concepts may be diversely classified according to the thin layers of the vertical layer 150.

Figure 14:
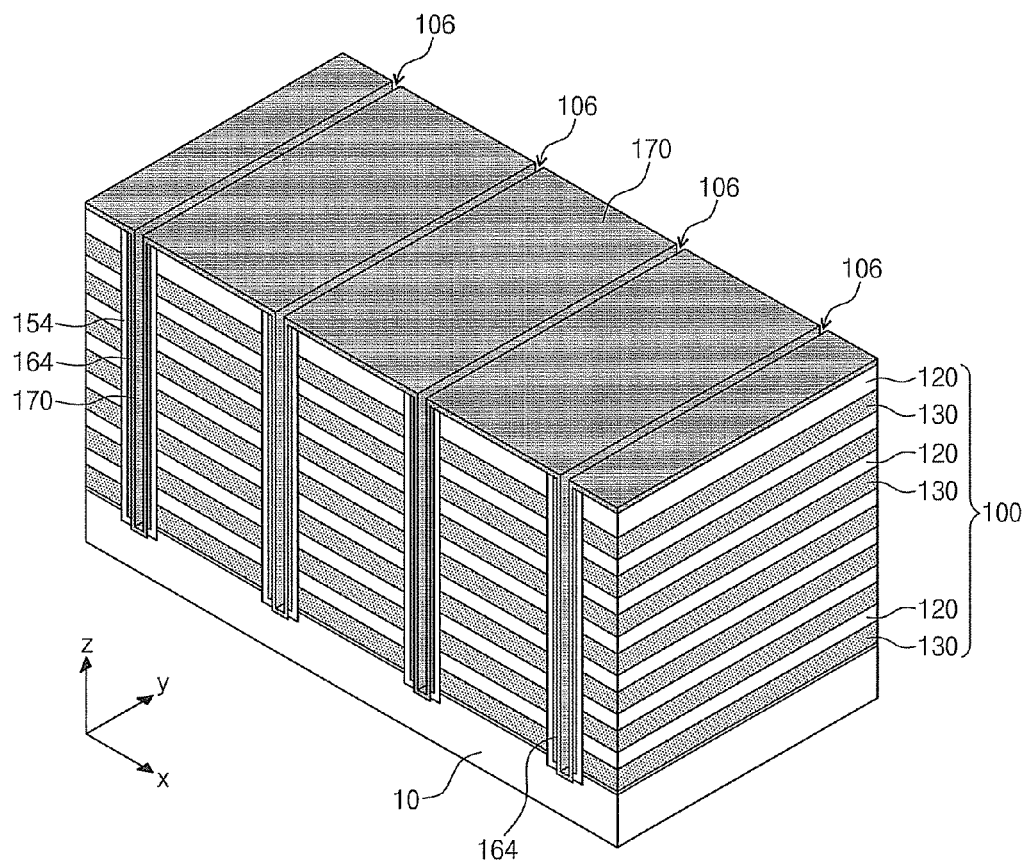
Figure 15:
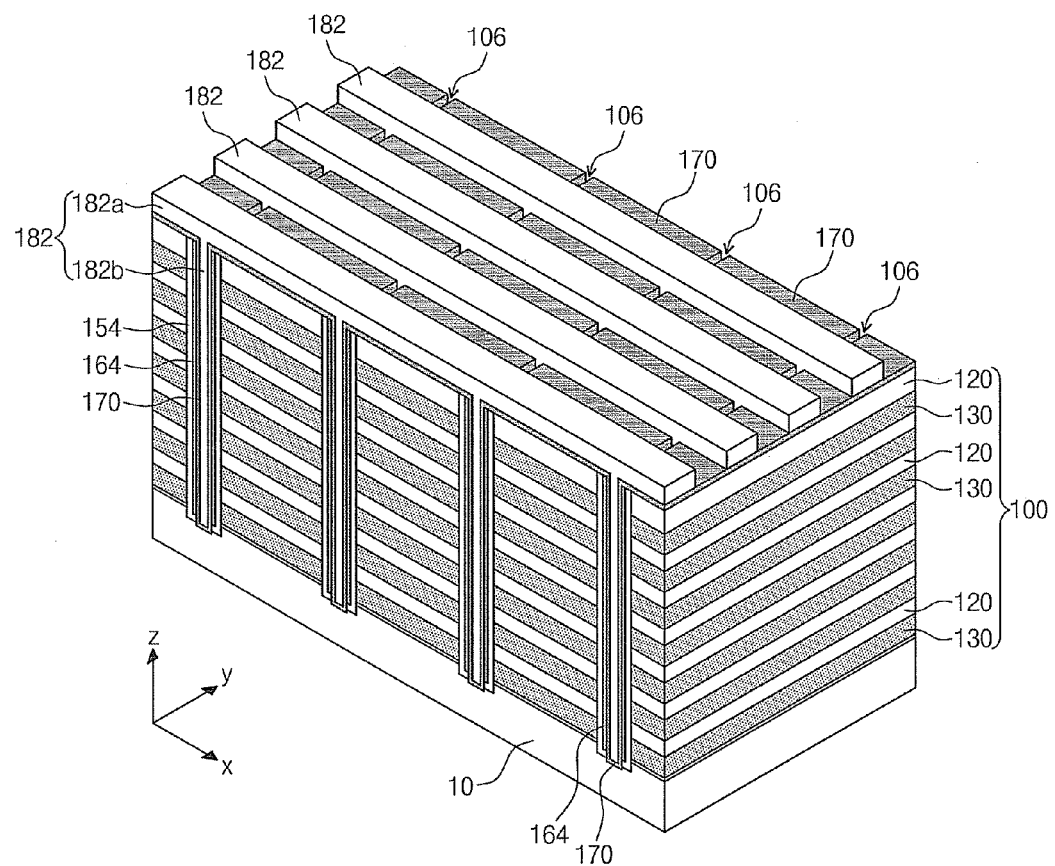

Referring to FIGS. 14 and 15, a second semiconductor layer 170 and string definition masks 182 may be formed on the structure including the preliminary vertical pattern 154 (e.g., sequentially formed). The second semiconductor layer 170 may be, for example, a silicon (e.g., polycrystalline silicon) layer formed using, for example, ALD and/or CVD. The string definition masks 182 may include an insulation material formed using spin-on-glass (SOG) and/or a silicon oxide layer. The forming of the string definition masks 182 may include forming a string separation layer (not shown) on the structure including the second semiconductor layer 170 to fill the openings 106 and patterning the string separation layer to cross over the openings 106. The patterning of the string separation layer may include, for example, anisotropically etching the string separation layer using an etchant with etch selectivity to the second semiconductor layer 170. According to example embodiments, the patterning of the string separation layer may be performed to the bottom of the opening 106 to expose the second semiconductor layer 170.

Figure 16:
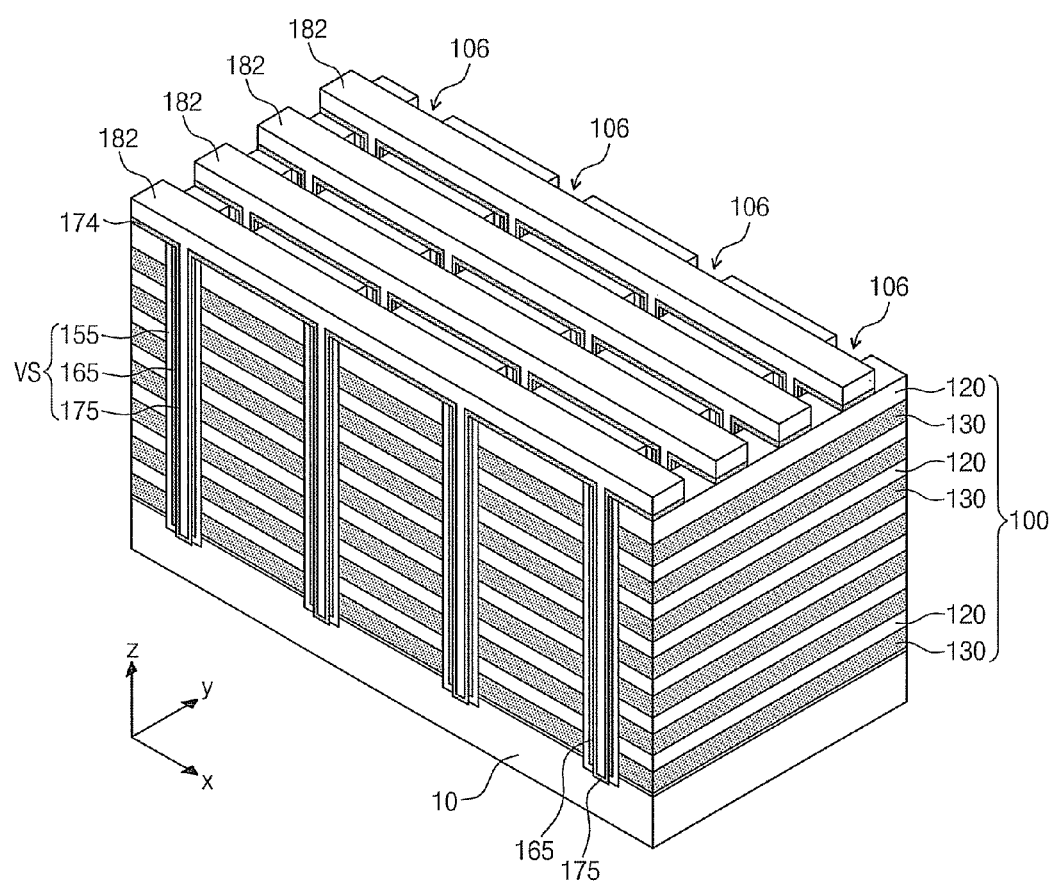

Each of the string definition masks 182 may include an upper pattern 182a crossing over the top of the openings 106 and extension patterns 182b extending downwardly from the upper pattern 182a to partially fill the openings 106. Surfaces of the second semiconductor layer 170 between the extension patterns 182b in the y direction may be exposed. The extension patterns 182b may be formed to expose the sidewalls and the bottom surface of the second semiconductor layer 170 between the extension patterns 182b. Referring to FIG. 16, by using the string definition masks 182 as an etch mask, the second semiconductor layer 170 and the preliminary semiconductor spacer 164 may be patterned (e.g., sequentially patterned). The patterning may include, for example, isotropically etching the second semiconductor layer 170 and the preliminary semiconductor spacer 164 using an etchant with etch selectivity to the preliminary vertical pattern 154.

According to example embodiments, the preliminary vertical pattern 154 may be etched during the patterning and sidewalls of the mold structure 100 may be exposed. The preliminary vertical pattern 154 may be separated horizontally to form two-dimensionally arranged vertical patterns 155. The preliminary semiconductor spacer 164 may be separated horizontally to form two-dimensionally arranged semiconductor spacers 165. Between the string definition masks 182 and the mold structure 100, the two-dimensionally arranged vertical patterns 155 and semiconductor spacers 165 may be formed on the substrate 10. The second semiconductor layer 170 may form second semiconductor patterns 174 separated horizontally. The second semiconductor patterns 174 may include semiconductor body portions 175 between the semiconductor spacers 165 and the string definition masks 182.

Figure 27:
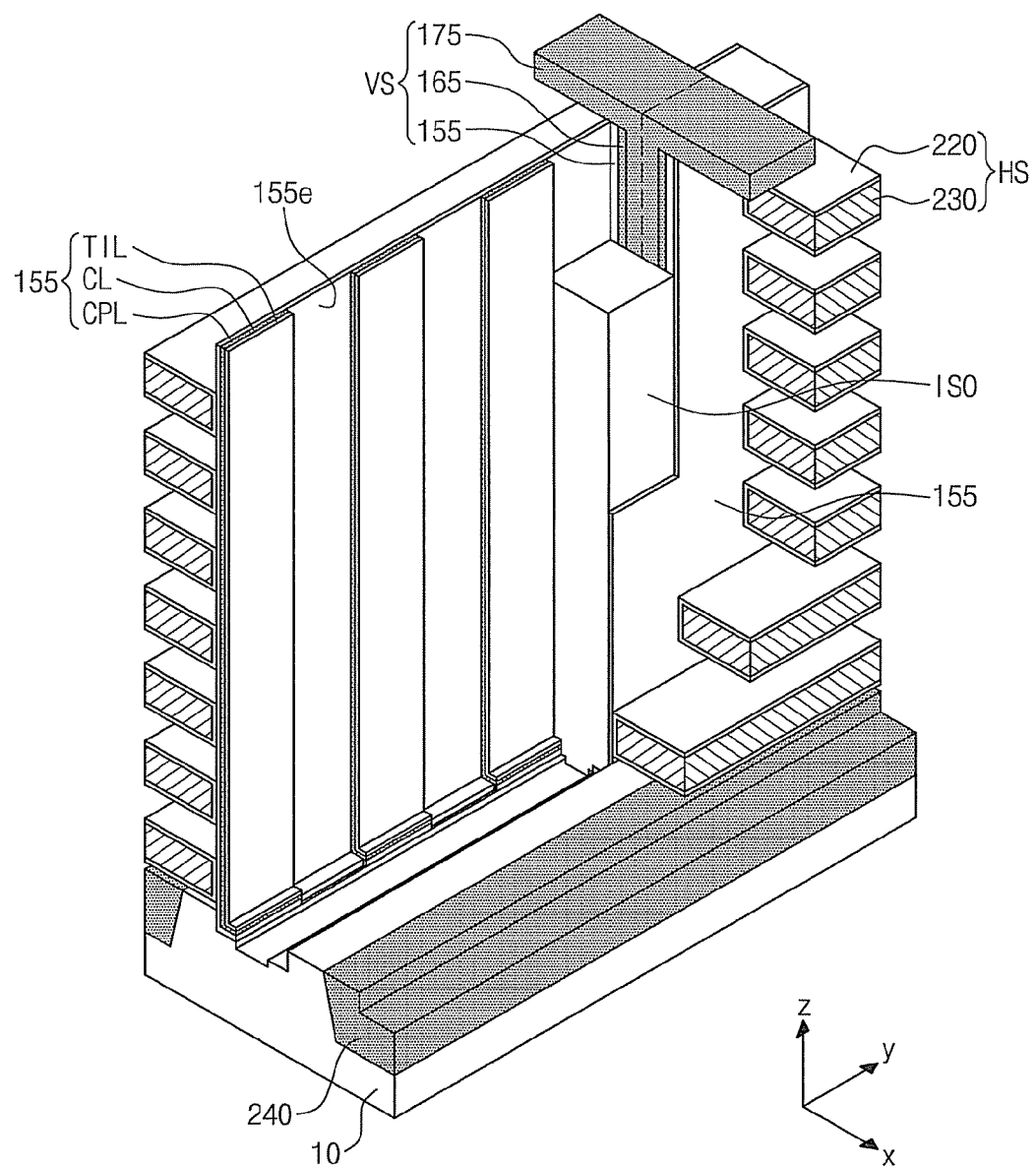

According to example embodiments, the preliminary vertical pattern 154 may remain on the inner walls of the openings 106. The patterning process may be performed so that the sidewall of the mold structure 100 is not exposed. FIG. 27 is a perspective diagram illustrating a portion of a structure according example embodiments. If the vertical layer includes a plurality of thin layers, some thin layers of the vertical layer and/or the preliminary vertical pattern 154 may remain on the inner walls of the openings 106.

Figure 17:
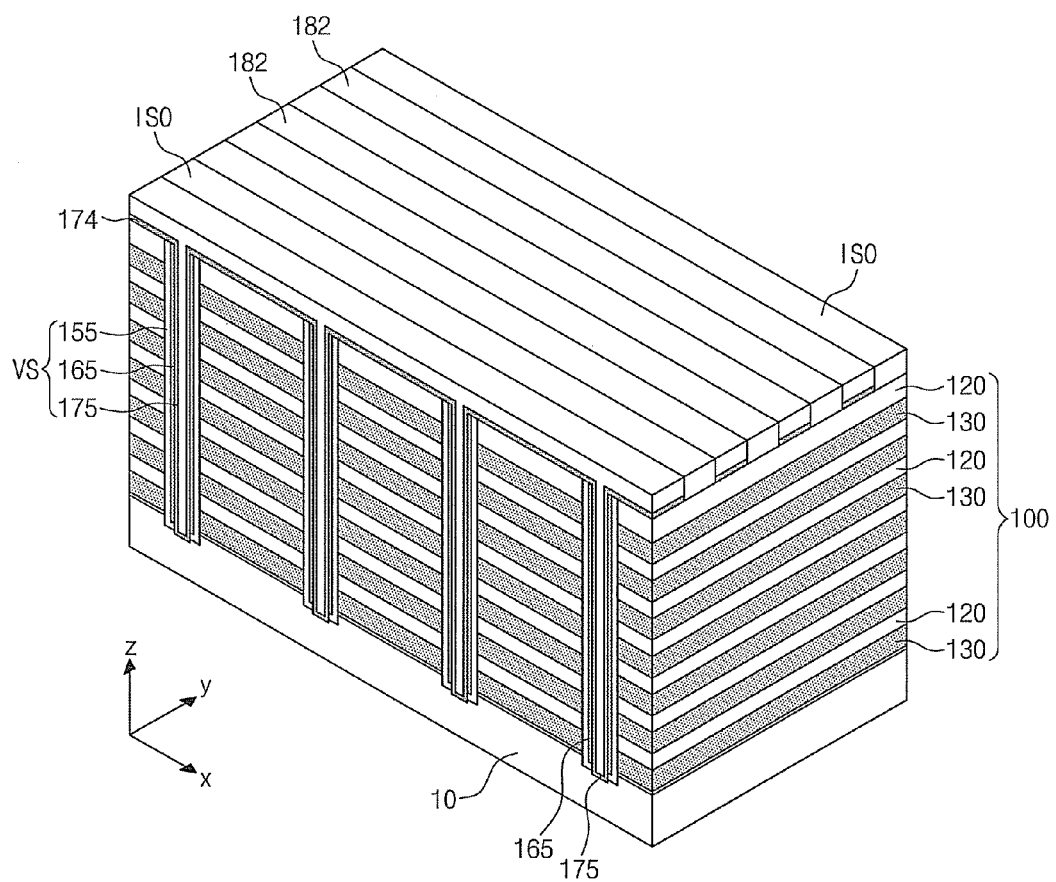
Figure 18:
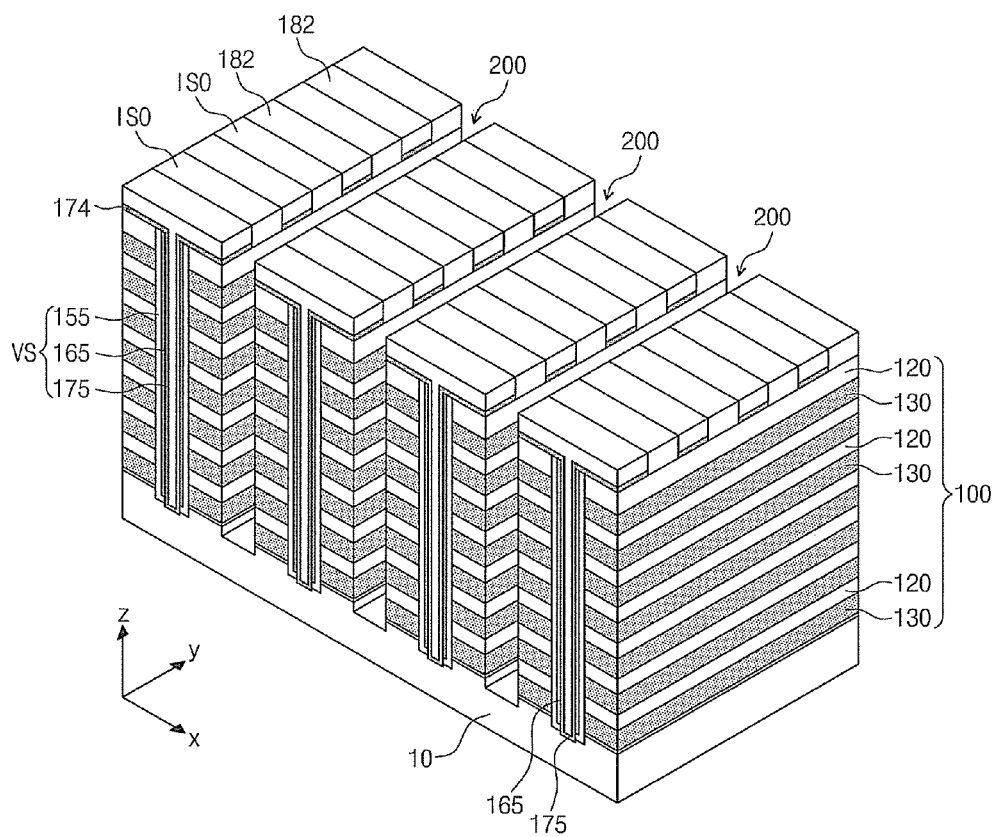

Referring to FIGS. 17 and 18, string separation layers ISO may be formed to fill the openings 106 between the masks 182. Trenches 200 penetrating the mold structure 100 may be formed to expose the sidewalls of the sacrificial layers 130 and the insulating layers 120. The string separation layers ISO may be formed of one or more insulation materials. The string separation layers ISO may be formed with a similar shape to the string definition masks 182. Each of the string separation layers ISO may include an upper separation pattern horizontally crossing over the openings 106 and extension parts (not shown) extending downwardly from the upper separation pattern to fill the openings 106.

The trenches 200 may be formed, for example, to cross over between the openings 105 as described with reference to FIG. 9. By the trenches 200, the semiconductor body portions 175 of the second semiconductor pattern 174 may be separated from each other and the extension patterns 182b of the string definition mask 182 may be separated from each other. The semiconductor body portions 175 may be two-dimensionally arranged on the substrate 10, similarly to the vertical patterns 155 and the semiconductor spacers 165. A plurality of vertical structures VS and a plurality of string separation layers ISO therebetween may be in one opening 106. Each of the vertical structures VS may include one semiconductor body portion 175, a pair of the vertical patterns 155, and a pair of the semiconductor spacers 165. The vertical structure VS may further include the extension pattern 182b.

Figure 19:
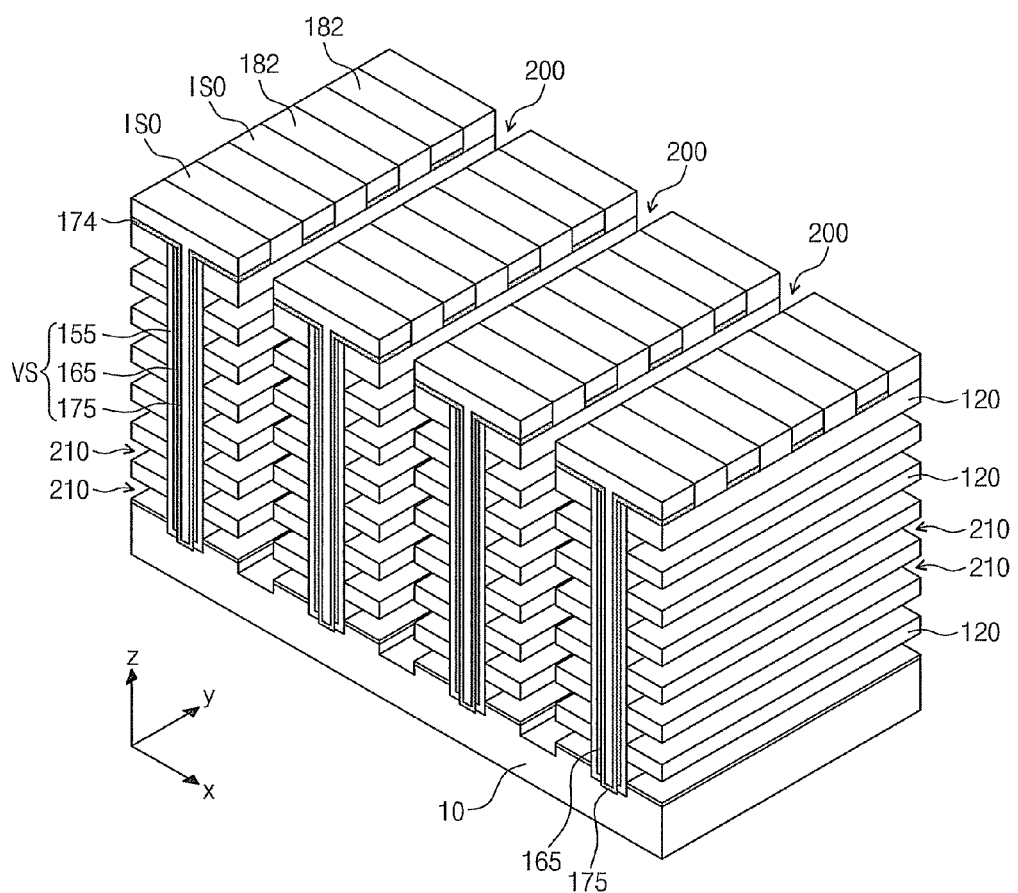
Figure 20:
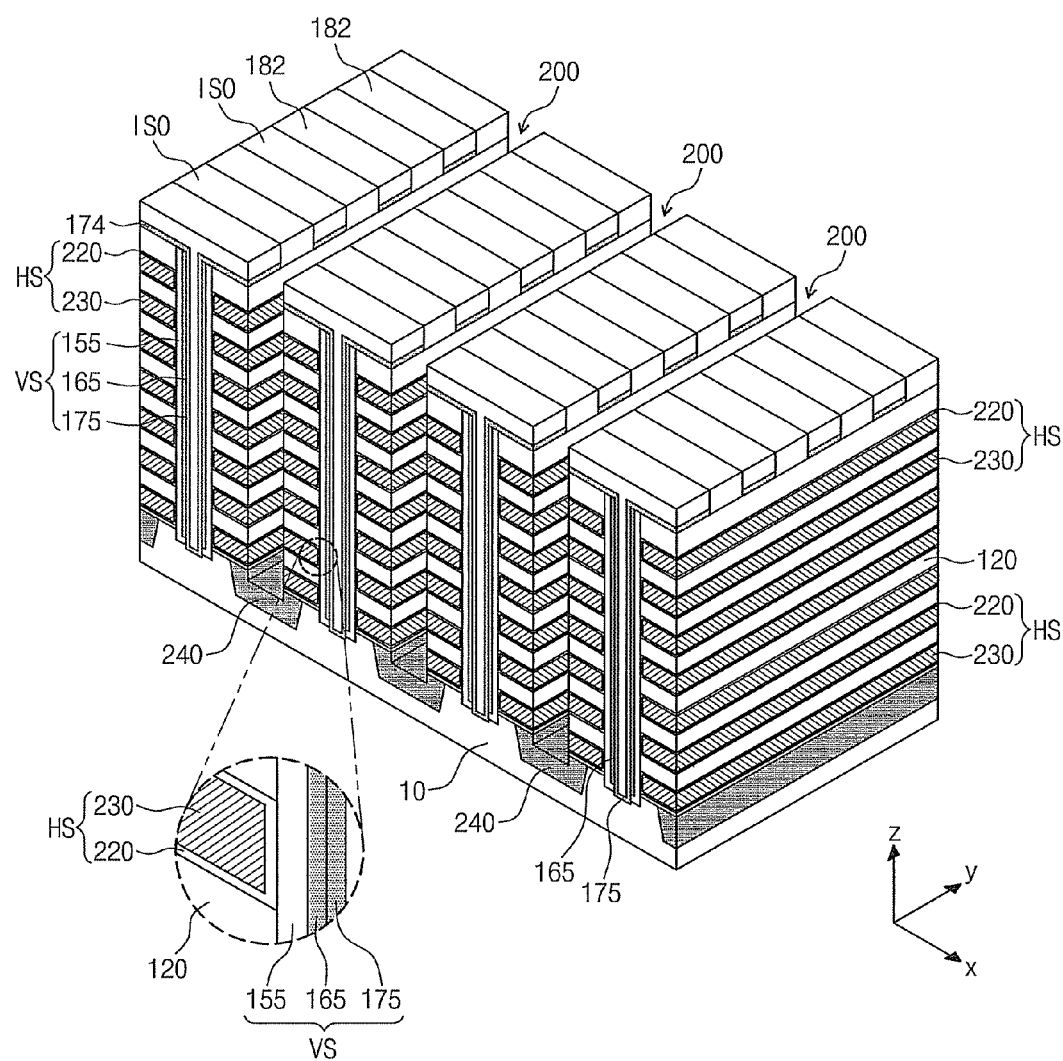

Referring to FIG. 19, recess regions 210 may be formed between the insulating layers 120 by selectively removing the exposed sacrificial layers 130. Referring to FIG. 20, horizontal structures HS may be formed to fill the recess regions 210. The recess regions 210 and the horizontal structures HS may be formed, for example, as described with reference to FIGS. 8 and 9. The horizontal structure HS may include horizontal pattern 220 covering the inner walls of the recess region 210 and/or a conductive pattern 230 filling the remaining space of the recess region 210. Impurity regions 240 may be formed in the substrate 10 exposed through the trench 200.

Figure 21:
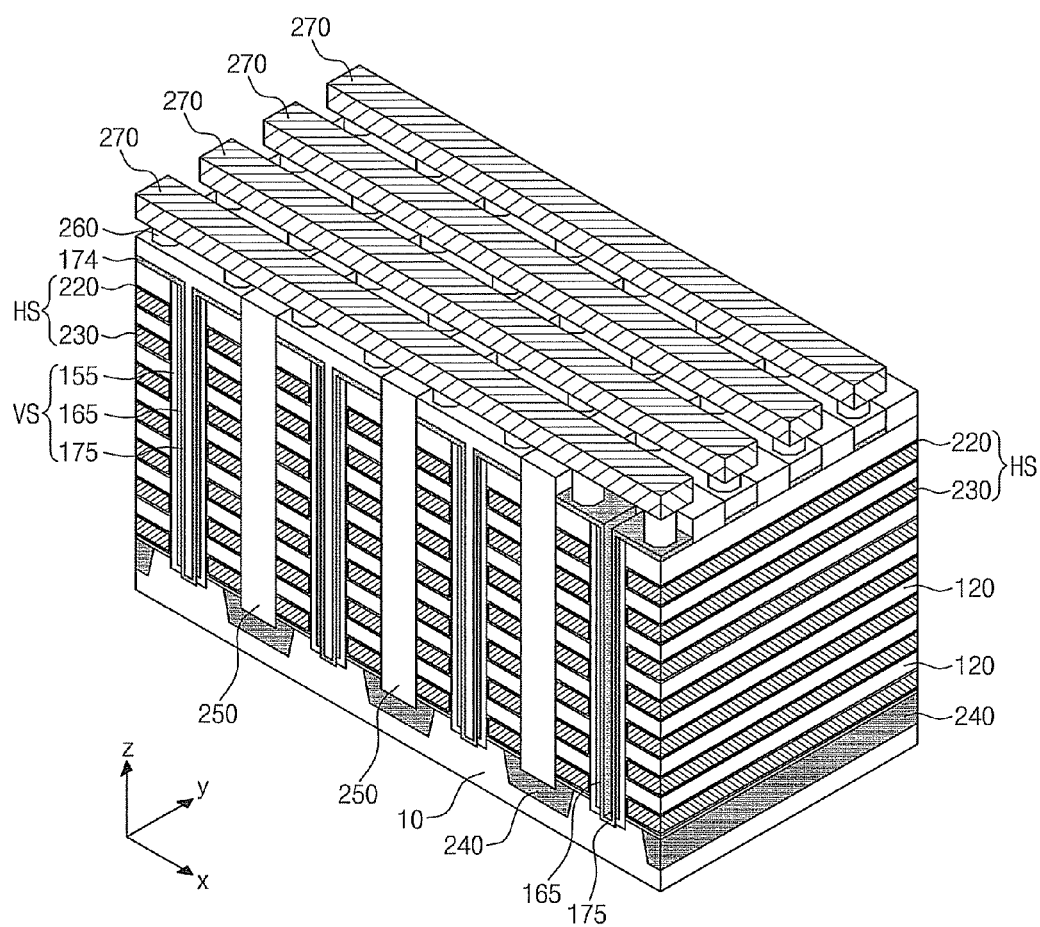

Referring to FIG. 21, electrode separation patterns 250, upper plugs 260, and upper wirings 270 may be formed. The electrode separation patterns 250 may be formed to fill the trenches 200. Each of the upper plugs 260 may be connected to each of the vertical structures VS, and the upper wirings 270 may be formed to connect to the upper plugs 260. The electrode separation patterns 250, the upper plugs 260 and the upper wirings 270 may be formed, for example, as described with reference to FIGS. 10 and 11.

Three-dimensional semiconductor devices according to example embodiments of the inventive concepts will be described with reference to FIGS. 22-27. In order to reduce complexity in the drawings and to provide better understanding of example embodiments of the inventive concepts, some elements of three-dimensional semiconductor devices may be omitted. Those of ordinary skill in the art with knowledge of example embodiments will understand which elements may be omitted from both the accompanying drawings and descriptions of fabricating methods. Additionally, for concise description, description of overlapping elements previously described may be omitted. Because three-dimensional semiconductor devices described herein may be fabricated through modifications of the above-mentioned fabricating methods and other different fabricating methods, all the described elements of disclosed fabricating method may not necessarily be explicitly included in description of three-dimensional semiconductor devices.

Figure 22:
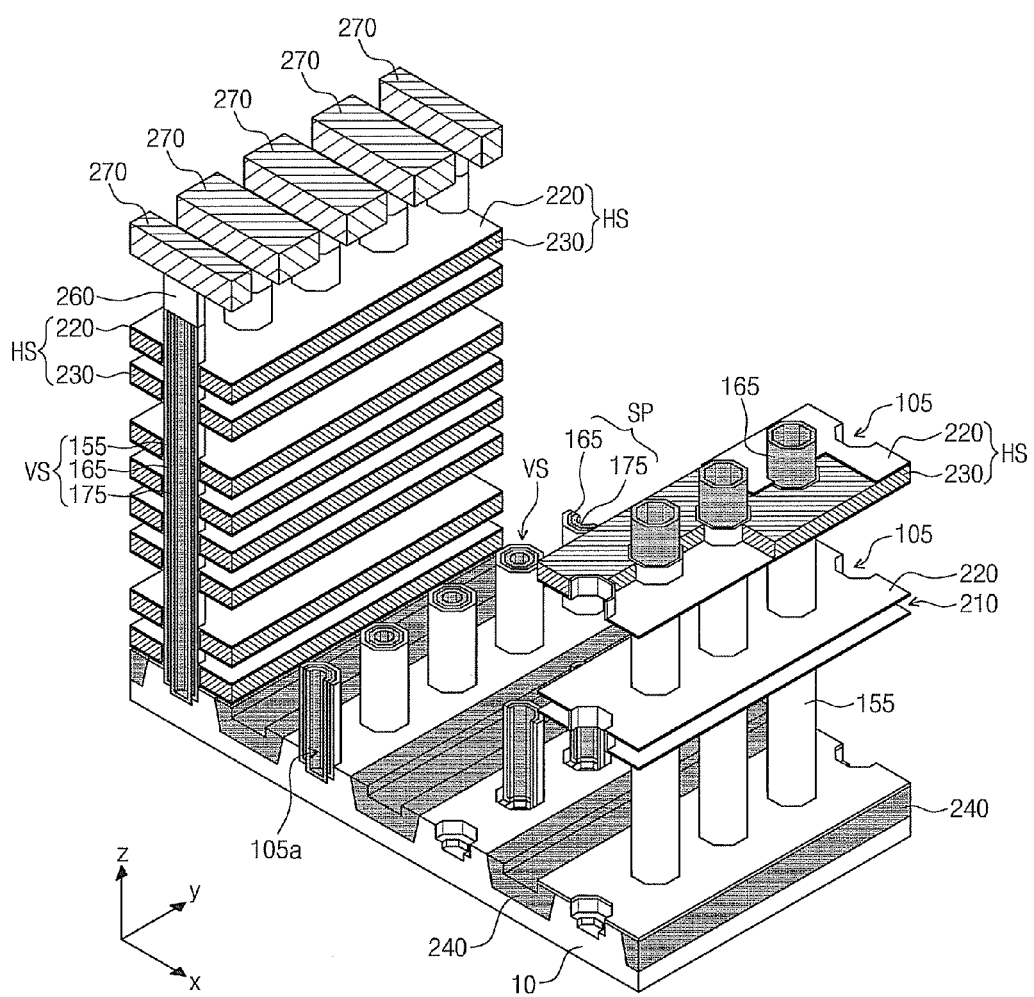
FIGS. 22-24 are perspective views illustrating three-dimensional semiconductor devices fabricated according to example embodiments of the inventive concepts described with respect to FIGS. 1-11.

FIGS. 22-24 are perspective views illustrating three-dimensional semiconductor devices fabricated according to example embodiments of the inventive concepts described with respect to FIGS. 1-11. Referring to FIG. 22, horizontal structures HS may be three-dimensionally arranged on a substrate 10 (e.g., more than one element may be arranged in the z direction) and vertical structures VS vertically penetrating the horizontal structures HS may be two-dimensionally arranged on the substrate 10 (e.g., single elements may be arranged in the z direction). Each of the horizontal structures HS may include a conductive pattern 230 and a horizontal pattern 220. The conductive pattern 230 may be arranged with a major axis parallel to the top surface (e.g., the xy plane) of the substrate 10. A plurality of openings 105 penetrated by the vertical structures VS may be in the conductive pattern 230. The horizontal pattern 220 may be between the conductive pattern 230 and the vertical structures VS. The horizontal pattern 220 may cover the inner sidewalls of the conductive pattern 230 and/or the sidewalls of the openings 105. According to example embodiments, the horizontal patterns 220 may extend horizontally from the openings 105 to cover the top surface and the bottom surface of the conductive pattern 230.

The conductive pattern 230 may include, for example, at least one of doped silicon, metal materials, metal nitride layers, and/or metal silicide. For example, the conductive pattern 230 may include a tantalum nitride layer and/or tungsten. The horizontal pattern 220 may be one thin layer and/or a plurality of thin layers. According to example embodiments, the horizontal pattern 220 may include, for example, a blocking insulating layer used as a memory element of a charge trap type nonvolatile memory transistor.

Each of the vertical structures VS may include a semiconductor pattern SP connected to the top surface of the substrate 10 and a vertical pattern 155 between the semiconductor pattern SP and the horizontal structures HS. According to example embodiments, the semiconductor pattern SP may include a semiconductor spacer 165 and a semiconductor body portion 175. The semiconductor spacer 165 may be a cylindrical shape with open top and bottom entrances. The semiconductor body portion 175 may be a cup shape covering the inner wall of the semiconductor spacer 165 and the top surface of the substrate. Because the semiconductor body portion 175 may be a thickness that does not completely fill the opening part 105, a hole 105a may be in the semiconductor body portion 175. According to example embodiments, the holes 105a may be filled by buried patterns 185.

The vertical pattern 155 may be a cylindrical shape with open top and bottom entrances and may include a bottom portion extending below the semiconductor spacer 165. The vertical pattern 155 may be extended vertically from between the semiconductor pattern SP and the horizontal structures HS to cover an entire outer wall of one semiconductor pattern SP. The vertical pattern 155 may be a single body around one semiconductor pattern SP.

According to example embodiments, the semiconductor pattern SP may be a material with a semiconducting property. For example, each of the semiconductor spacer 165 and the semiconductor body portion 175 may be polycrystalline silicon, an organic semiconductor layer and/or carbon-nano structures. The vertical pattern 155 may include one thin layer and/or a plurality of thin layers. According to example embodiments, the vertical pattern 155 may include, for example, a tunnel insulating layer used as a memory element of a charge trap type nonvolatile memory transistor.

The horizontal structures HS and the vertical structures VS may define localized intersecting regions therebetween, vertical adjacent regions vertically adjacent to the intersection regions, and horizontal adjacent regions horizontally adjacent to the intersecting regions. The vertically adjacent regions may be sidewalls of the vertical structure VS between the horizontal structures HS, and the horizontal adjacent regions may be surfaces of the horizontal structures HS disposed between the vertical structures VS. According to example embodiments of the inventive concepts, the horizontal pattern 220 and the vertical pattern 155 may be on the intersecting regions, and the horizontal pattern 220 may extend to the horizontal adjacent regions and the vertical pattern 155 may extend to the vertical adjacent regions.

Referring to FIG. 23, the semiconductor body portion 175 may substantially and completely fill the opening 105 including the semiconductor spacer 165. According to example embodiments, a void may be formed in the semiconductor body portion 175 and the semiconductor body portion may not fill the opening 105. The semiconductor body portion 175 and/or the semiconductor spacer 165 may have a different crystal structure than polycrystalline silicon formed through CVD, after undergoing a crystalline structure changing step (e.g., an epitaxial technique including a laser annealing step). For example, the semiconductor body portion 175 and/or the semiconductor spacer 165 may include a bottom region and a top region of different grain sizes. The semiconductor body portion 175 and/or the semiconductor spacers 165 according to example embodiments may be the same or different crystal structure.

Referring to FIG. 24, the length of the vertical pattern 155 may be less than that of the semiconductor spacer 165. Below the semiconductor spacer 165, there may be an under-cut region 77 on the bottom surface of the vertical pattern 155. This structure may be obtained by isotropically etching the bottom region of the vertical pattern 155 using the semiconductor spacer 165 as an etch mask. The undercut region may be filled by the semiconductor body portion 175.

Figure 25:
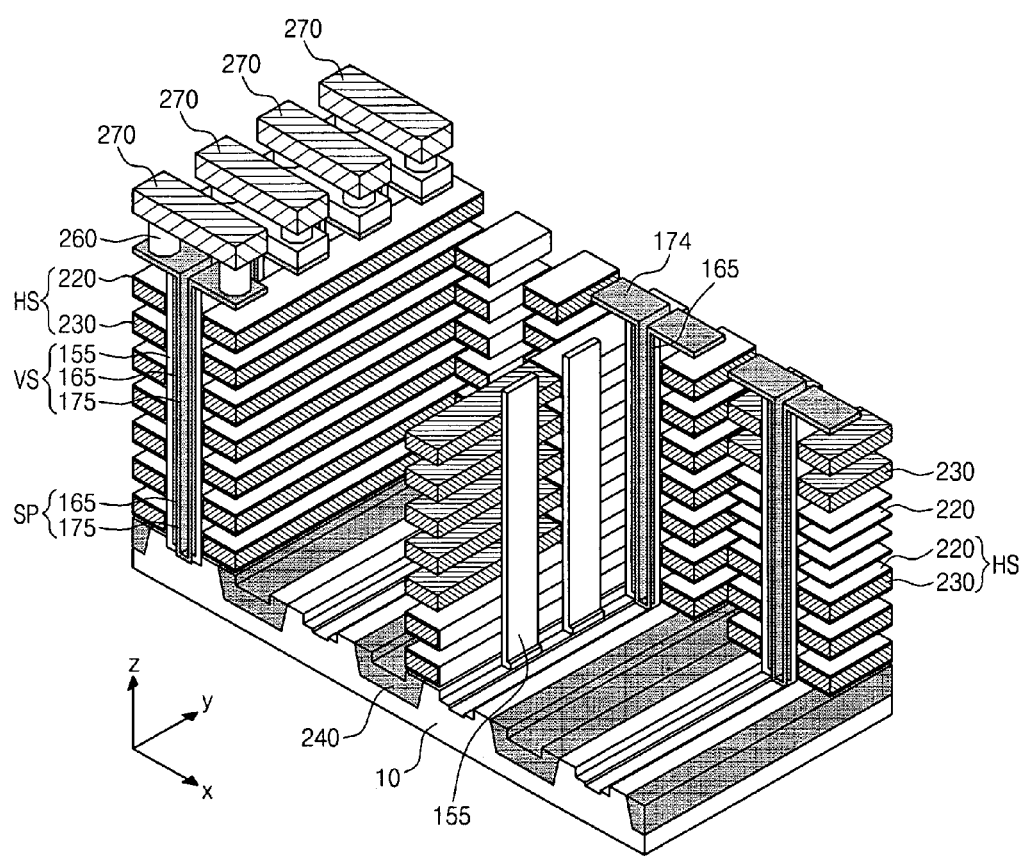
FIGS. 25-27 are perspective views illustrating three-dimensional semiconductor devices fabricated according to example embodiments of the inventive concepts described with respect to FIGS. 22-24.
Figure 26:
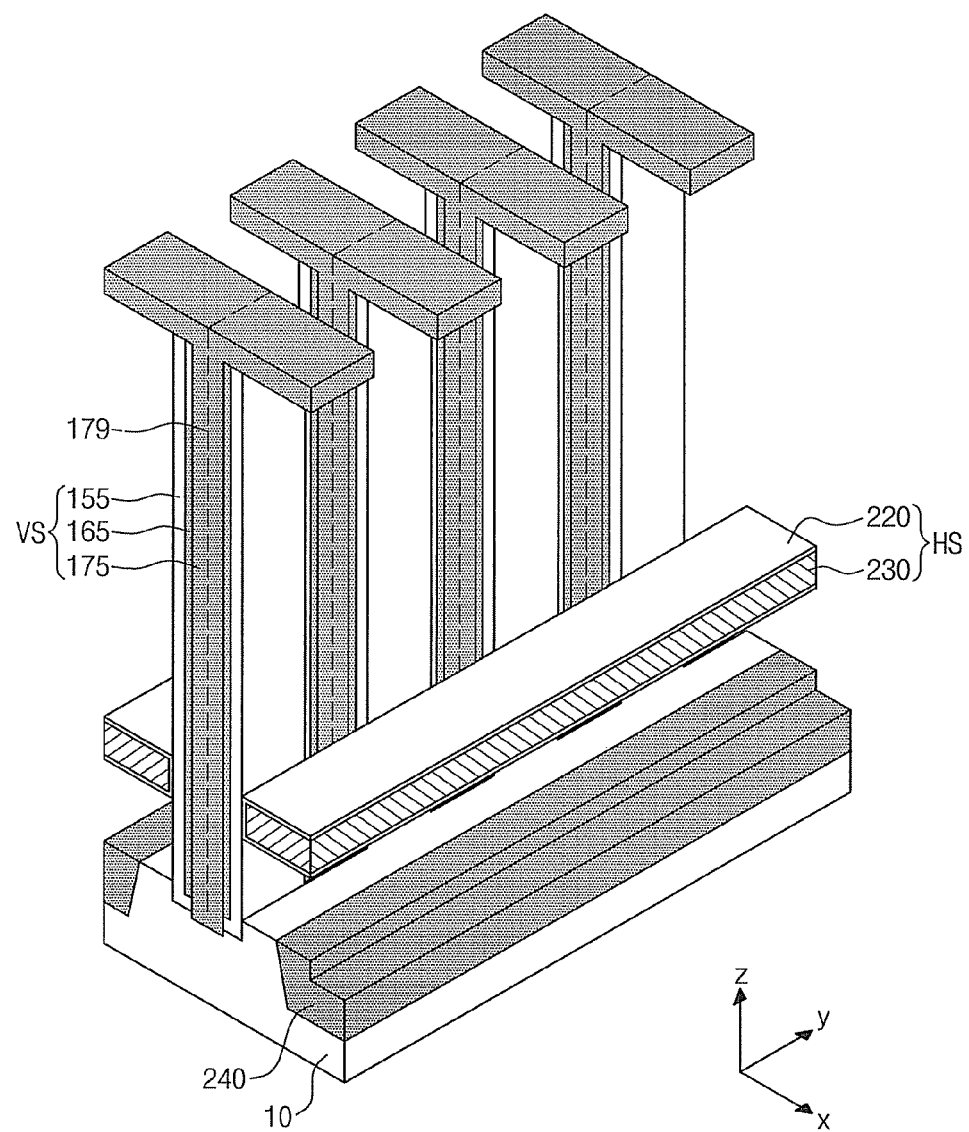

FIGS. 25-27 are perspective views illustrating three-dimensional semiconductor devices fabricated according to example embodiments of the inventive concepts described with respect to FIGS. 12-21. For concise description, overlapping description of elements previously described with reference to FIGS. 12-21 may be omitted. Referring to FIG. 25, horizontal structures HS may be three-dimensionally arranged on a substrate 10 and vertical structures VS may be between horizontal structures HS. The vertical structures VS may be two-dimensionally arranged with respect to the substrate 10 and disposed to face the sidewalls of the horizontal structures HS.

Each of the horizontal structures HS may include a conductive pattern 230 and a horizontal pattern 220. A major axis of the conductive pattern 230 may have a line shape parallel to the top surface. The horizontal pattern 220 may be between the conductive pattern 230 and the vertical structures VS and may horizontally extend to cover the top surface and the bottom surface of the conductive pattern 230. One sidewall of the conductive pattern 230 spaced from the vertical structure VS may not be covered by the horizontal pattern 220. The section of the horizontal pattern 220 projected on the xz plane may have a "⊏" or "U" shape.

Each of the vertical structures VS may include a semiconductor pattern SP connected to the top surface of the substrate 10 and a vertical pattern 155 between the semiconductor pattern SP and the horizontal structures HS. According to example embodiments, one semiconductor pattern SP of one vertical structure VS may include a pair of semiconductor spacers 165 and one semiconductor body portion 175 therebetween.

The semiconductor body portion 175 may include a pair of sidewalls crossing over the horizontal structures HS vertically and a bottom portion connecting the bottom surfaces of the sidewalls. The semiconductor body portion 175 may include a horseshoe-shaped portion. Each of the semiconductor spacers 165 may include, for example, a hexahedral-shaped portion between the sidewall of the semiconductor body portion 175 and the vertical pattern 155. The x-direction thicknesses of the sidewall of the semiconductor body portion 175 and the semiconductor spacer 165 may be less than an interval between a pair of the horizontally-adjacent conductive patterns 230. As illustrated in FIG. 15, the extension pattern 182b of the string definition mask 182 may be disposed between the sidewalls of the semiconductor body portion 175.

The vertical pattern 155 may be, for example, a hexahedral shape but an x-direction thickness may be less than an interval between a pair of the horizontally-adjacent conductive patterns 230. The vertical pattern 155 may be, for example, an elongated plate shape. The vertical pattern 155 may be horizontally extended with a bottom portion under the semiconductor spacer 165, and may be horizontally and continuously extended to entirely cover one sidewall of the semiconductor spacer 165. Referring to FIGS. 26 and 27, the semiconductor body portion 175 may substantially and completely fill the opening 106 including the semiconductor spacer 165. According to example embodiments, a discontinuous interface 179 and/or void may be formed in the semiconductor body portion 175. As described with reference to FIG. 23, the semiconductor body portion 175 and/or the semiconductor spacer 165 may have a different crystal structure than polycrystalline silicon formed through CVD, after undergoing a crystalline structure changing step (e.g., an epitaxial technique including a laser annealing step).

Referring to FIG. 27, the vertical pattern 155 may include a horizontal extension part 155e extending horizontally, as described with reference to FIG. 16. The horizontal extension part 155e may be between the horizontally-adjacent semiconductor body portions 175 to contact the sidewall of the string separation layer ISO. According to example embodiments related to a charge trap type nonvolatile memory device, the vertical pattern 155 may include a tunnel insulating layer TIL and a charge storing layer CL, and/or a capping layer CPL. According to example embodiments, the horizontal extension part 155e may include both the tunnel insulating layer TIL and the charge storing layer CL. According to example embodiments, the horizontal extension part 155e may include only the capping layer CPL, and the charge storing layer CL and the tunnel insulating layer TIL may be horizontally separated by the string separation layer ISO. This separation may be realized, for example, by using the fabricating methods described with reference to FIG. 16.

FIGS. 28-43 are perspective views illustrating structures of information storing layers according to example embodiments of the inventive concepts. According to example embodiments of a charge trap type nonvolatile memory device, the horizontal pattern 220 and the vertical pattern 155 may be part of an information storing layer of a memory cell transistor. The number and types of thin layers constituting each of the horizontal and vertical patterns 220 and 155 may vary, and based on this diversity, example embodiments of the inventive concepts may be classified into several example embodiments. For example, example embodiments of the inventive concepts related to the information storing layer may be classified as in the following Table 1.

TABLE 1

| Information storage layer | | | | | | | Corresponding |
|---|---|---|---|---|---|---|---|
| VS | | | | HS | | | FIG. |
| SP | TIL | CL | CPL | BIL1 | | 230 | 28/36[1] |
| SP | TIL | CL | | BIL1 | | 230 | 29/37 |
| SP | TIL | | CL | BIL1 | | 230 | 30/38 |
| SP | TIL | CL | | BIL1 | BIL2 | 230 | 31/39 |
| SP | TIL | | CL | BIL1 | BIL2 | 230 | 32/40 |
| SP | TIL | CL | CPL | BIL1 | | 230 | 33/41[2] |
| SP | TIL | CL | CPL | BIL1 | | 230 | 34/42[3] |
| SP | TIL | CL | CPL | BIL1 | BIL2 | 230 | 35/43 |

TIL: Tunnel Insulating layer
CL: Charge storing Layer
BIL: Blocking Insulating Layer
CPL: Capping Layer
[1]CPL with uniform thickness
[2]CPL with recessed sidewall
[3]CPL separated vertically According to example embodiments of a flash memory, the information storing layer may include a tunnel insulating layer TIL, a charge storing layer CL, and a first blocking insulating layer BIL1 (e.g., as shown in Table 1 and illustrated in FIGS. 28-43). According to example embodiments, the information storing layer may include a second blocking insulating layer BIL2 between the first blocking insulating layer BIL1 and the conductive pattern 230. The information storing layer may include a capping layer CPL interposed between the charge storing layer CL and the first blocking insulating layer BIL1. Layers of the information storing layer may be formed using a deposition technique providing, for example, excellent and/or improved stepped application (e.g., a CVD and/or ALD technique).

The vertical structure VS may include the tunnel insulating layer TIL and the horizontal structure HS may include at least one of the first and second blocking insulating layers BIL1 and BIL2. According to example embodiments (e.g., as illustrated in FIGS. 28, 29, 31, 33-37, 39 and 41-43), the vertical structure VS may include the charge storing layer CL. According to example embodiments (e.g., as illustrated in FIGS. 30, 32, 38 and 40), the horizontal structure HS may include the charge storing layer CL. If the vertical structure VS includes the charge storing layer CL (e.g., as illustrated in FIGS. 28, 33-36 and 41-43) the vertical structure VS may include the capping layer CPL. The vertical structure VS and the horizontal structure HS may directly contact and may not include the capping layer CPL (e.g., as illustrated in FIGS. 29, 31, 37 and 39).

Figure 28:
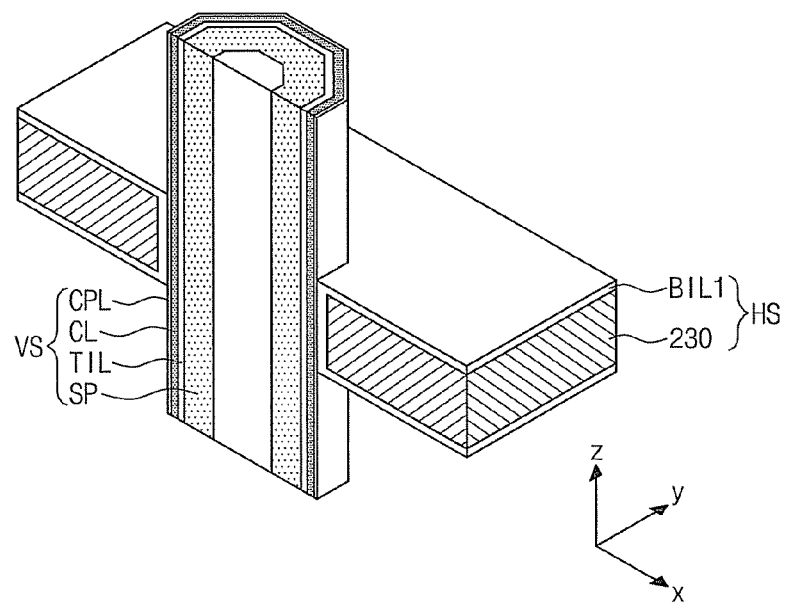
FIGS. 28-43 are perspective views illustrating structures of information storing layers according to example embodiments of the inventive concepts.
Figure 29:
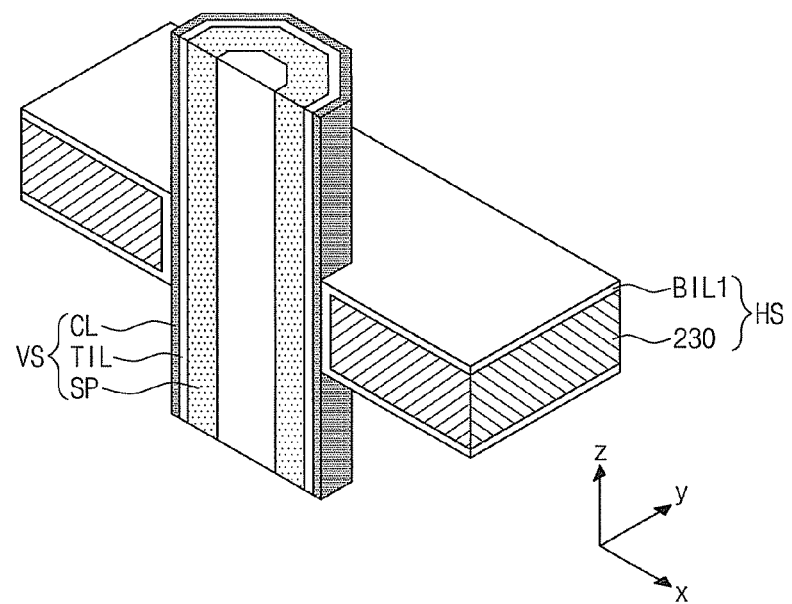
Figure 30:
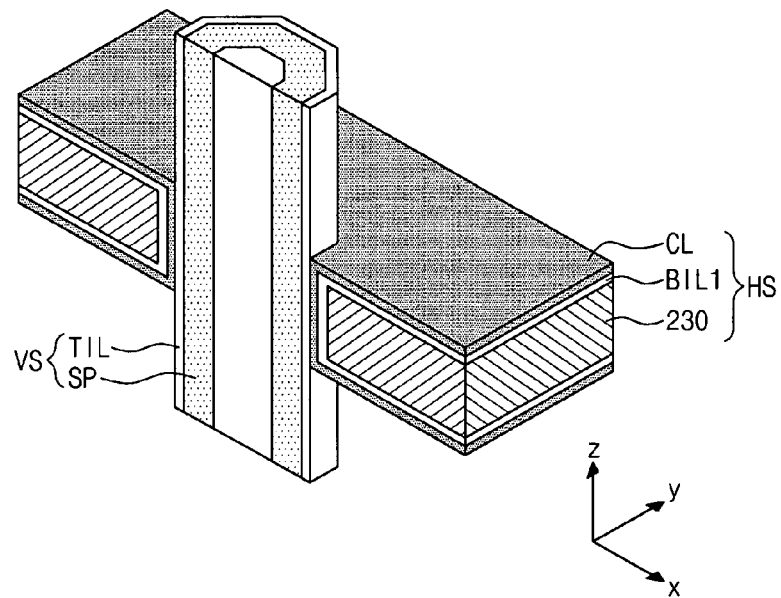
Figure 31:
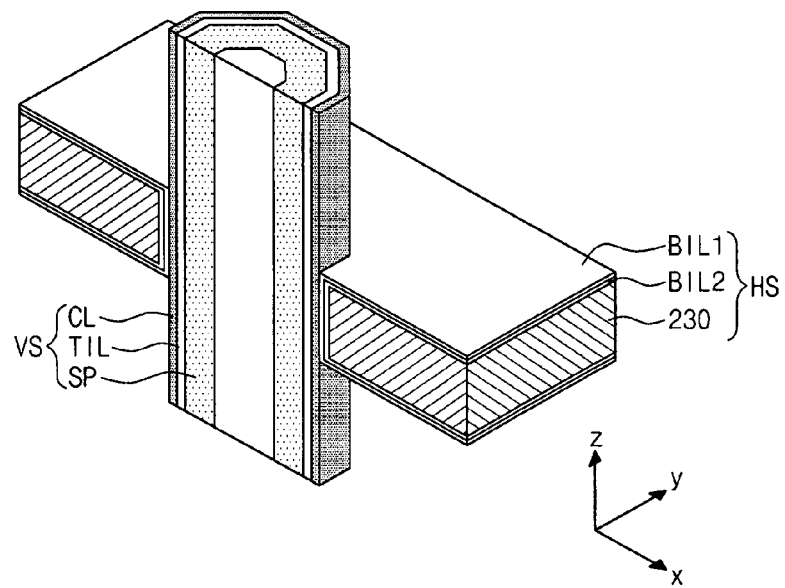
Figure 32:
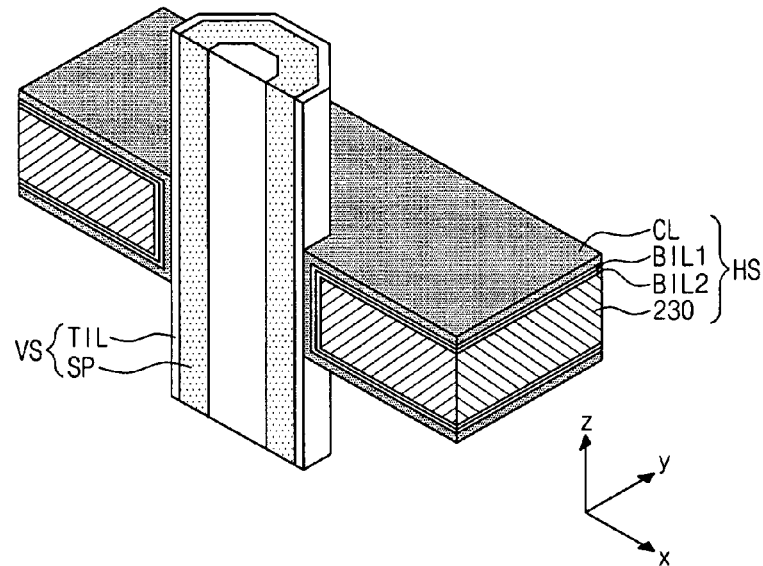
Figure 33:
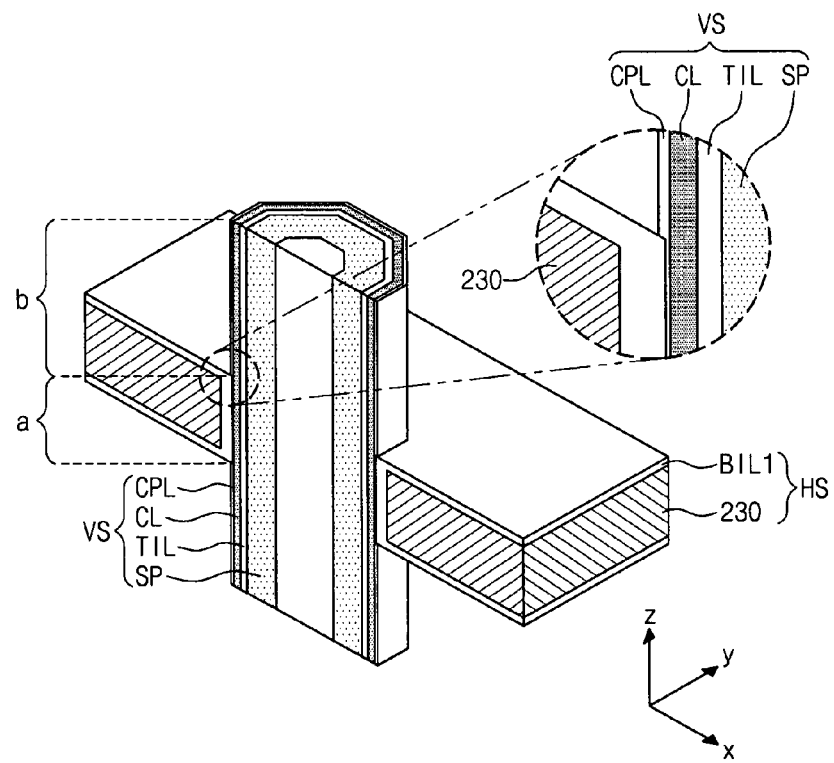
Figure 34:
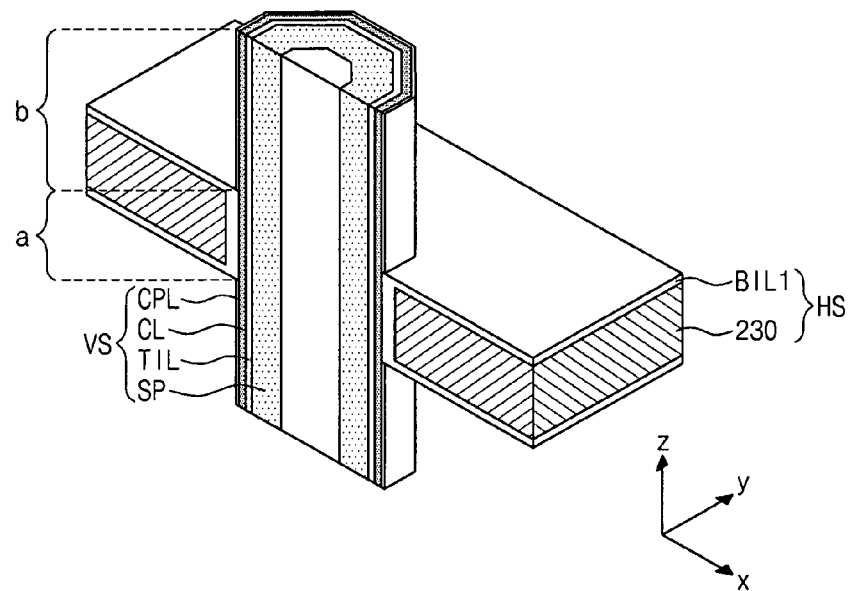
Figure 35:
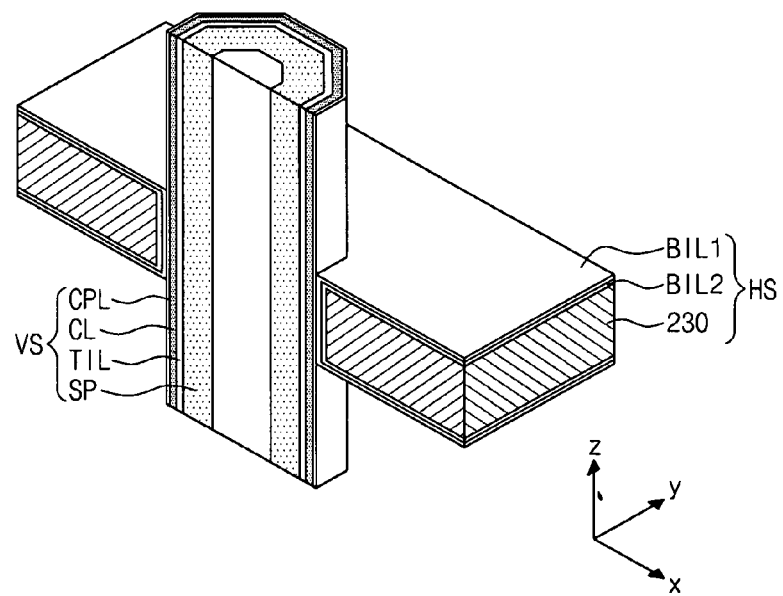
Figure 36:
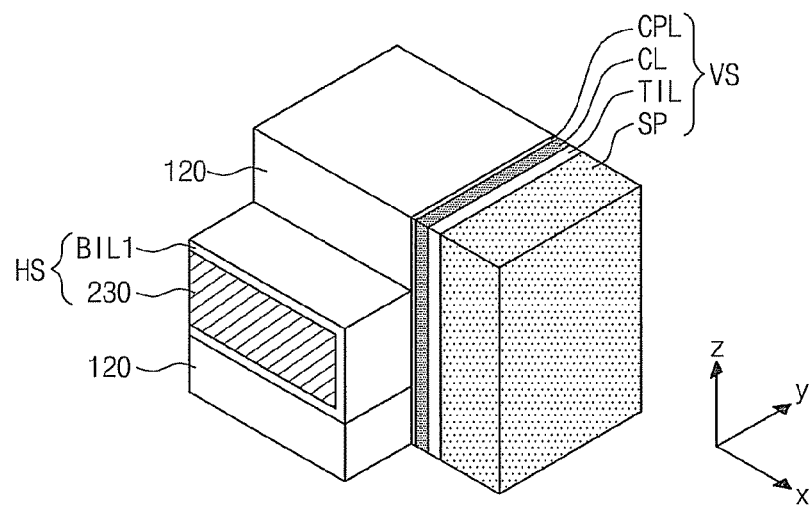
Figure 37:
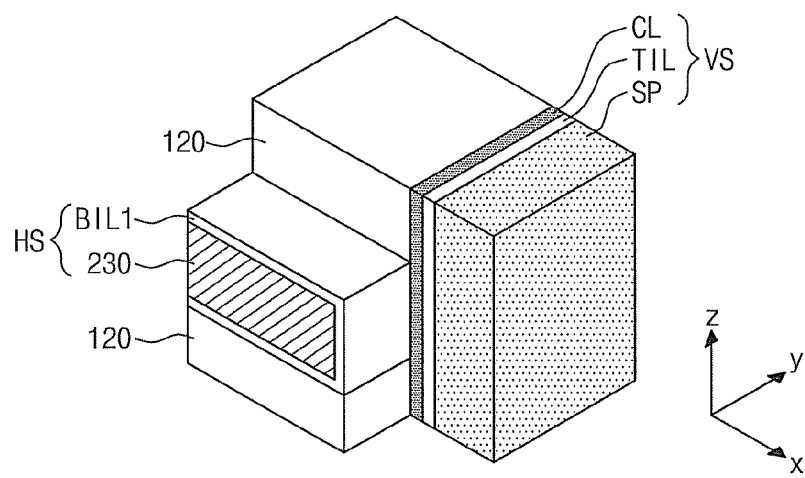
Figure 38:
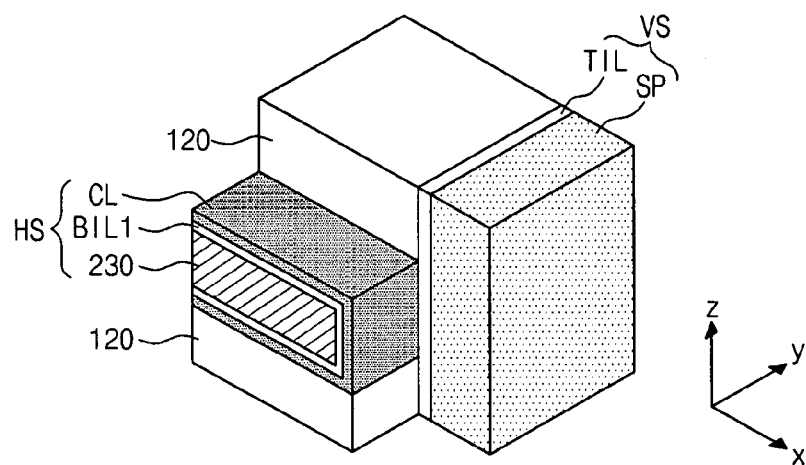
Figure 39:
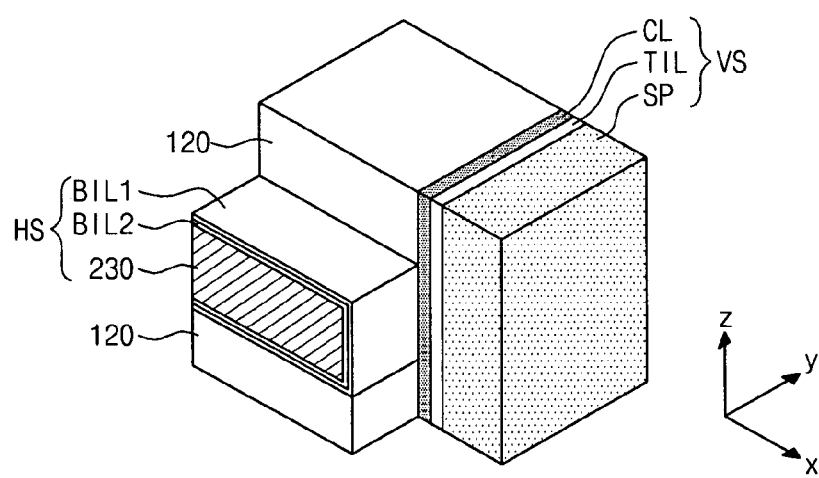
Figure 40:
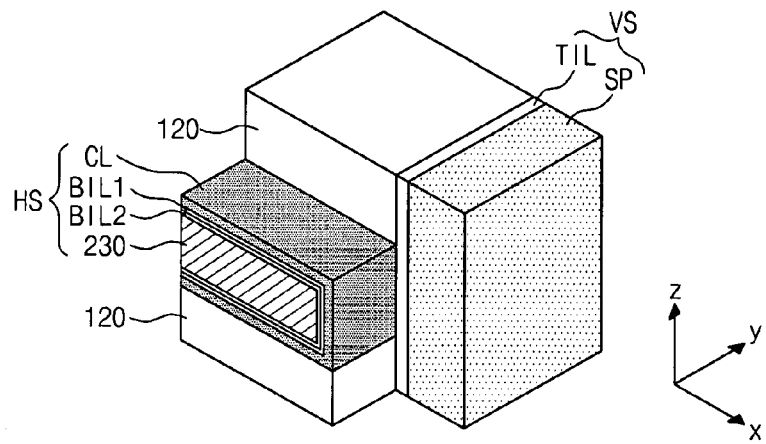
Figure 41:
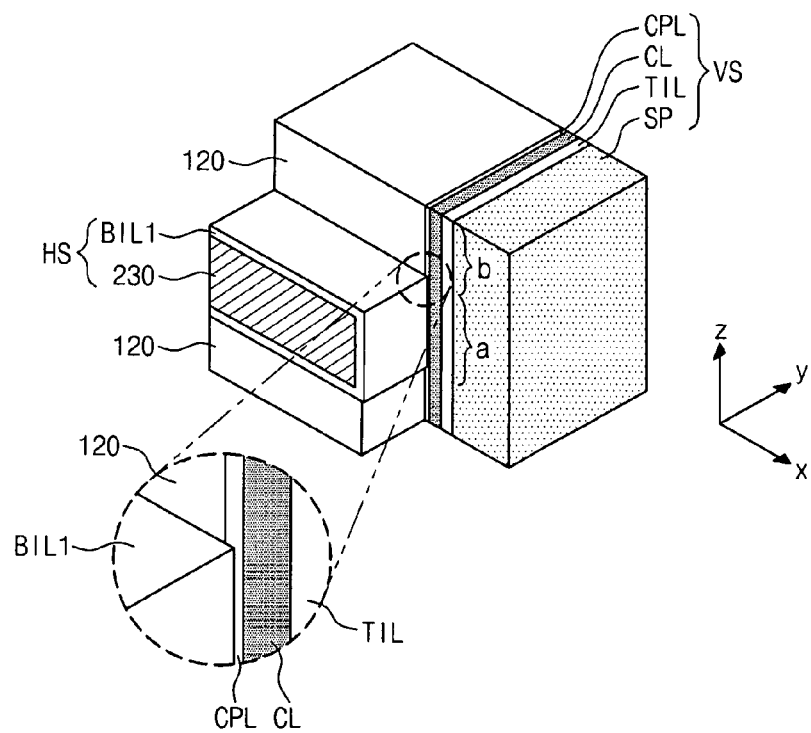
Figure 42:
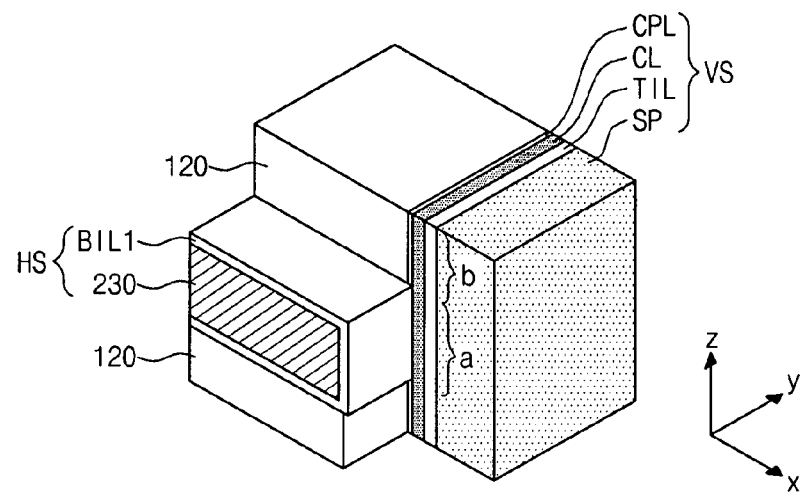
Figure 43:
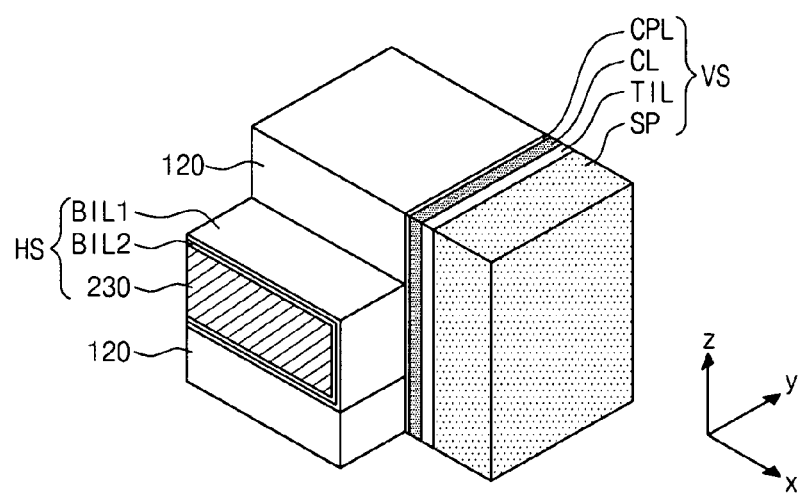

The sidewall thickness of the capping layer CPL may be non-uniform. For example, during the forming of the recess regions 210, the sidewall of the capping layer CPL adjacent to the horizontal structure HS may be horizontally recessed. The thickness of the capping layer CPL may be thicker in a region "b" (or a vertical adjacent region) between the horizontal structures HS than in a region "a" (or a channel region) adjacent to the horizontal structure HS (e.g., as illustrated in FIGS. 33 and 41). The capping layer CPL may locally remain on the vertical adjacent region "b", and the horizontal structure HS may directly contact the sidewall of the charge storing layer CL in the channel region "a" (e.g., as illustrated in FIGS. 34 and 42). The sidewall thickness of the capping layer CPL may be substantially uniform (e.g., as illustrated in FIGS. 28 and 36).

According to example embodiments the horizontal structure HS may include both of the first and second blocking insulating layers BIL1 and BIL2 (e.g., as illustrated in FIGS. 31, 32, 35, 39, 40 and 43). The charge storing layer CL may be one or more insulating layers with abundant trap sites and/or one or more insulating layers with nano particles and may be formed, for example, by CVD and/or ALD. For example, the charge storing layer CL may include one of a trap insulating layer and/or an insulating layer with a floating gate electrode and/or conductive nano dots. The charge storing layer CL may include a silicon nitride layer, a silicon oxynitride layer, a silicon-rich nitride layer, a nano crystalline silicon layer, and/or a laminated trap layer.

The tunnel insulating layer TIL may be one of materials with a higher band gap than the charge storing layer CL, and may be formed by, for example, CVD and/or ALD. For example, the tunnel insulating layer TIL may be a silicon oxide layer. The tunnel insulating layer TIL may undergo a thermal treatment performed after a deposition process. The thermal treatment process may be, for example, a rapid thermal nitridation (RTN) process and/or an annealing process in an atmosphere including nitrogen and/or oxygen.

The first and second blocking insulating layers BIL1 and BIL2 may be different materials, and one of them may be one of materials having a smaller band bap than the tunnel insulating layer TIL and a larger band gap than the charge storing layer CL. The first and second blocking insulating layers BIL1 and BIL2 may be formed by, for example, CVD and/or ALD. At least one of BIL1 and BIL2 may be formed by wet oxidation. According to example embodiments, the first blocking insulating layer BIL1 may be one of high-k dielectric layers (e.g., an aluminum oxide layer and/or a hafnium oxide layer). The second blocking insulating layer BIL2 may be, for example, a material with a smaller dielectric constant than the first blocking insulating layer BIL1. According to example embodiments, the second blocking insulating layer BIL2 may be a high-k dielectric layer and the first blocking insulating layer BIL1 may be of a material with a smaller dielectric constant than the second blocking insulating layer BIL2. According to example embodiments, a third blocking insulating layer (not shown) may be included between the charge storing layer CL and the conductive pattern 230.

The capping layer CPL may be a material providing etch selectivity with respect to the charge storing layer CL and/or the sacrificial layer 130. For example, if the sacrificial layer 130 is a silicon nitride layer, the capping layer CPL may be a silicon oxide layer. During a process for removing the sacrificial layer 130 to form the recess regions 210, the capping layer CPL may be an etch stop layer to prevent and/or reduce etch damage of the charge storing layer CL. If the capping layer CPL may remain between the conductive pattern 230 and the charge storing layer CL (e.g., as shown in FIGS. 28, 33, 35, 36, 41 and 43), the capping layer CPL may be a material contributing to preventing leakage (e.g., back-tunneling) of charge stored in the charge storing layer CL. For example, the capping layer CPL may be one of a silicon oxide layer and a high-k dielectric layer.

Figure 44:
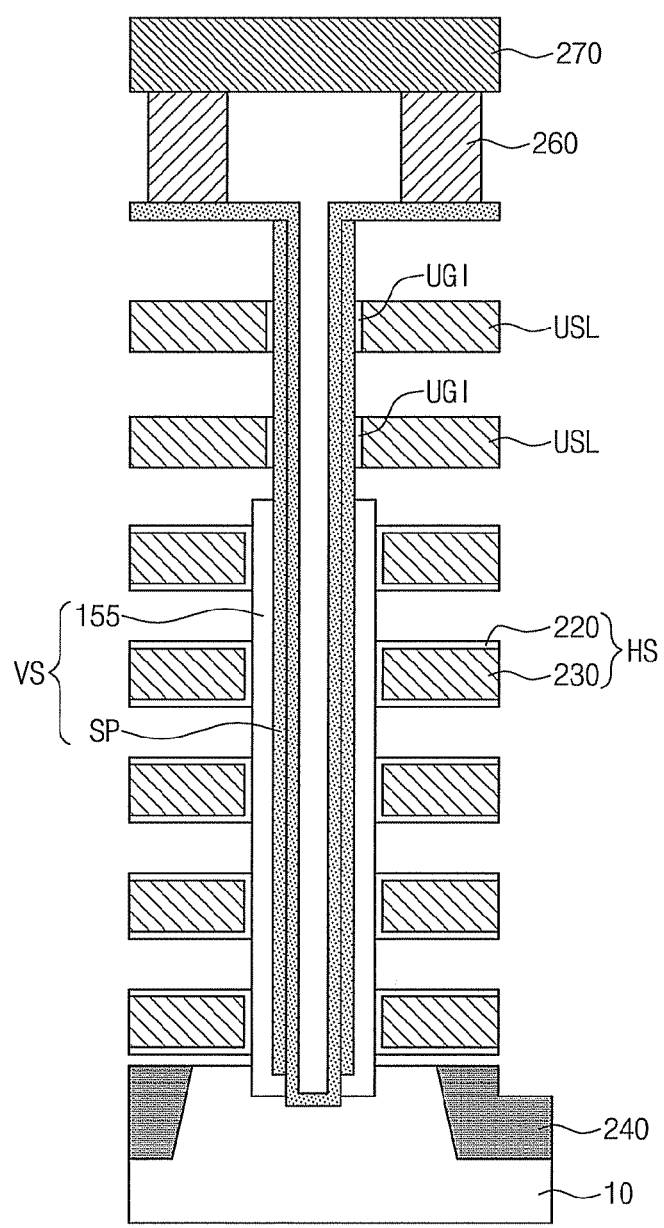
FIGS. 44-46 are cross-sectional diagrams illustrating three-dimensional semiconductor devices according to example embodiments.
Figure 45:
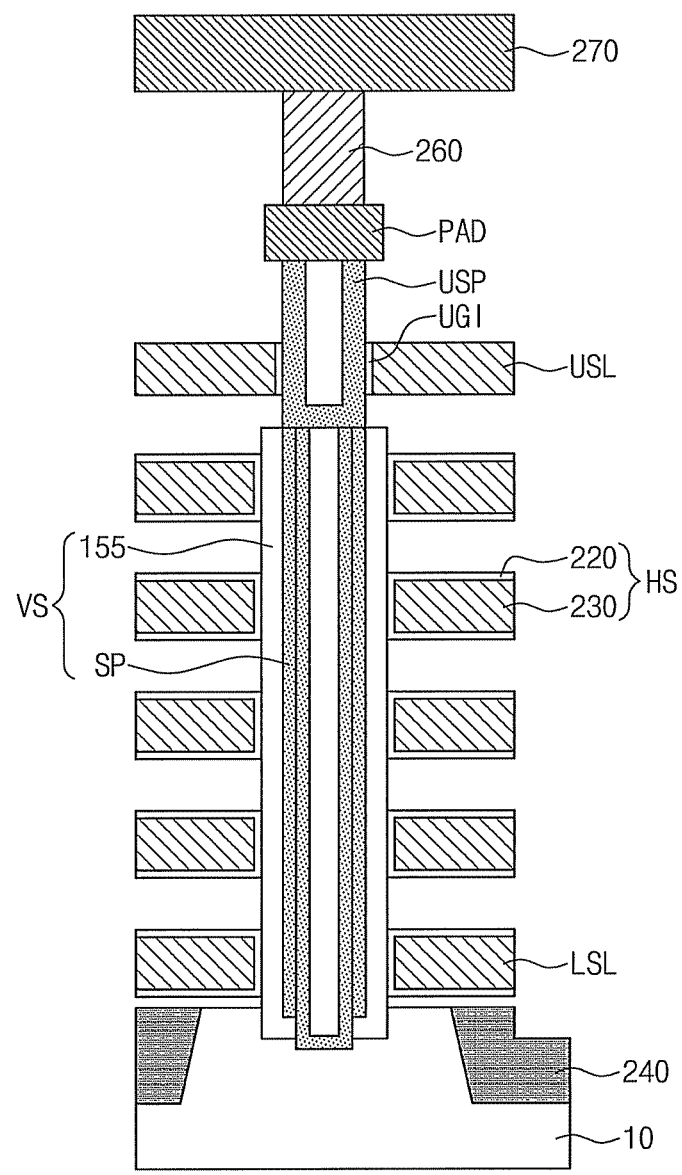
Figure 46:
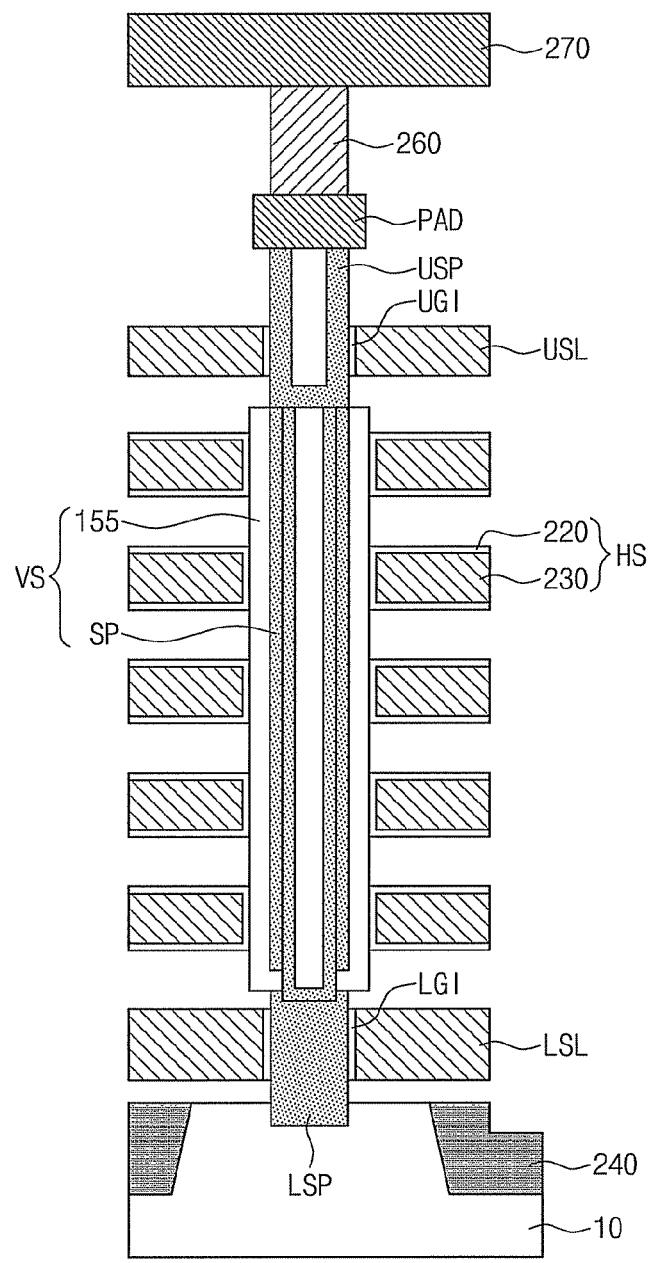

FIGS. 44-46 are cross-sectional diagrams illustrating three-dimensional semiconductor devices according to example embodiments. Referring to FIGS. 44-46, at least one upper selection line USL may be between the upper wiring 270 and the horizontal structures HS. The upper selection line USL may be a gate electrode of an upper selection transistor controlling a flow of current passing through the upper wiring 270 and the semiconductor pattern SP. The upper selection transistor may be a metal-oxide-semiconductor field-effect transistor (MOSFET) and may include an upper gate insulating layer UGI between the upper selection line USL and the semiconductor pattern SP. In order to control the current flow, the upper selection line USL may be arranged in a direction intersecting the upper wiring 270 (e.g., a direction parallel to the horizontal structure HS and/or the conductive pattern 230).

According to example embodiments, the upper selection line USL may be formed through a different process than the conductive pattern 230 of the horizontal structure HS. According to example embodiments, the upper selection line USL and the conductive pattern 230 may be formed through the same process and may be substantially formed of the same material. According to example embodiments, the upper gate insulating layer UGI may be formed through the same process as one of the horizontal pattern 220 and the vertical pattern 155, such that it may be substantially the same material and thickness as one of the horizontal pattern 220 and the vertical pattern 155. The upper gate insulating layer UGI may include a thin layer of one of the horizontal pattern 220 and/or the vertical pattern 155. According to example embodiments, the upper gate insulating layer UGI may be separately formed through a different fabricating process than the horizontal pattern 220 and the vertical pattern 155.

Referring to FIGS. 45 and 46, an upper semiconductor pattern USP may be between the upper wiring 270 and the semiconductor pattern SP, and the upper selection line USL may be around the upper semiconductor pattern USP. According to example embodiments, the upper semiconductor pattern USP may be of the same conductive type as the semiconductor pattern SP. A pad may be between the upper semiconductor pattern USP and the upper plug 260. Referring to FIG. 46, a lower selection line LSL of at least one layer may be between the substrate 10 and the horizontal structures HS. A lower semiconductor pattern LSP may be between the substrate 10 and the semiconductor pattern SP, and the lower selection line LSL may be around the lower semiconductor pattern LSP. The lower selection line LSL may be a gate electrode of a lower selection transistor controlling a flow of current passing through the impurity region 240 and the semiconductor pattern SP. A lower gate insulating layer LGI (or a lower gate insulating layer) may be interposed between the lower selection line LSL and the lower semiconductor pattern LSP.

Figure 47:
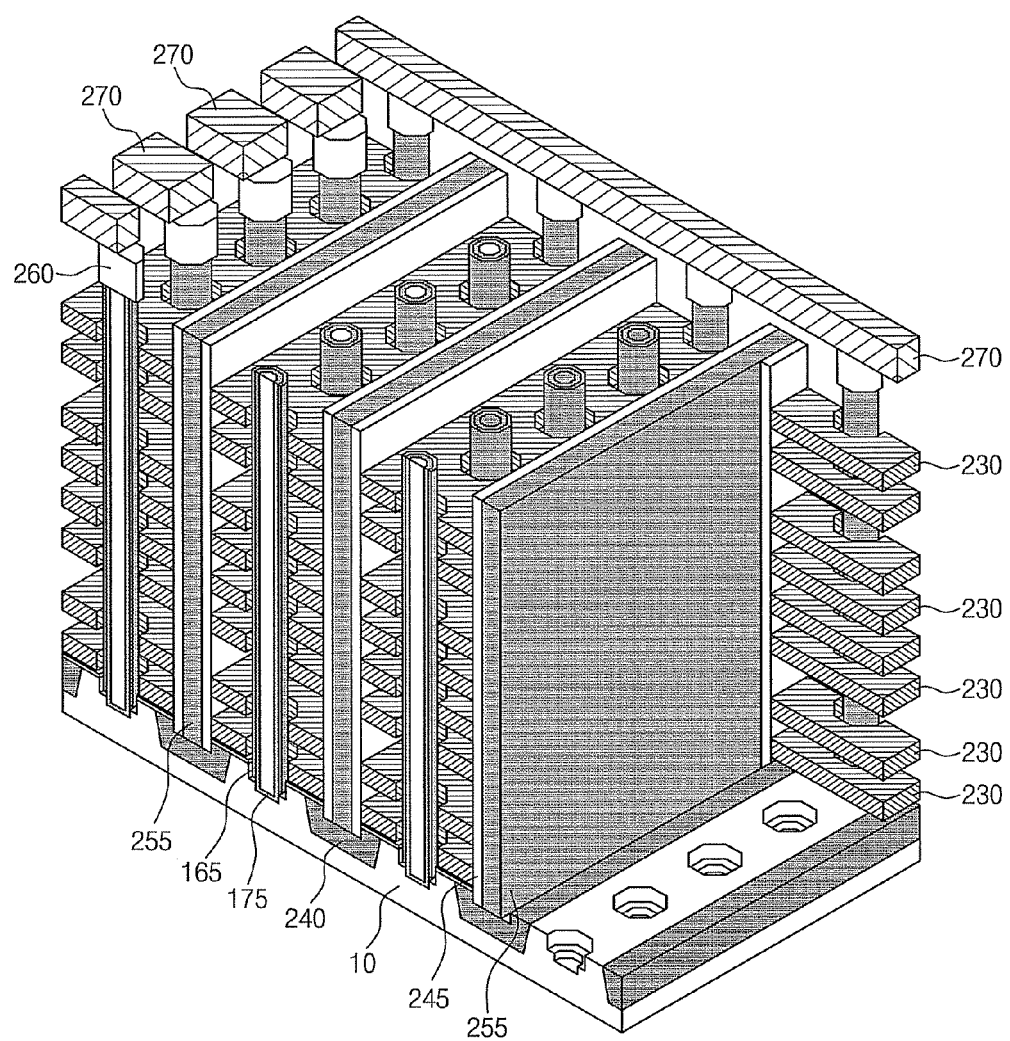
FIGS. 47 and 48 are perspective views illustrating three-dimensional semiconductor devices according to example embodiments.
Figure 48:
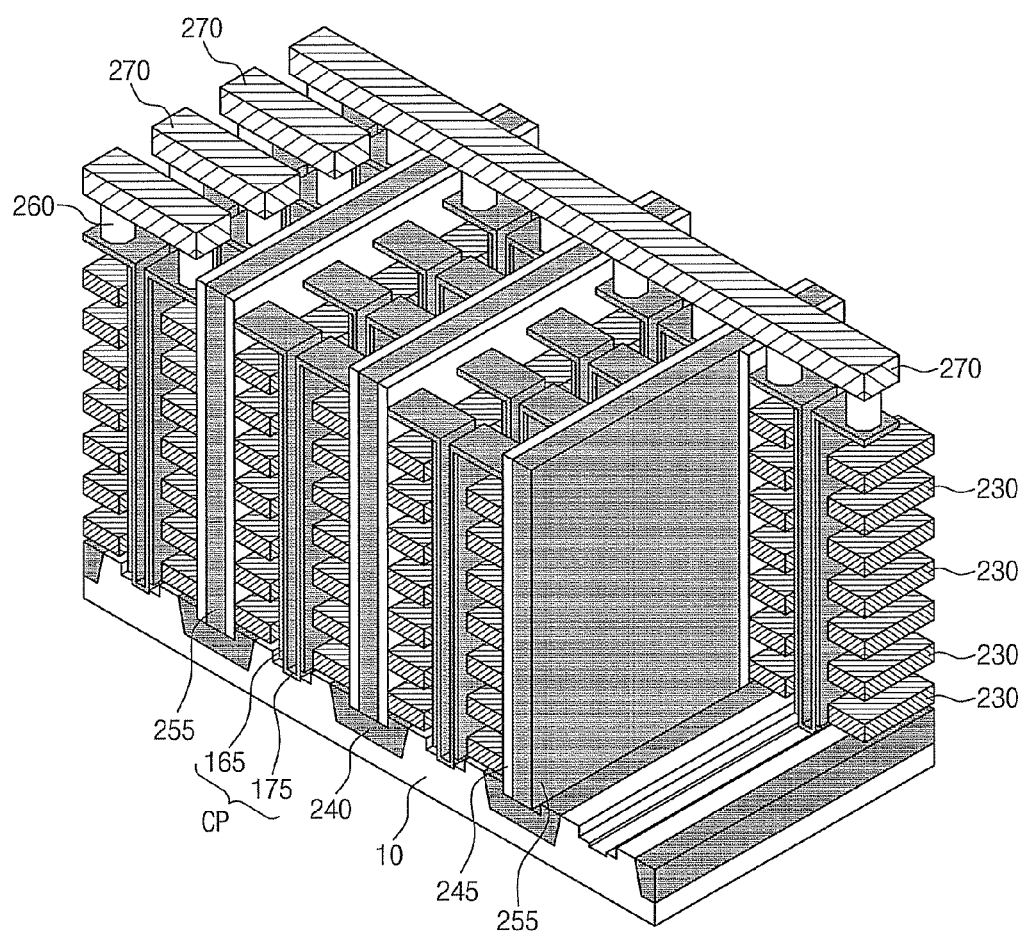

FIGS. 47 and 48 are perspective views illustrating three-dimensional semiconductor devices according to example embodiments. Referring to FIGS. 47 and 48, a vertical conductive plate 255 contacting the impurity region 240 may be in the trench 200. For electrical separation between the vertical conductive plate 255 and the conductive patterns 230, trench spacers 245 may be on the sidewall of the trench 200. The vertical conductive plate 255 may be a conductive material (e.g., at least one of metallic materials such as tungsten). A barrier metal layer (e.g., a metal nitride (not shown)) and/or a silicide layer (not shown)) may be between the impurity region 240 and the vertical conductive plate 255. The trench spacers 245 may be formed of an insulation material (e.g., a silicon oxide layer).

The vertical conductive plate 255 and the trench spacer 245 may be formed after the forming of the impurity region 240 described with reference to FIGS. 9 and 20. By forming an insulating layer that conformally covers the inner wall of the trench 200 and then anisotropically etching the resultant structure to expose the top surfaces of the impurity regions 240, the trench spacer 245 may be formed. By filling the trench (having the trench spacer 245) with a bottom conductive layer and then performing a planarization etch step, the vertical conductive plate 255 may be formed. The vertical conductive plate 255 and the trench spacer 245 may vertically penetrate the conductive patterns 230 and horizontally cross over the semiconductor patterns SP. According to example embodiments, the thickness (e.g., a "z" direction length) of the vertical conductive plate 255 may be substantially identical to that of the trench 200.

Because the vertical conductive plate 255 may be a lower resistivity than the impurity region 240 and may be connected to the impurity region 240, it may contribute to improving a transmission speed of an electrical signal passing through the impurity regions 240. Because a top surface of the vertical conductive plate 255 may be higher than that of the uppermost layer among the conductive patterns 230, technical difficulties of a wiring formation process for electrical connection to the impurity region 240 may be reduced. Because the vertical conductive plate 255 may be a shielding layer between the conductive patterns 230, a capacitive coupling between horizontally adjacent conductive patterns 230 may be reduced. Disturbance may be reduced during program and read operations.

A punch-and-plug technique may be used for three dimensionally realizing a flash memory device equipped with a charge storing layer as a memory element. According to an order of forming an information storing layer and a semiconductor plug used as an active region, the punch-and-plug technique may be classified into a storage-first method. An information storing layer may be formed before the semiconductor plug. For example, according to the storage-first method, the tunnel insulating layer TIL, the charge storing layer CL and the blocking insulating layer BIL, used as a memory element and/or the information storing layer, may be formed to cover the inner wall of, for example, the opening 105. According to a plug-first method, a semiconductor plug may be formed before the information storing layer. According to the plug-first method, the tunnel insulating layer TIL, the charge storing layer CL and the blocking insulating layer BIL, used as a memory element and/or the information storing layer, may be aimed, for example, to cover surfaces of the conductive pattern 230.

According to the storage-first method, the opening 105 may be formed after depositing the word line WL. Owing to technical difficulties in the forming of the opening 105, the word line WL according to the storage-first method may be formed of, for example, doped polycrystalline silicon with a relatively higher resistivity than metal. According to example embodiments of the inventive concepts, for example as described with reference to FIGS. 9 and 20, the word line WL (e.g., the conductive pattern 230) may be formed after the forming of the opening 105/106. Accordingly, in example embodiments of the inventive concepts, the conductive pattern 230 may be metallic.

In the plug-first method, after forming recess regions 210 between insulating layers 120, layers constituting the memory element and the conductive pattern 230 may be sequentially deposited on the inner walls of the recess regions 210. All layers constituting the memory element (i.e., the tunnel insulating layer TIL, the charge storing layer (CL) and the blocking insulating layer (BIL)) may fill the recess regions 210, and a thickness of the conductive pattern 230 should be reduced compared to the recess region 210. This reduction of thickness may cause technical difficulties, for example, an increase of a vertical distance between the conductive patterns 230 and a resistance increase of the conductive pattern 230. These difficulties may become worse as integration density is increased. According to example embodiments of the inventive concepts, because some layers constituting a memory element (i.e., the horizontal pattern 220) may fill the recess regions 210, the technical difficulties in the plug-first method may be suppressed.

In relation to the information storing layer, the various example embodiments of the inventive concepts may be described with reference to Table 1 and FIGS. 28-43. According example embodiments, each of the thin layers included in the information storing layer may be part of the vertical structure VS or the horizontal structure HS. According to example embodiments (e.g., with reference to FIGS. 49-54), at least one layer in the vertical structure VS and at least one layer in the horizontal structure HS may provide a same function. In the following description, these layers of the same function may be referred to as a crossing structure CS. Although at least two layers of the information storing layer (e.g., the crossing structure CS) may be independently formed by the storage-first method or the plug-first method, they may commonly have physical properties required for one of a charge storing element, a tunneling element, and a blocking element.

Figure 49:
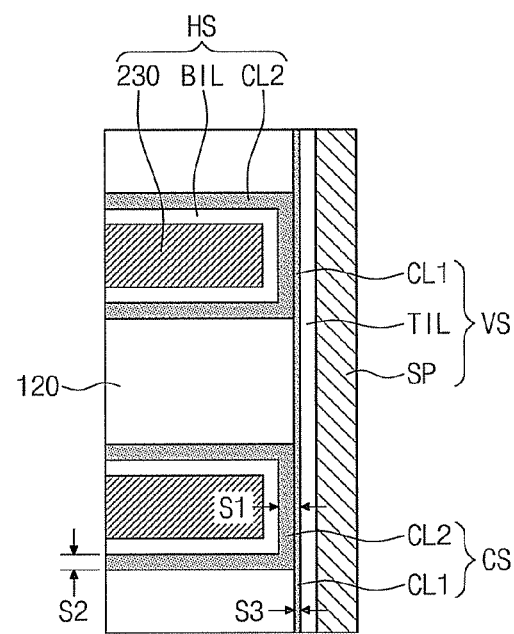
FIGS. 49-54 are cross-sectional diagrams illustrating crossing structures according to example embodiments of the inventive concepts.
Figure 50:
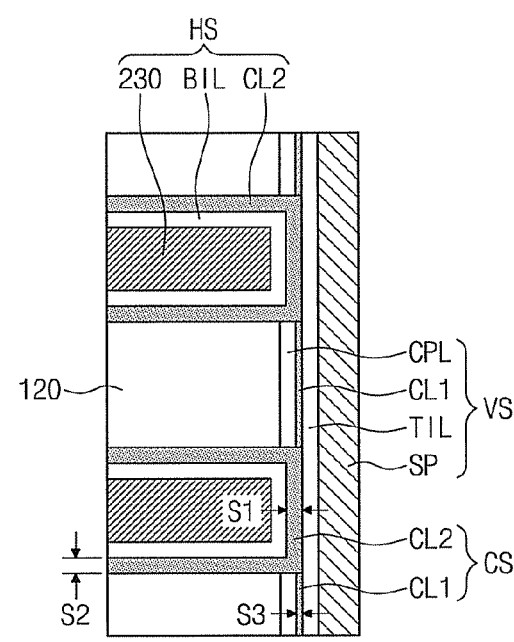
Figure 51:
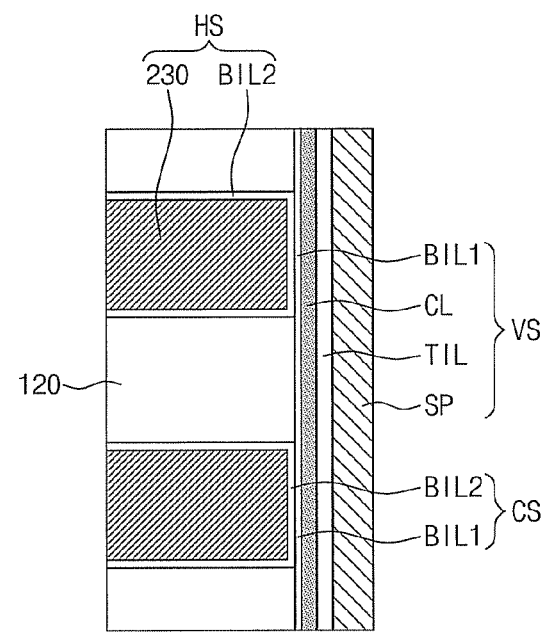
Figure 52:
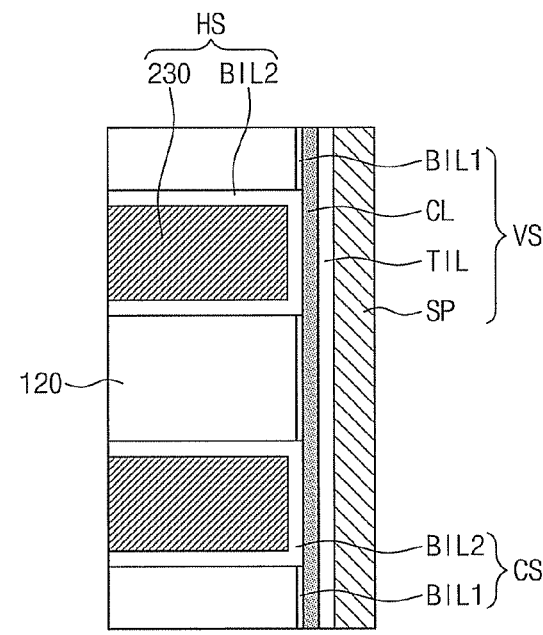
Figure 53:
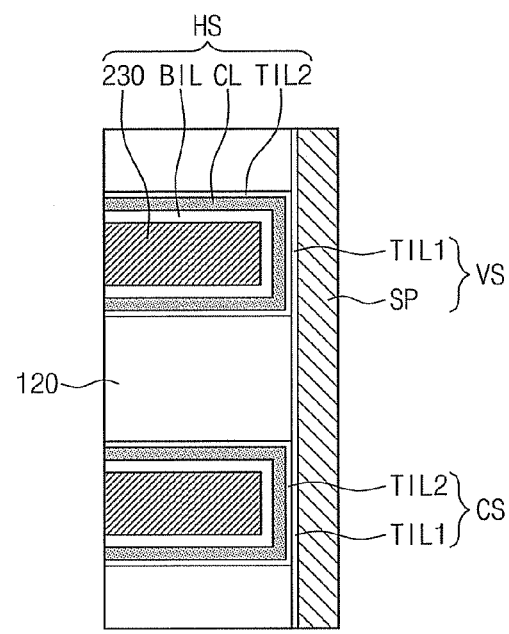
Figure 54:
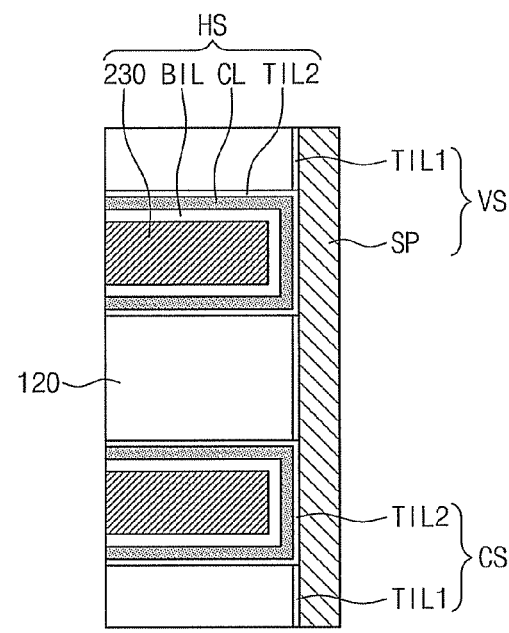

FIGS. 49 and 50 are cross-sectional diagrams illustrating example embodiments of a charge storing element as a crossing structure CS. FIGS. 51 and 52 are cross-sectional diagrams illustrating example embodiments of a blocking element realized as a crossing structure CS. FIGS. 53 and 54 are cross-sectional diagrams illustrating example embodiments of a tunneling element realized as a crossing structure CS.

Referring to FIGS. 49 and 50, the vertical structure VS and the horizontal structure HS may include a first charge storing layer CL1 and a second charge storing layer CL2, respectively. The first and second charge storing layers CL1 and CL2 may include a material with physical properties for storing charges. The first and second charge storing layers CL1 and CL2 may be formed through the storage-first method and the plug-first method, respectively, and may be of a material with a smaller band gap than the blocking insulating layer BIL and a higher trap density than a silicon oxide.

According to example embodiments, the first and second charge storing layers CL1 and CL2 may be of substantially the same material in at least one of a chemical composition and/or an electrical property, and may provide a same function required from the crossing structure CS. The first and second charge storing layers CL1 and CL2 do not need to be the same with respect to chemical composition and/or electrical property. For example, although two kinds of atoms with the highest content of the first charge storing layer CL1 may be identical to those of the second charge storing layer CL2, the content ratios of the two kinds of atoms are not necessarily identical in the first and second charge storing layers CL1 and CL2. For example, the first and second charge storing layers CL1 and CL2 may be a silicon nitride layer including silicon and nitride atoms, but a content ratio of silicon and nitride atoms may be different between the first and second charge storing layers CL1 and CL2.

Referring to FIGS. 51 and 52, the vertical structure VS and the horizontal structure HS may include a first blocking insulating layer BIL1 and a second blocking insulating layer BIL2, respectively, and the first and second blocking insulating layers BIL1 and BIL2 may include a material with a blocking property. The first and second blocking insulating layers BIL1 and BIL2 may be formed through the storage-first method and the plug-first method, respectively. One of the first and second blocking insulating layers BIL1 and BIL2 may include a material with a smaller band gap than the tunnel insulating layer TIL and a larger band gap than the charge storing layer CL.

According example embodiments, in relation to the first and second blocking insulating layers BIL1 and BIL2, in order to provide a same function of a crossing structure CS, at least one of a chemical composition or an electrical property may be substantially the same. However, the first and second blocking insulating layers BIL1 and BIL2 do not need to be the same with respect to chemical composition and/or electrical property. For example, the first blocking insulating layer BIL1 may be a high-k dielectric layer (e.g., an aluminum oxide layer and/or a hafnium oxide layer) and the second blocking insulating layer BIL2 may be include a material with a smaller dielectric constant than the first blocking insulating layer BIL1. According to example embodiments, the second blocking insulating layer BIL2 may be a high-k dielectric layer and the first blocking insulating layer BIL1 may include a material with a smaller dielectric constant than the second blocking insulating layer BIL2.

Referring to FIGS. 53 and 54, the vertical structure VS and the horizontal structure HS may include a first tunnel insulating layer TIL1 and a second tunnel insulating layer TIL2, respectively, and the first and second tunnel insulating layers TIL1 and TIL2 may include a material with a charge tunneling property. The first and second tunnel insulating layers TIL1 and TIL2 may be formed through the storage-first method and the plug-first method, respectively, and one of the first and second tunnel insulating layers TIL1 and TIL2 may be a material with a larger band gap than the charge storing layer CL.

According to example embodiments, in relation to the first and second tunnel insulating layers TIL1 and TIL2, in order to provide a same function of a crossing structure CS, at least one of a chemical composition and/or an electrical property may be substantially the same. However, the first and second tunnel insulating layers TIL1 and TIL2 do not need to be the same with respect to chemical composition and/or electrical property. According to example embodiments, the first and second tunnel insulating layers TIL1 and TIL2 may include thin layers of respectively different chemical compositions.

Figure 55:
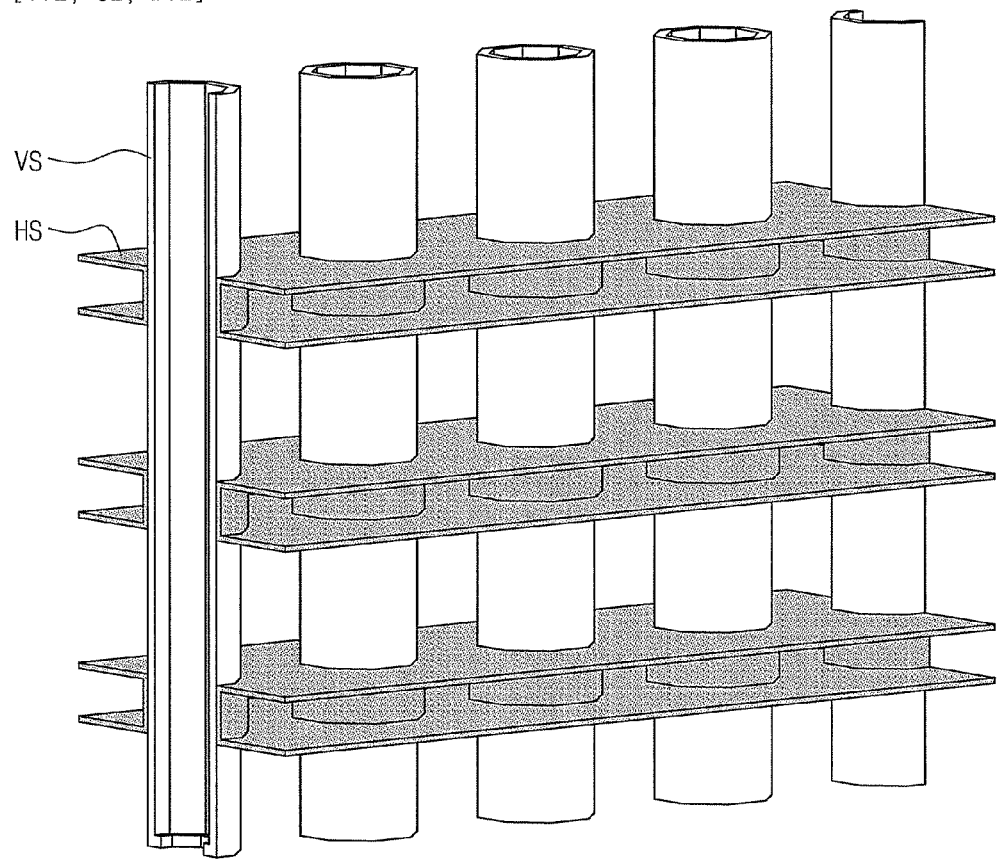
FIGS. 55 and 56 are perspective views illustrating crossing structures according to example embodiments of the inventive concepts.
Figure 56:
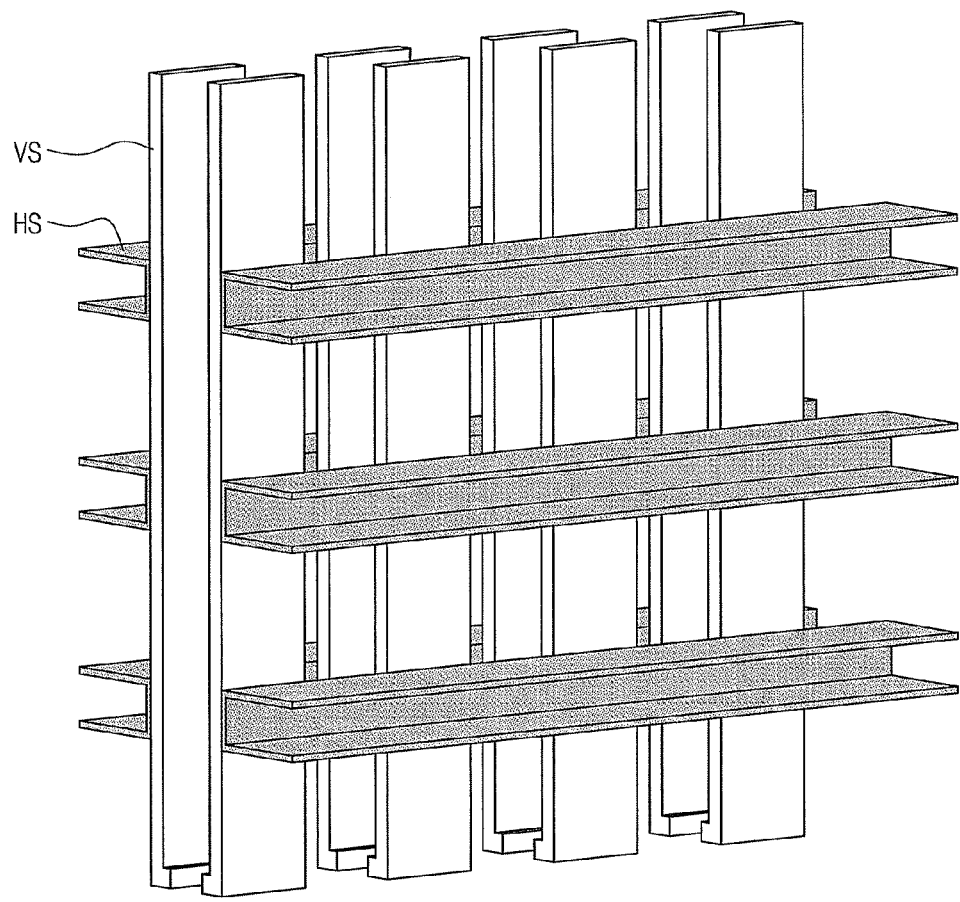

According to example embodiments of the inventive concepts a portion of the crossing structure CS constituting the vertical structure VS may remain between the conductive pattern 230 and the sidewalls of the semiconductor pattern SP (e.g., as illustrated in FIGS. 49, 51, and 53). A thickness 51 of the crossing structure CS measured between the conductive pattern 230 and the sidewalls of the semiconductor pattern SP may be greater than S2 of the crossing structure CS measured between the top and the bottom of the conductive pattern 230. A three-dimensional shape of the crossing structure CS with S1>S2 is illustrated in FIGS. 55 and 56. FIG. 55 is a perspective view illustrating a crossing structure CS according to the fabricating methods described with reference to FIGS. 1-11. FIG. 56 is a perspective view illustrating a crossing structure CS according to the fabricating methods described with reference to FIGS. 12-21.

According to example embodiments of the inventive concepts, a portion of the crossing structure CS of the vertical structure VS may be removed between the conductive pattern 230 and the sidewalls of the semiconductor pattern SP (e.g., as illustrated in FIGS. 50, 52, and 54). The portion of the crossing structure CS of the vertical structure VS may locally remain between the conductive patterns 230 in a vertical position. A thickness S1 of the crossing structure CS measured between the conductive pattern 230 and the sidewalls of the semiconductor pattern SP may be substantially identical to that S2 of the crossing structure measured between the top and the bottom of the conductive patterns 230. A thickness S3 of the crossing structure CS of the vertical structure VS may be different from that S2 of the crossing structure CS of the horizontal structure HS. According to example embodiments, the thickness S2 may be greater than the thickness S3, the thickness S2 may be less than the thickness S3 or the thickness S2 may be substantially the same as the thickness S3.

Figure 57:
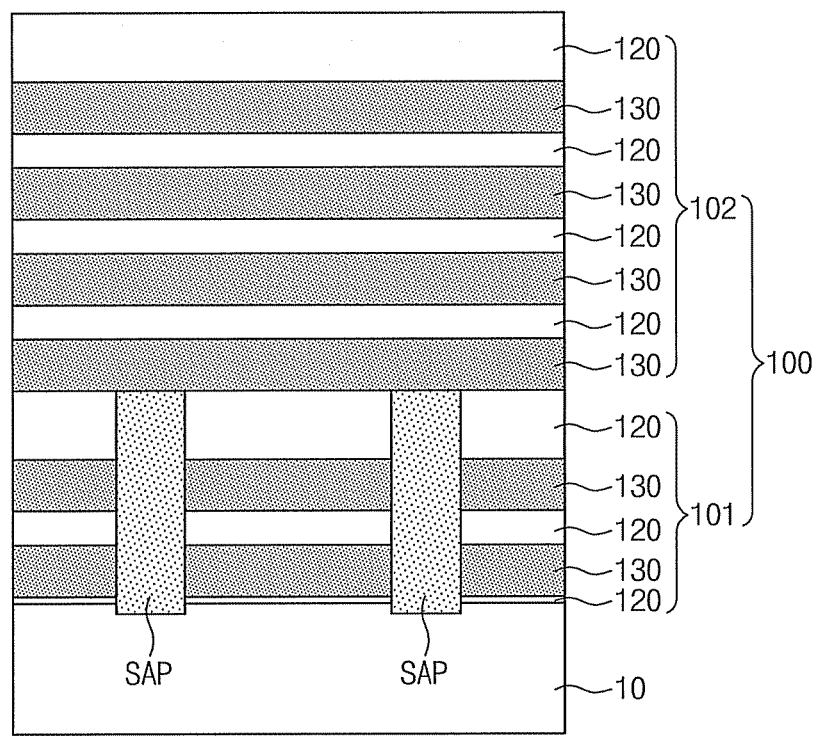
FIGS. 57-66 are cross-sectional diagrams illustrating methods of fabricating the three-dimensional semiconductor devices described with reference to FIG. 46 and other example embodiments.
Figure 58:
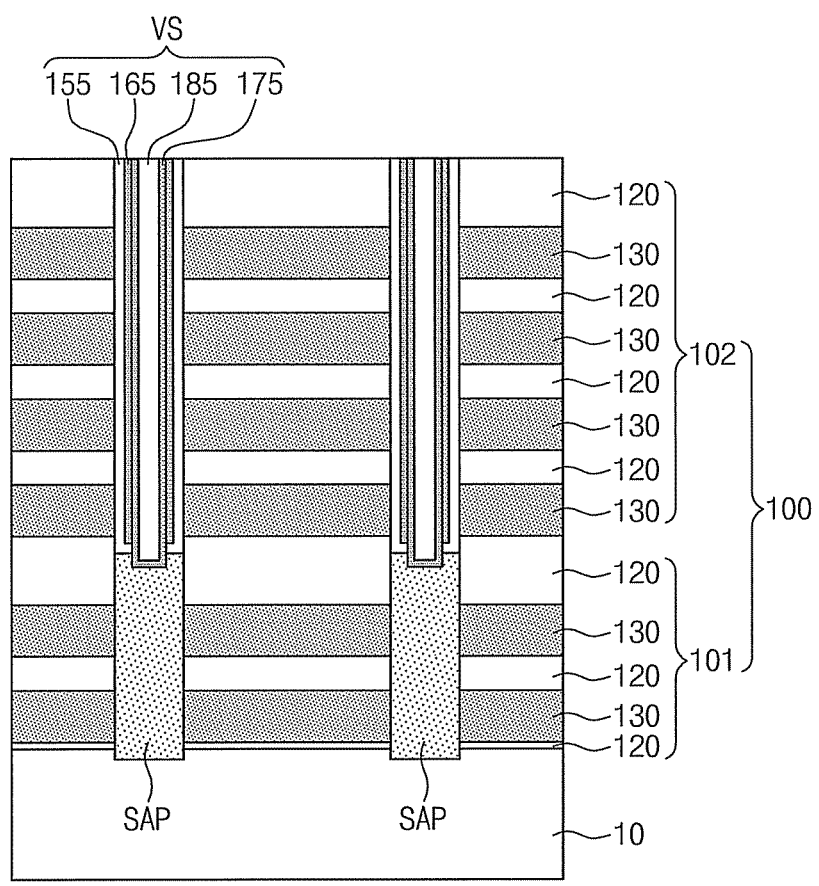
Figure 59:
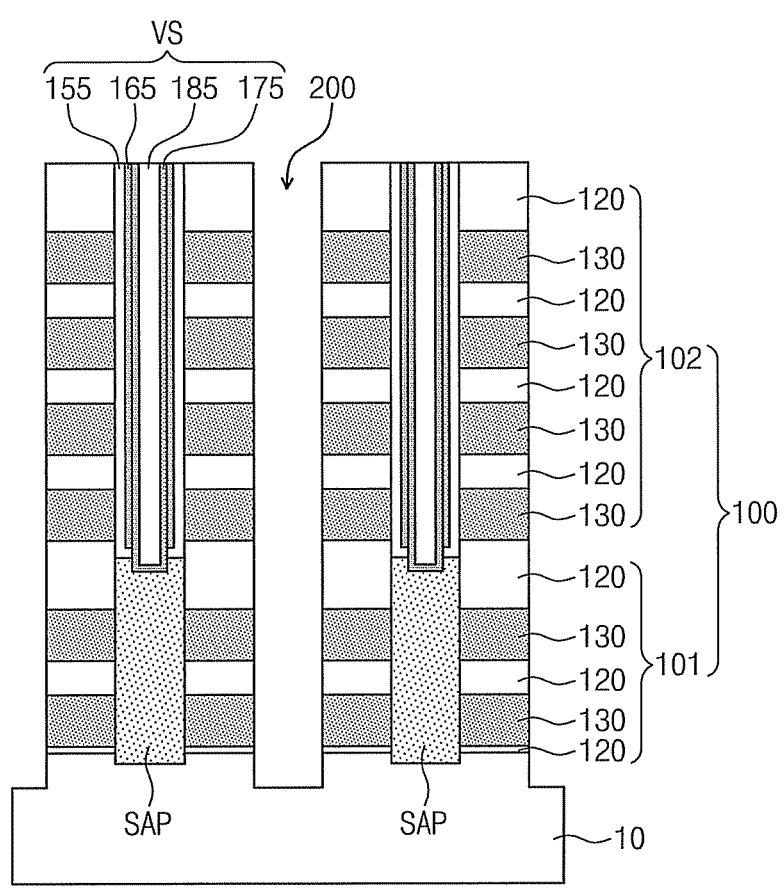

FIGS. 57-66 are cross-sectional diagrams illustrating methods of fabricating the three-dimensional semiconductor devices described with reference to FIG. 46 and other example embodiments. Referring to FIG. 57, after forming of a bottom mold structure 101 on a substrate 10, a selection active pattern SAP penetrating the bottom mold structure 101 may be formed. An upper mold structure 102 may be formed on the structure with the selection active pattern SAP. Each of the lower and upper mold structures 101 and 102 may be formed by, for example, using methods of fabricating the mold structure 100 described with reference to FIG. 1. The lower and upper mold structures 101 and 102 may be a mold structure 100.

Each of the lower mold structure 101 and the upper mold structure 102 may include insulating layers 120 alternating with sacrificial layers 130 (e.g., repeatedly stacked). The forming of the selection active pattern SAP may include, after forming of holes and/or openings penetrating the lower mold structure 101, filling the holes and/or openings with a material with a semiconducting property (e.g., a semiconductor layer). The holes and openings may be shaped and arranged similarly to example embodiments described with reference to FIGS. 2 and 12. The semiconductor layer may be formed by, for example, CVD. A process for planarizing the semiconductor layer may be performed to expose a top surface of the lower mold structure 101. The selection active pattern SAP may be a structure obtained by performing the planarization process on the semiconductor layer.

The selection active pattern SAP may be formed of, for example, a semiconductor of a same conductive type as the substrate 10 or an intrinsic semiconductor. For example, in case of a semiconductor material (e.g., a silicon wafer) having the same conductive type as the substrate 10, the selection active pattern SAP may be a p-type or intrinsic semiconductor. According to example embodiments, the selection active pattern SAP may be formed of a semiconductor material of a polycrystalline structure (e.g., polycrystalline silicon). According to example embodiments, the semiconductor layer may be formed using an epitaxial technique and/or a laser crystallization technique. The selection active pattern SAP may be a single crystal structure and/or a polycrystalline structure with a larger grain size than obtained by a CVD technique. A material of the selection active pattern SAP may be silicon but example embodiments of the inventive concepts are not limited thereto. For example, carbon nano structures, organic semiconductor materials and/or compound semiconductors may be used for the selection active pattern SAP.

Figure 60:
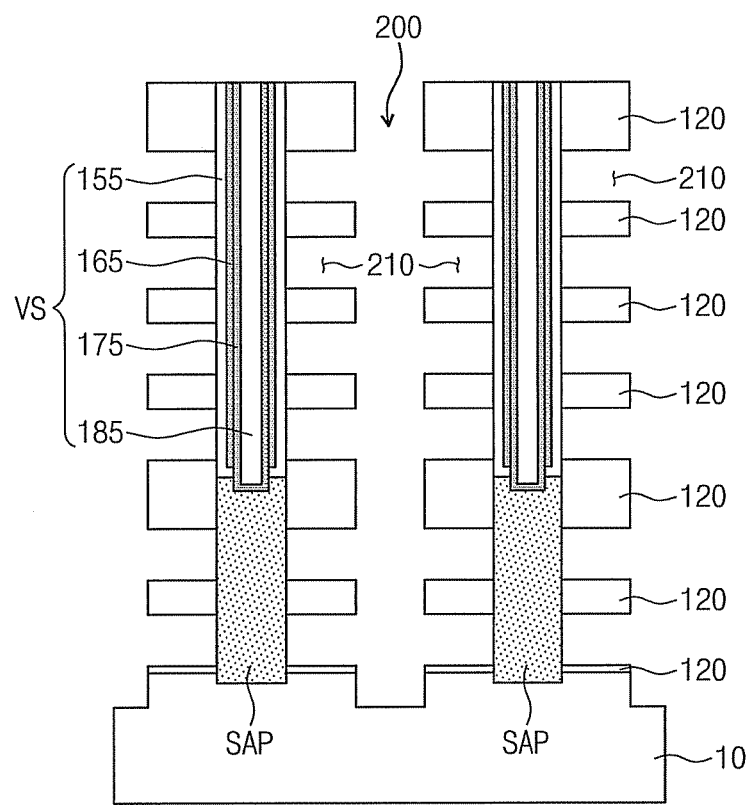
Figure 61:
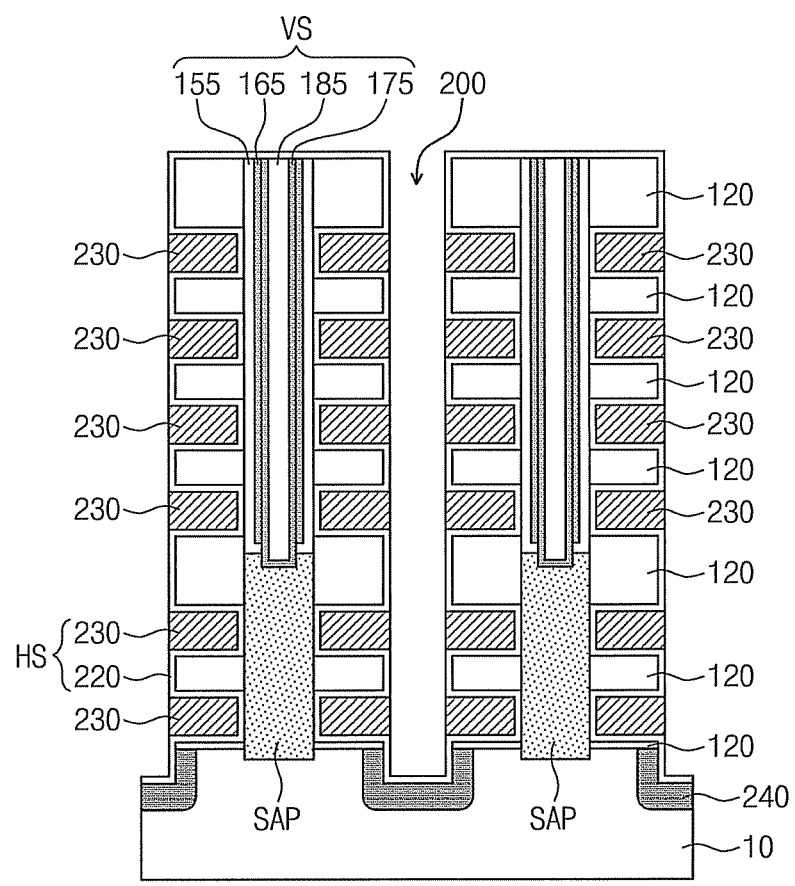
Figure 62:
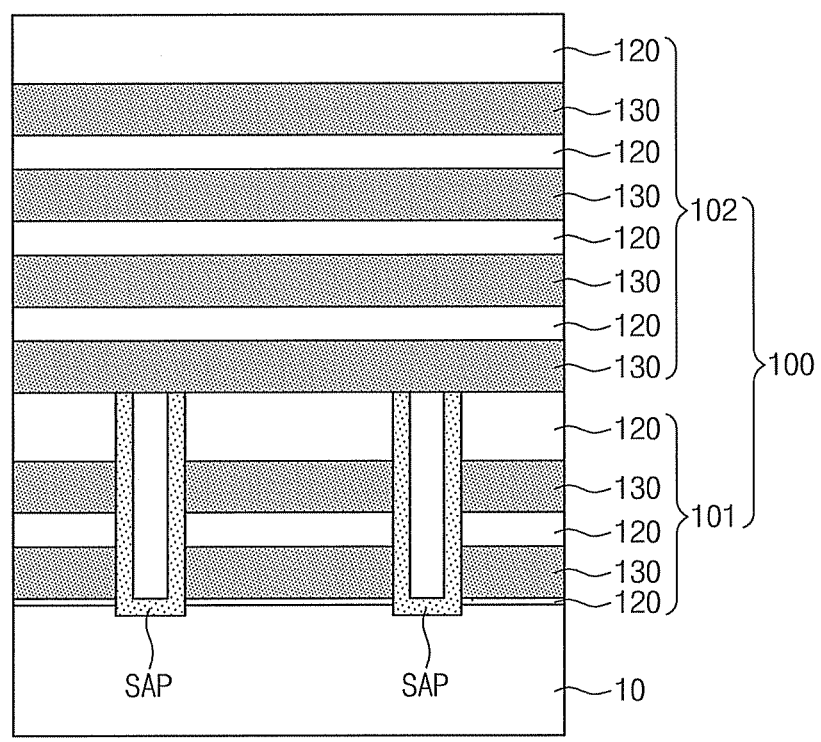
Figure 63:
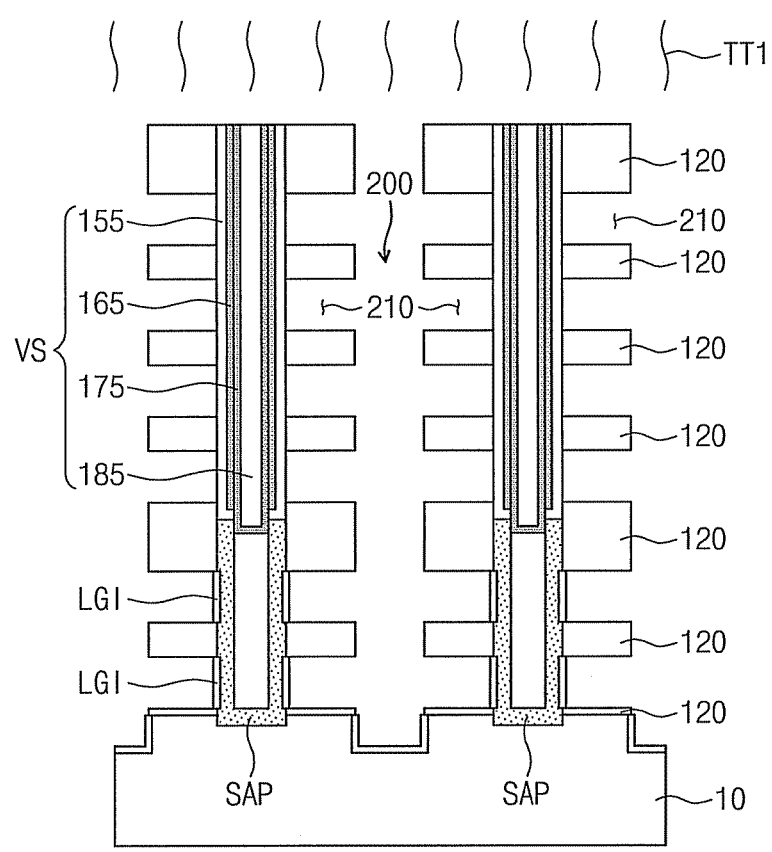

Referring to FIGS. 58-61, a vertical structure VS penetrating the upper mold structure 102 may be formed to contact the selection active pattern SAP. Trenches 200 penetrating the mold structure 100 may be formed. Referring to FIG. 60, by selectively removing the sacrificial layers 130 with sidewalls exposed by the trenches 200, recess regions 210 exposing the vertical structure VS and the sidewalls of the selection active pattern SAP may be formed. Referring to FIG. 61, horizontal structure HS filling the recess regions 210 may be formed.

The vertical structure VS and the horizontal structure HS may be formed using methods of fabricating three-dimensional semiconductor devices described with reference to FIGS. 1-11 and/or with reference to FIGS. 12-21. The vertical structure VS may include a vertical pattern 155, a semiconductor spacer 165, a semiconductor body portion 175 and/or a buried pattern 185. The horizontal structure HS may include horizontal patterns 220 covering the inner wall of the recess region and a conductive pattern 230 filling the remaining spaces of the recess region 210. The vertical pattern 155 and the horizontal pattern 220 may be the same or similar to that described with reference to FIGS. 1-43. According to example embodiments, the semiconductor layer and the selection active pattern SAP may be formed to fill the holes and/or the openings. The selection active pattern SAP may be, for example, substantially formed with a rectangular shape. If the sidewalls of the holes and/or the openings are not vertical to the top surface of the substrate 10, the selection active pattern SAP may be substantially formed with, for example, a trapezoidal shape.

According to example embodiments of the inventive concepts, a portion of the bottom region of the semiconductor body portion 175 may extend into the top surface of the selection active pattern SAP (e.g., similarly to FIG. 61). The selection active pattern SAP positioned at the bottom of the semiconductor body portion 175 may be formed with, for example, a rectangular and/or trapezoidal shape. This structure may be a result of over-etch during the forming of the semiconductor body portion 175.

Figure 64:
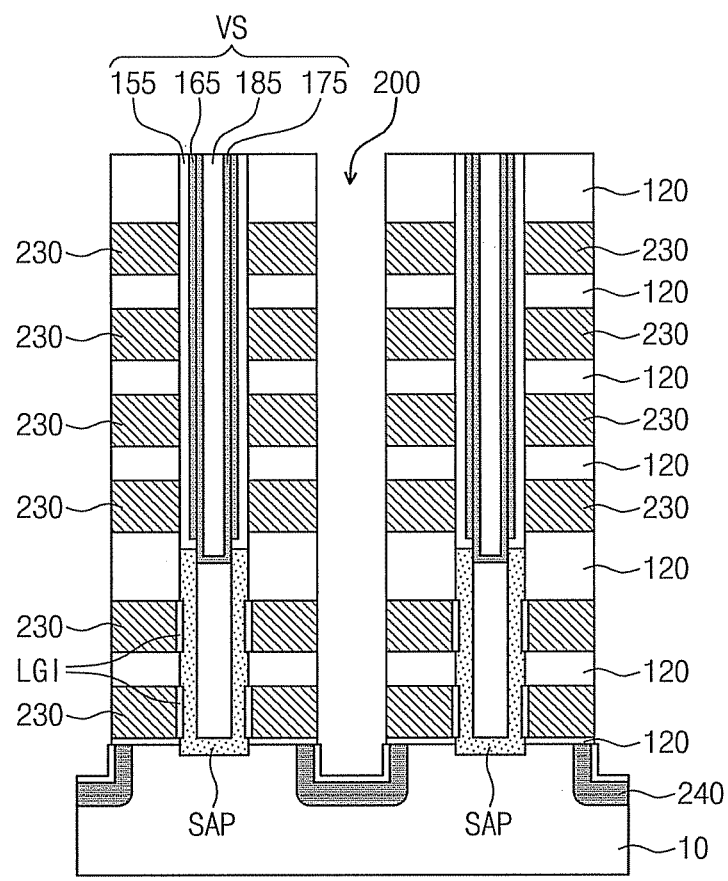

Referring to FIGS. 62-66, the selection active pattern SAP may include sidewalls covering the inner sidewalls of the holes and/or the openings and a bottom portion contacting the top surface of the substrate 10. According to example embodiments, because the sidewalls and the bottom portion of the selection active pattern SAP may be formed with a conformal thickness, the selection active pattern SAP may have a U-shaped. According to example embodiments related to methods of fabricating a three-dimensional semiconductor device described with reference to FIG. 46, referring to FIG. 63, a selection gate insulating layer LGI may be selectively formed on the exposed sidewall of the selection active pattern SAP. Referring to FIG. 64, conductive patterns 230 and impurity regions 240 filling the recess regions 210 may be formed. A vertical pattern 155 may include a tunnel insulating layer, a charge storing layer and a blocking insulating layer. According to example embodiments, an insulation thin film covering the inner wall of the recess region 210 may be formed (e.g., before the forming of the conductive patterns 230). The insulation thin layer may be used as a part of the blocking insulating layer.

Figure 67:
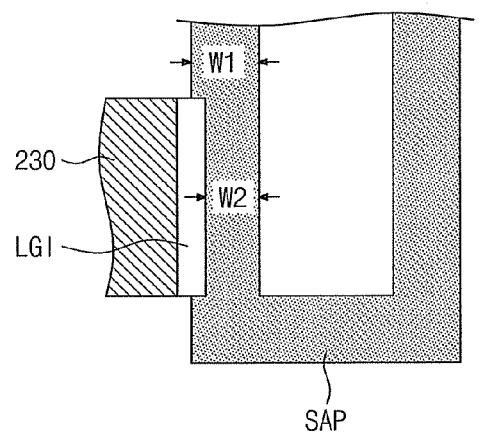
FIG. 67 is a cross-sectional diagram illustrating example embodiments described with reference to FIG. 64.

According to example embodiments, the selection gate insulating layer LGI may be formed through a thermal treatment process TT1 for selectively oxidizing the exposed sidewall of the selection active pattern SAP with a gas atmosphere including oxygen atoms. The selection gate insulating layer LGI may be a thermal oxide layer and may be locally formed on the exposed sidewall of the selection active pattern SAP and the top surface of the substrate 10 exposed by the trench 200. Because a thermal oxide layer is formed through reaction of oxygen atoms and silicon atoms of the selection active pattern SAP, silicon atoms on the surface of the selection active pattern SAP may be consumed. Referring to FIG. 67, thickness W1 of the selection gate insulating layer LGI or the selection active pattern SAP on or below the conductive pattern 230 may be greater than the thickness W2 of the selection active pattern SAP around the selection gate insulating layer LGI.

The thermal treatment process TT1 may be performed in a gas atmosphere including oxygen atoms. During the thermal treatment, the exposed surface of the vertical structure VS may be a vertical pattern formed not of a silicon layer but rather insulation materials. Accordingly, the selection gate insulating layer LGI may not be substantially formed on the sidewall of the vertical structure VS (e.g., the vertical pattern may not be substantially oxidized).

Figure 65:
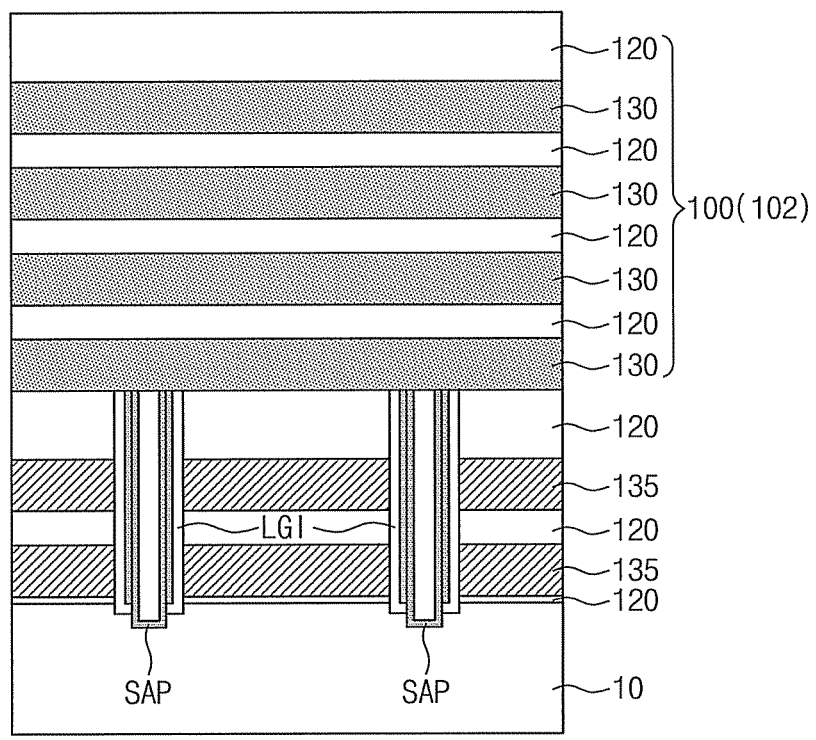

According to example embodiments related to methods of fabricating a three-dimensional semiconductor device described with reference to FIG. 46, referring to FIG. 65, conductive lines 135 used as gate lines of a selection transistor may be formed (e.g., before the forming of the upper mold structure 102). According to example embodiments, insulating layers 120 and conductive layers (not shown) may be sequentially and alternately stacked on the substrate 10. Holes and/or openings penetrating the insulating layers 120 and the conductive layers may be formed. A selection gate insulating layer LGI and selection active patterns SAP filling the holes and/or the openings may be formed (e.g., sequentially formed). The upper mold structure 102 may be formed on the structure including the selection active patterns SAP. According to example embodiments, the conductive lines 135, the selection gate insulating layer LGI and the selection active pattern SAP may be formed through the storage-first method described with reference to FIG. 49.

Figure 66:
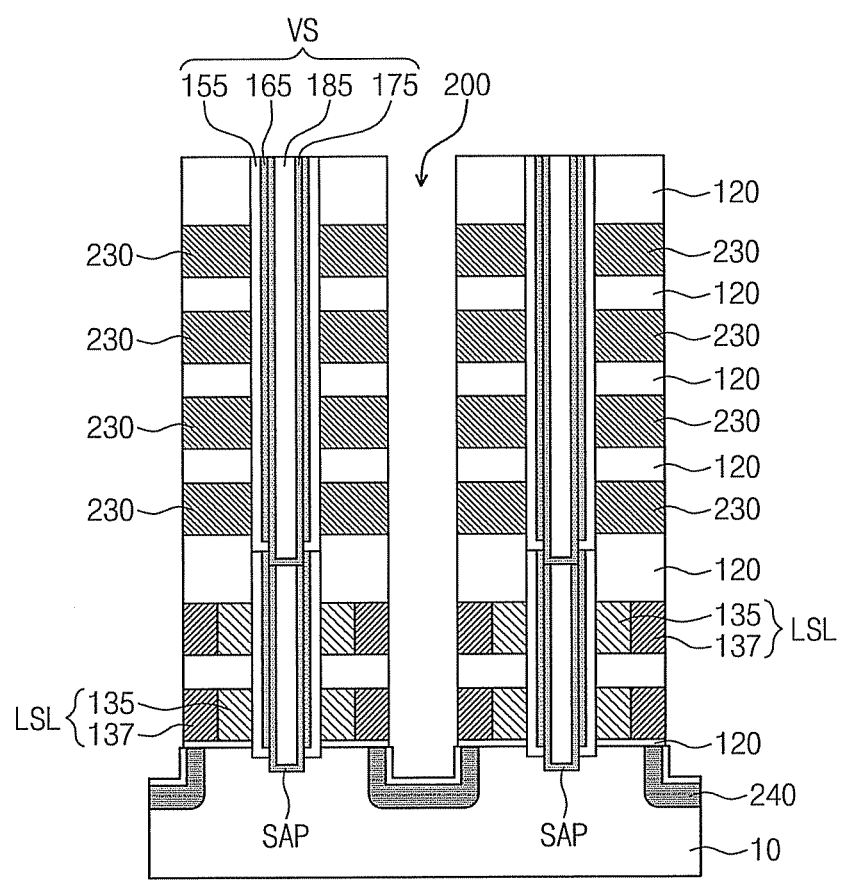

According to example embodiments, the conductive lines 135 may be, for example, doped polycrystalline silicon. Referring to FIG. 66, the lower selection line LSL may be formed to include the conductive line 135 of polycrystalline silicon and a metal silicide pattern 137. For example, after the forming of the recess regions 120, a metal layer filling the recess region 210 and the trench 200 completely or partially may be formed and a silicide forming process for reacting the metal layer with the conductive line 135 of polycrystalline silicon may be performed. A portion of the conductive line 135 may be silicided to form the metal silicide pattern 137. (A metal layer filling the recess regions 210 of the upper mold structure 102 may be maintained without reaction.) The metal layer remaining in the trench and not participating in the silicide forming process may be removed. FIG. 66 may illustrate a structure after the metal layer is removed.

Figure 68:
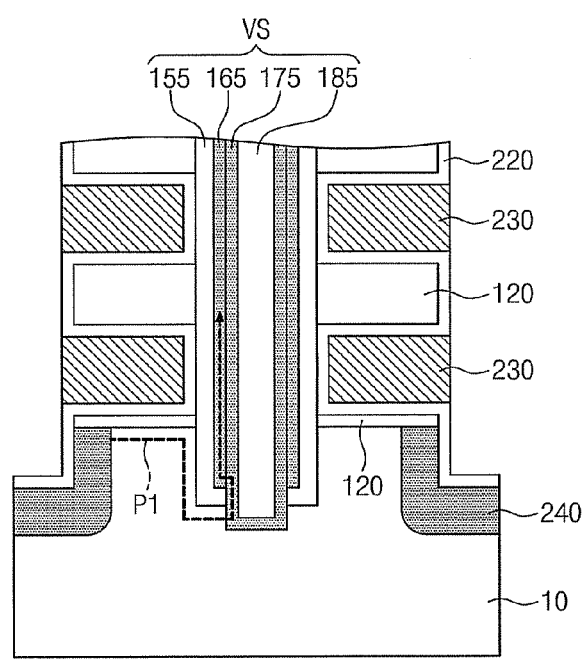
FIGS. 68 and 69 are cross-sectional diagrams to compare three-dimensional semiconductor devices according to example embodiments of the inventive concepts.
Figure 69:
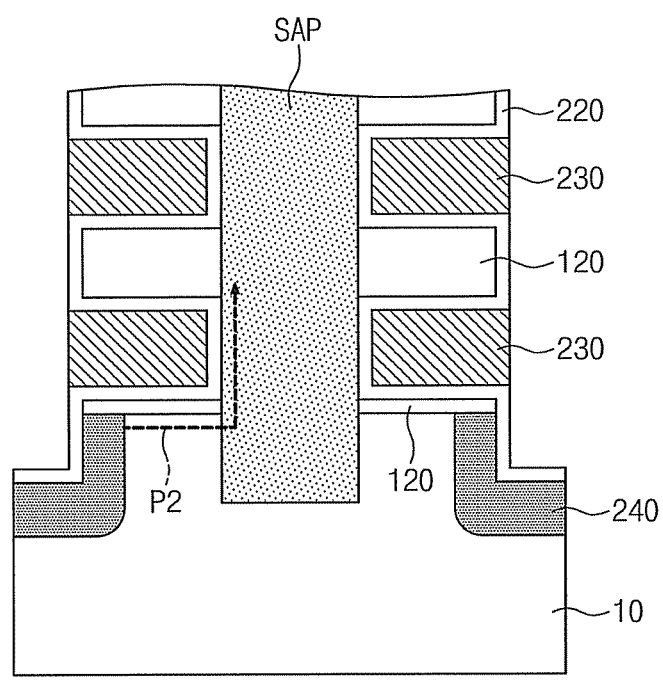

FIGS. 68 and 69 are cross-sectional diagrams to compare three-dimensional semiconductor devices according to example embodiments of the inventive concepts. FIGS. 68 and 69 illustrate a current path in the three-dimensional semiconductor device described with reference to FIGS. 1-21 and a current path in the three-dimensional semiconductor device described with reference to FIGS. 57-64. Referring to FIG. 68, in a three-dimensional semiconductor device described with reference to FIGS. 1-21, because of the presence of the vertical pattern 155 inserted at the predetermined depth in the top surface of the substrate 10, a current path P1 passing through the impurity region 240 may increase.

It may be required that an inversion region be selectively formed in the substrate 10 for the current path P1, but the vertical pattern 155 may prevent generation of the inversion region. Because the inversion region is formed by voltage applied to the lowermost conductive pattern 230, resistance of the inversion region may be exponentially increased as a distance in a straight line from the lowermost conductive pattern 230 is increased. According to simulation, when the depth that the vertical pattern 155 is inserted into the substrate 10 is increased from 0 nm to 70 nm, resistance may be increased $10^{10}$ times. Referring to FIG. 69, when the selection active pattern SAP is extended on the substrate 10 without the vertical pattern 155, since a current path P2 is formed adjacent to the lowermost conductive pattern 230, lengthening of the current path and exponential increase of electrical resistance may be prevented and/or reduced.

FIGS. 70-82 are cross-sectional diagrams illustrating example embodiments with respect to forming an under-cut region 77 described with reference to FIG. 24. Three-dimensional semiconductor devices including the under-cut region 77 on a bottom surface of the vertical pattern 155, and methods of fabricating the semiconductor devices may be described. Methods of forming the under-cut region 77 and structures according thereto are not limitedly applied to the structure shown in FIG. 24. Those skilled in the art may easily apply the inventive concepts according to example embodiments related to the under-cut region 77 and an expansive description may be omitted. Furthermore, each of the following described methods may be applied instead to the methods of fabricating described with reference to FIGS. 3-6 and/or FIGS. 13-14. Other methods may be performed based on following methods (e.g., steps described with reference to FIGS. 7-11 and/or FIGS. 15-21).

Although multiple example embodiments are described with respect to FIGS. 70-82, overlapping description may be omitted for brevity.

Referring to FIG. 70-73, a mold structure 100 including an insulating layer 121 and a sacrificial layer 131 may be formed on a substrate 10. An opening 105 may be formed to penetrate the mold structure 100 to expose the top surface of the substrate 10, and a vertical layer 150 and a first semiconductor layer 160 may be formed on the inner wall of the opening 105 (e.g., sequentially formed). The mold structure 100 may be substantially identical to that of the embodiment described with reference to FIG. 1. For example, an insulating layer 121 and a sacrificial layer 131 may illustrate a portion of the mold structure 100 and the mold structure 100 may include more insulating layers and sacrificial layers as shown in FIG. 1.

The opening 105 may be formed with, for example, a hole shape (e.g., similarly to FIG. 2) and/or to include a portion of a hexahedral shape (e.g., similarly to FIG. 12). According to example embodiments, during the forming of the opening 105, the top surface of the substrate 10 may be recessed. The bottom surface of the opening 105 may become lower than the uppermost surface of the substrate 10 contacting the bottom surface of the insulating layer 121. The recess of the substrate 10 may formed by over-etch of the opening 105.

The recess of the substrate 10 may contribute to improving structural stability of the vertical pattern 155. The vertical layer 150 and the first semiconductor layer 160 may be formed to conformally and substantially cover the sidewall and bottom surface of the opening 105. A sum of deposition thicknesses of the vertical layer 150 and the first semiconductor layer 160 may be less than the half of a width of the opening 105. The opening 105 may not be completely filled by the vertical layer 150 and the first semiconductor layer 160.

Figure 70:
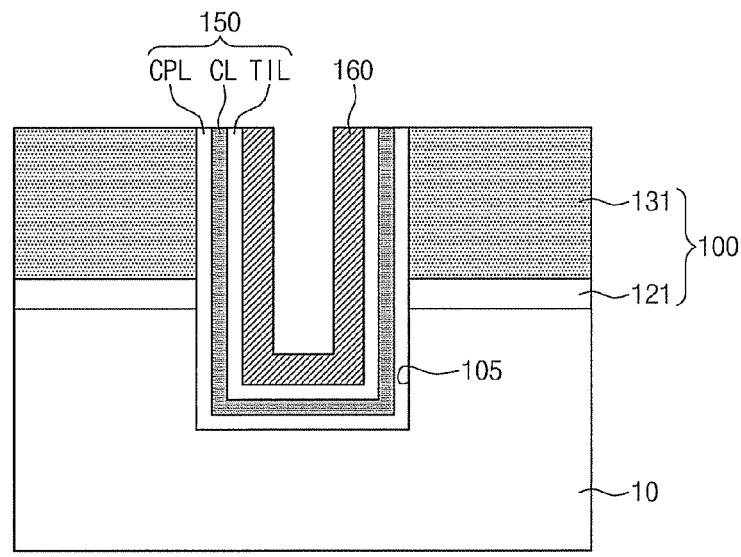
FIGS. 70-82 are cross-sectional diagrams illustrating methods of fabricating undercut regions according to example embodiments of the inventive concepts.
Figure 71:
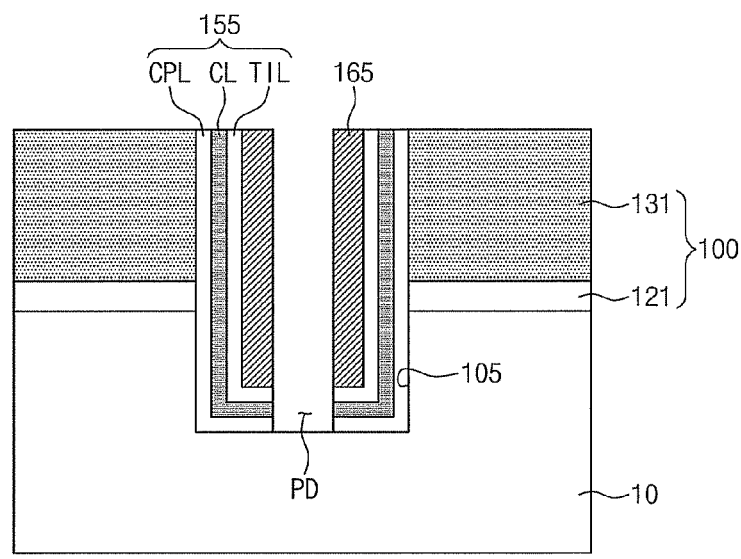

The vertical layer 150 and the first semiconductor layer 160 may be formed as the vertical structure VS according to, for example, example embodiments described with reference to FIGS. 28-43. For example, the vertical layer 150 may include a capping layer CPL, a charge storing layer CL and a tunnel insulating layer TIL, which may be sequentially deposited as shown in FIG. 70. Material and property of each of the capping layer CPL, the charge storing layer CL and the tunnel insulating layer TIL may be substantially identical to example embodiments described with reference to FIGS. 28-43. The first semiconductor layer 160 may be, for example, a polycrystalline silicon layer. Referring to FIG. 71, a penetrating dent PD exposing the top surface of the substrate 10 at the bottom of the opening 105 may be formed by, for example, anisotropically etching the first semiconductor layer 160 and the vertical layer 150. The forming of the penetrating dent PD, as described with reference to FIG. 4, may be performed through a plasma dry etch method using the mold structure 100 as an etch mask.

Figure 72:
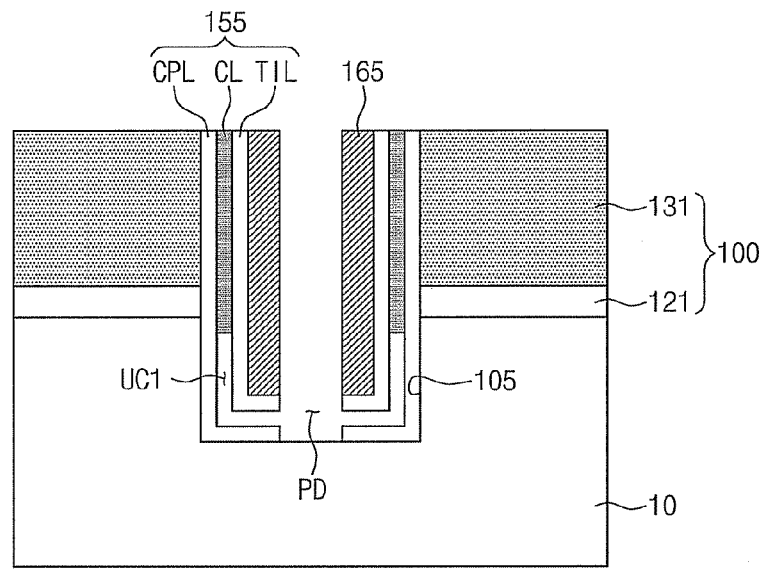

A semiconductor spacer 165 covering the inner sidewall of the vertical pattern 155 may be formed by the etch. The penetrating dent PD may be formed to penetrate the vertical layer 150 covering the bottom surface of the opening 105. The vertical pattern 155 with sidewalls exposed by the penetrating dent PD may be formed. For a thin layer structure (e.g., as described with reference to FIG. 71), sidewalls of the capping layer CPL, the charge storing layer CL and the tunnel insulating layer TIL may be exposed by the penetrating dent PD at about the bottom of the opening 105. Referring to FIG. 72, a first under-cut region UC1 may formed by isotropically etching the exposed charge storing layer CL. The first under-cut region UC1 may be a gap region extending from the penetrating dent PD, and may be formed to partially expose the surfaces of the capping layer CPL and the tunnel insulating layer TIL. According to example embodiments, the charge storing layer CL may be, for example, a silicon nitride layer. The first under-cut region UC1 may be formed through a wet etch process using, for example, an etchant with phosphoric acid. According to example embodiments, the first under-cut region UC1 may be formed using an isotropic dry etch method.

Figure 73:
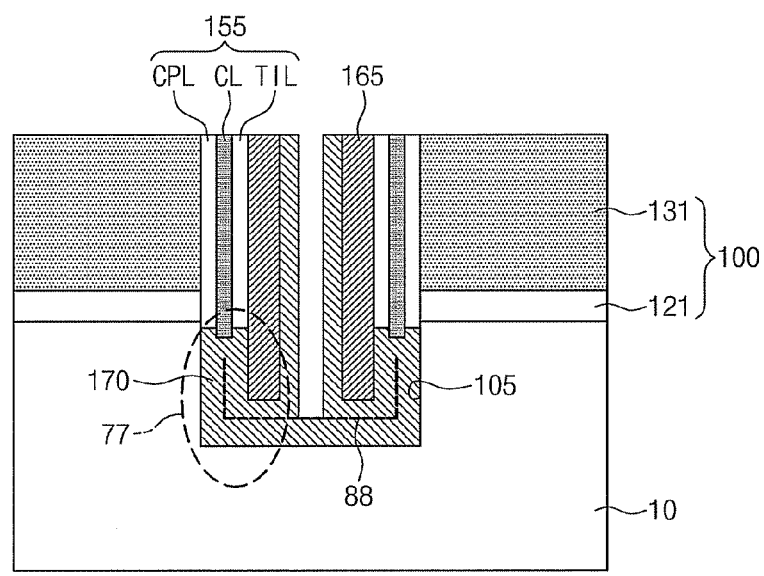

Referring to FIG. 73, the capping layer CPL and the tunnel insulating layer TIL, exposed by the first undercut region UC1, may be isotropically etched to form a second undercut region (not shown). The second undercut region may be formed to expose not only a portion of the surface of the substrate 10 defining the opening 105 and covered by the capping layer CPL, but also a lower region of an outer sidewall and a bottom surface of the semiconductor spacer 165 covered by the tunnel insulating layer TIL. The second undercut region and the first undercut region UC1 may constitute the undercut region 77. The forming of the second under-cut region may be performed using, for example, at least one of a wet etch and isotropic dry etch method. A wet etch method with an etchant including hydrofluoric acid and/or sulfuric acid may be used.

A second semiconductor layer 170 connecting the substrate 10 with the semiconductor spacer 165 may be formed in the under-cut region 77. The second semiconductor layer 170 may be formed of a semiconductor material (e.g., polycrystalline silicon) formed using a deposition technique. The second semiconductor layer 170 may extend from the under-cut region 77 to cover the inner wall of the semiconductor spacer 165. As a result of a deposition process, the second semiconductor layer 170 may have a seam 88 in the under-cut region 77.

Figure 74:
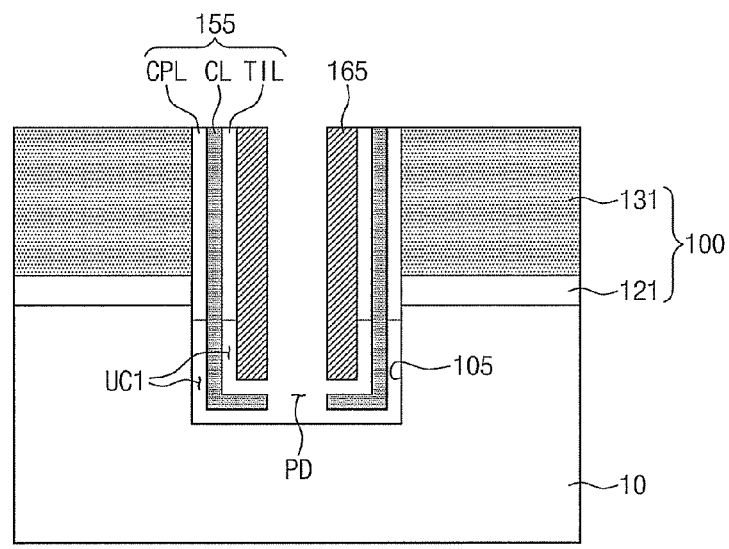
Figure 75:
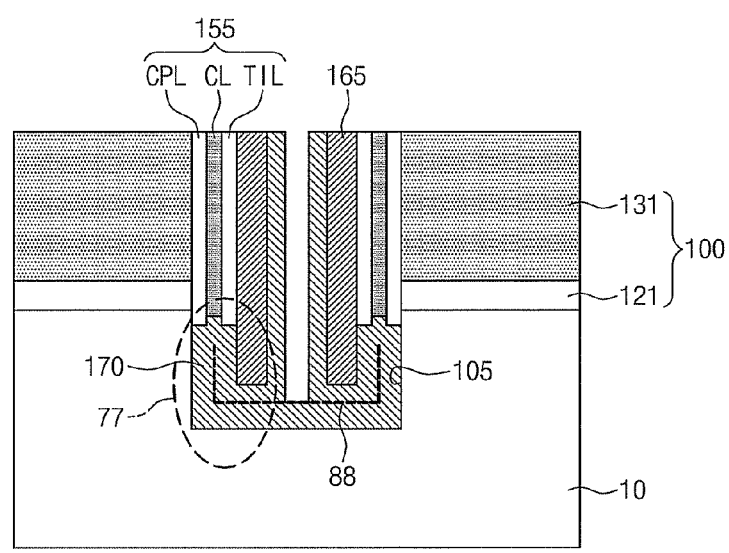

Referring to FIGS. 74 and 75, according to example embodiments of the inventive concepts, the forming of the first under-but region UC1 described with reference to FIG. 72 may include, for example, isotropically etching the capping layer CPL and the tunnel insulating layer TIL (e.g., before the charge storing layer CL). The capping layer CPL and the tunnel insulating layer TIL may be etched using wet etch and/or isotropic dry etch methods. For example, an etchant including hydrofluoric acid and/or sulfuric acid may be used. Referring to FIG. 75, the charge storing layer CL may be etched. A bottom surface of the charge storing layer CL may be further spaced from the bottom surface of the opening 105 than at least one of the capping layer CPL or the tunnel insulating layer TIL. The charge storing layer CL may be recessed with respect to the capping layer CPL or the tunnel insulating layer TIL. In FIG. 73, the capping layer CPL and the tunnel insulating layer TIL may be recessed with respect to the charge storing layer CL.

Figure 76:
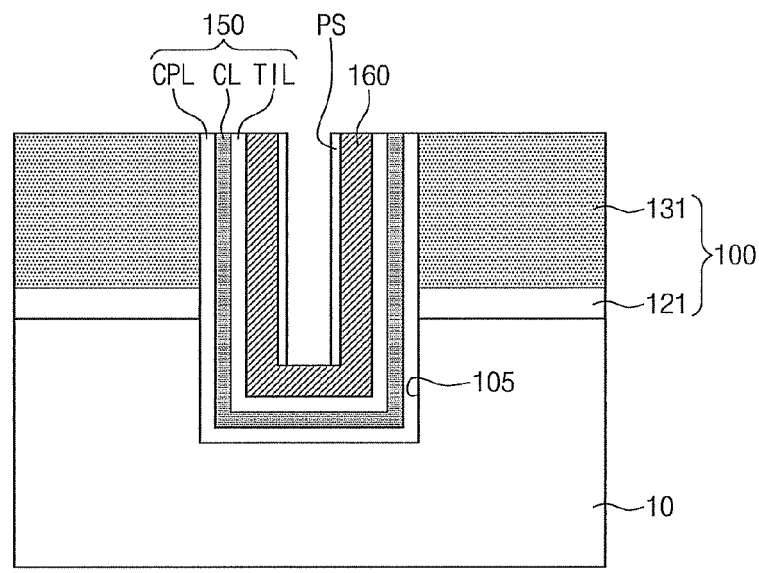

Referring to FIGS. 76-80, according to example embodiments of the inventive concepts, a first semiconductor layer 160 may be formed. Referring to FIG. 76, a protective layer spacer PS may be formed in an opening 105. The protective layer spacer PS may be formed of a material with etch selectivity to the first semiconductor layer 160. According to example embodiments, the protective layer spacer 165 may be, for example, a silicon oxide layer and/or a silicon nitride layer formed using ALD. The protective layer spacer PS may be formed thinner than half the difference between the half of the width of the opening 105 and the sum of deposition thicknesses of the vertical layer 150 and the first semiconductor layer 160. The opening 105 may not be completely filled by the protective layer spacer PS.

Figure 77:
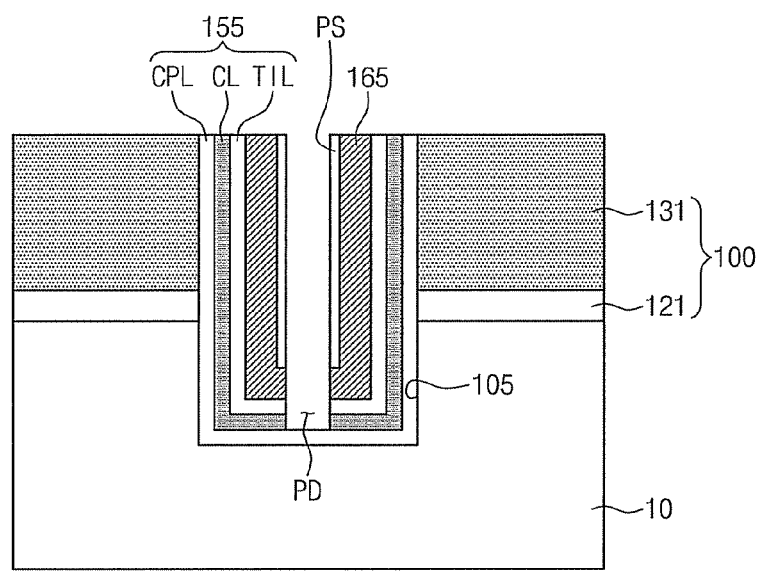
Figure 78:
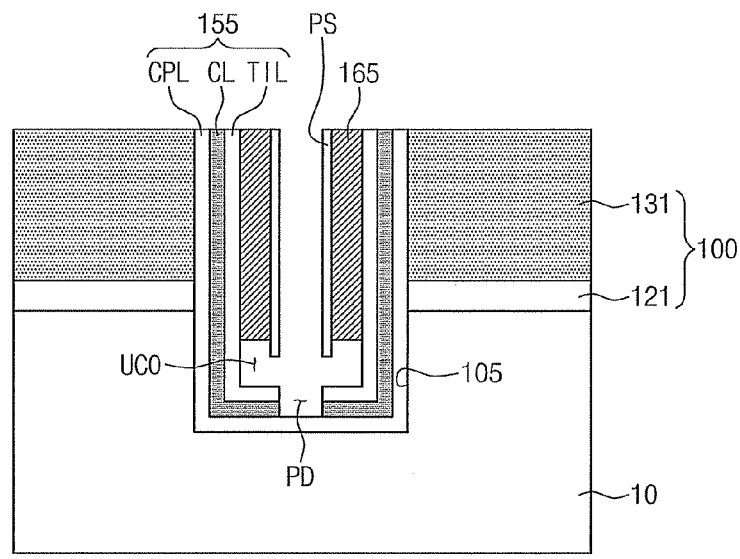
Figure 79:
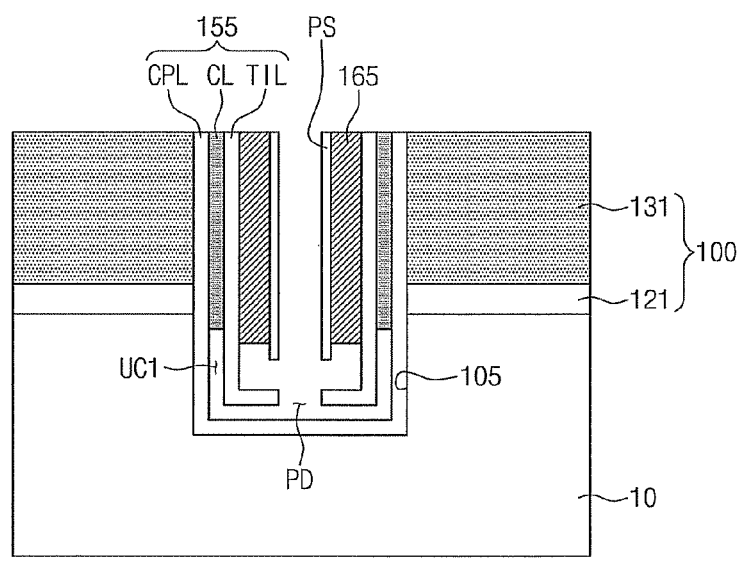
Figure 80:
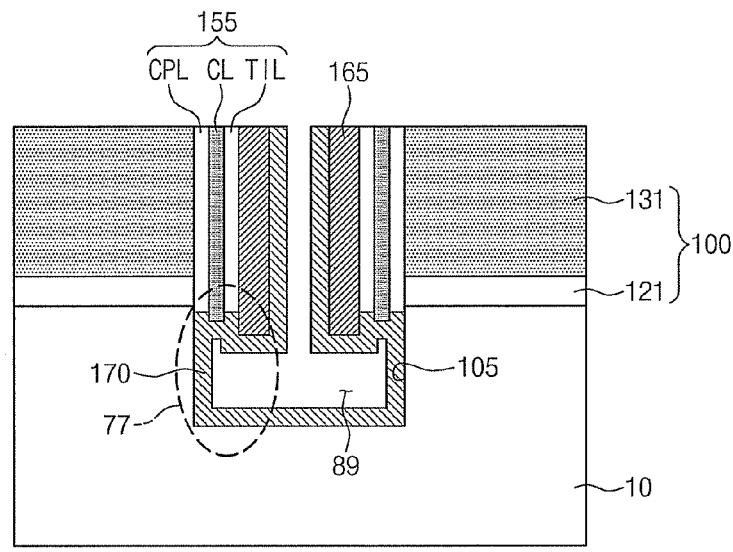

A penetrating dent PD penetrating one or more of the thin layers constituting the vertical layer 150 may be formed. Referring to FIG. 77, the penetrating dent PD may be formed to allow the capping layer CPL to remain below the penetrating dent PD. Referring to FIG. 78, an under-cut region UC0 extended by, for example, isotropically etching the semiconductor spacer 165 exposed by the penetrating dent PD may be formed. Referring to FIGS. 79 and 80, the under-cut region 77 may be completed by, for example, isotropically etching the vertical layer 155.

Although FIGS. 79 and 80 may illustrate the method described with reference to FIG. 72, the under-cut region 77 may be formed using the fabricating methods according to example embodiments described with reference to FIGS. 70-75. The protective layer spacer PS may be removed while the vertical layer 155 is isotropically etched. For example, if the protective layer spacer PS is formed of a silicon nitride layer, protective layer spacer PS may be removed while the charge storing layer CL described with reference to FIG. 72 is etched. If the protective layer spacer PS is formed of a silicon oxide layer, protective layer spacer PS may be removed while the tunnel insulating layer TIL and the capping layer CPL described with reference to FIG. 73 are etched.

Because of the extended under-cut region UC0, a height difference between the bottom surfaces of the vertical pattern 155 and the semiconductor spacer 165 may be reduced as compared to example embodiments described with reference to FIGS. 73 and 75. Referring to FIG. 80, the under-cut region 77 may be more expansive than according to example embodiments described with reference to FIGS. 73 and 75. This expansion of the under-cut region 77 may allow the second semiconductor layer 170 to conformally cover the inner walls of the under-cut region 77 with less difficulty. Due to the expansion of the under-cut region 77, void 89, which is not completely filled by the second semiconductor layer 170, may be formed in the under-cut region 77.

Figure 81:
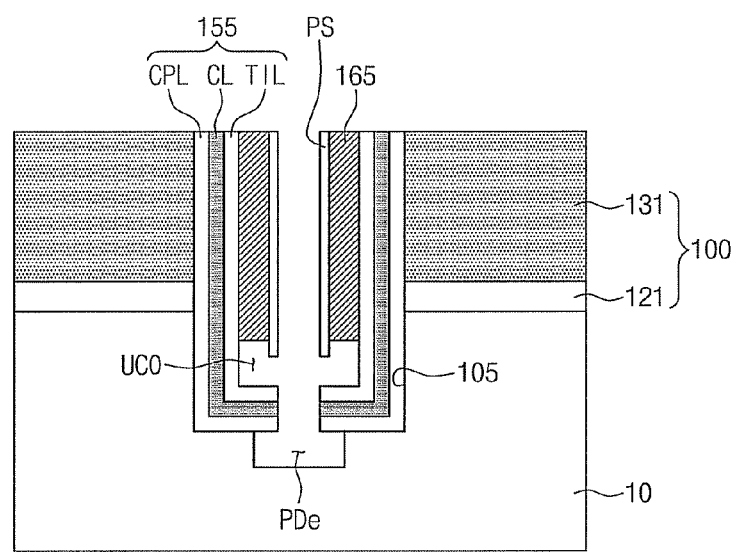
Figure 82:
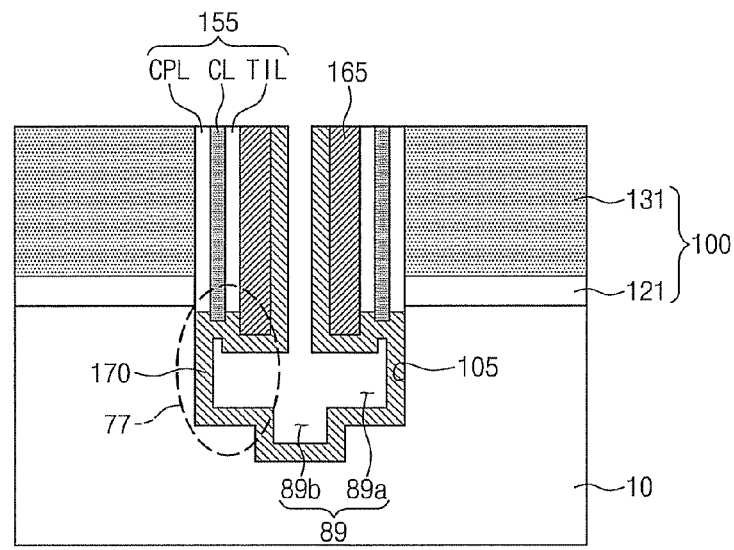

Referring to FIGS. 81 and 82, according to example embodiments of the inventive concepts, a penetrating dent PD may be formed to penetrate the vertical layer 150 and expose the top surface of the substrate 10. Referring to FIG. 81, as a top surface of the substrate 10 exposed by the penetrating dent PD is etched during the forming of an extended under-cut region UC0, the extended penetrating dent PDe may be formed below the vertical pattern 155. Similarly to example embodiments described with respect to FIGS. 76-80, a void 89 may be formed in the second semiconductor layer 170. Referring to FIG. 82, the void 89 may include an upper void 89a in the under-cut region 77 and a lower void 89b in the extended penetrating dent PDe. According to example embodiments, the void 89 may be completely or partially filled by an insulation material (e.g., a silicon oxide layer).

According to example embodiments, a re-crystallization process for the semiconductor spacer 165 and the second semiconductor layer 170 may be performed (e.g., after the forming of the second semiconductor layer 170). A density of crystal defects in the semiconductor spacer 165 and the second semiconductor layer 170 may be reduced by the re-crystallization process. For example, if the semiconductor spacer 165 and the second semiconductor layer 170 are formed of polycrystalline silicon, the re-crystallization process may increase grain sizes or may form single crystal structures. The re-crystallization process may be performed using at least one of thermal treatment techniques, laser annealing techniques, and/or epitaxial techniques. If the substrate 10 is a single crystal wafer, the substrate 10 may have less crystal defects than the semiconductor spacer 165 and the second semiconductor layer 170 on the average.

Figure 83:
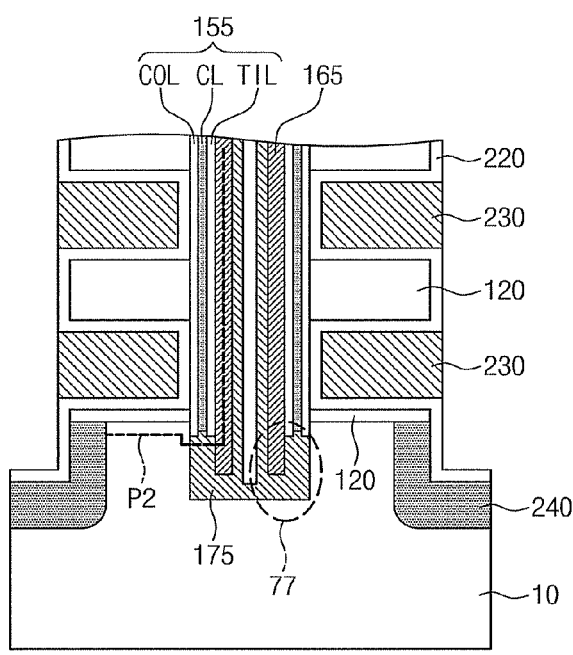
FIG. 83 is a cross-sectional diagram illustrating a current path in a three dimensional semiconductor device described with reference to FIGS. 70-82.

FIG. 83 is a cross-sectional diagram illustrating a current path in a three-dimensional semiconductor device described with reference to FIGS. 70-82. As described with reference to FIG. 68, in case of the three-dimensional semiconductor device described with reference to FIGS. 1-21, because of the presence of the vertical pattern 155 extending into a top surface of the substrate 10, a current path P1 passing through the impurity region 240 may lengthen. According to example embodiments illustrated in FIG. 83, because the second semiconductor layer 170 and/or the semiconductor body portion 175 may be formed adjacent to the lowermost conductive pattern 230 by the under-cut region 77, a current path P2 may be closer to the lowermost conductive pattern 230 than the current path P1 shown in FIG. 68. Accordingly, according to example embodiments, lengthening of the current path and exponential increase of electrical resistance may be prevented and/or reduced.

FIGS. 84-90 are cross-sectional diagrams illustrating example embodiments with respect to forming an under-cut region 77 described with reference to FIG. 24. Three-dimensional semiconductor devices including the under-cut region 77 on a bottom surface of the vertical pattern 155 and methods of fabricating the semiconductor devices may be described. Methods of forming the under-cut region 77 and structures according thereto are not limitedly applied to the structure shown in FIG. 24. Those skilled in the art may easily apply the inventive concepts according to example embodiments related to the under-cut region 77 and an expansive description may be omitted. Furthermore, each of the following described methods may be applied instead to the methods of fabricating described with reference to FIGS. 3-6 and/or FIGS. 13-14. Other methods may be performed based on following methods (e.g., steps described with reference to FIGS. 7-11 and/or FIGS. 15-21).

Figure 84:
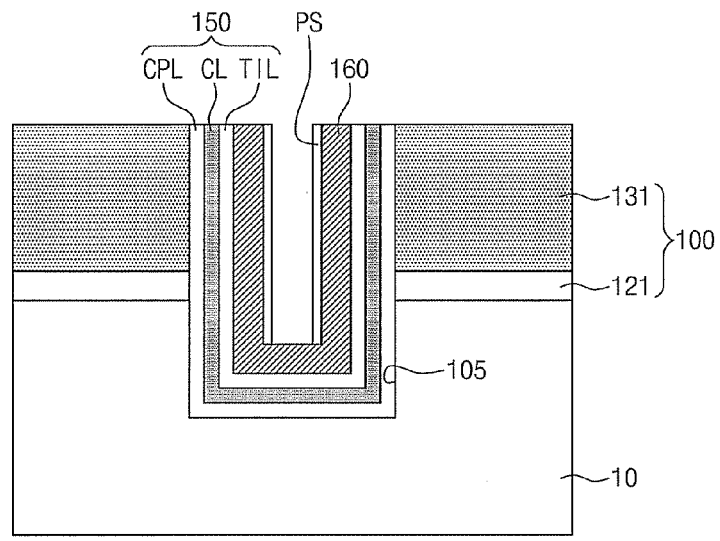
FIGS. 84-90 are cross-sectional diagrams illustrating methods of fabricating undercut regions according to example embodiments of the inventive concepts.

Referring to FIG. 84, a mold structure 100 including an insulating layer 121 and a sacrificial layer 131 may be formed on a substrate 10. An opening 105 penetrating the mold structure 100 to expose a top surface of the substrate 10 may be formed. A vertical layer 150 and a first semiconductor layer 160 may be formed on the inner wall of the opening 105 (e.g., sequentially formed). A protective layer spacer PS exposing the top surface of the first semiconductor layer 160 at the bottom of the opening 105 may be formed on a sidewall of the first semiconductor layer 160.

The mold structure 100 may be substantially identical to that of example embodiments described with reference to FIG. 1. The insulating layer 121 and the sacrificial layer 131 may illustrate a portion of the mold structure 100 and the mold structure 100 may further include more insulating layers and sacrificial layers as shown in FIG. 1.

The opening 105 may be formed with, for example, a hole shape (e.g., similar to FIG. 2) and/or to include a portion of a hexahedral shape (e.g., similar to FIG. 12). According to example embodiments, during the forming of the opening 105, the top surface of the substrate 10 may be recessed. The bottom surface of the opening 105 may be lower than the uppermost surface of the substrate 10 contacting the bottom surface of the insulating layer 121. The recess of the substrate 10 may formed by over-etch of the opening 105. The recess of the substrate 10 may contribute to improving structural stability of the vertical pattern 155.

The vertical layer 150 and the first semiconductor layer 160 may be formed to substantially and conformally cover the sidewall and bottom surface of the opening 105. A sum of deposition thicknesses of the vertical layer 150 and the first semiconductor layer 160 may be less than the half of the width of the opening 105. The opening 105 may not be completely filled by the vertical layer 150 and the first semiconductor layer 160.

The vertical layer 150 and the first semiconductor layer 160 may be formed as the vertical structure VS according to example embodiments described with reference to FIGS. 28-43. For example, the vertical layer 150 may include a capping layer CPL, a charge storing layer CL and a tunnel insulating layer TIL, which may be deposited (e.g., sequentially deposited). A material and property of each of the capping layer CPL, the charge storing layer CL and the tunnel insulating layer TIL may be substantially identical to example embodiments described with reference to FIGS. 28-43. The first semiconductor layer 160 may be a polycrystalline silicon layer.

The protective layer spacer PS may include at least one material with etch selectivity to the first semiconductor layer 160. For example, the protective layer spacer PS may be a silicon oxide layer and/or a silicon nitride layer. The forming of the protective layer spacer PS may include exposing the top surface of the first semiconductor layer 160 at the bottom of the opening 105 by, for example, anisotropically etching the structure with the protective layer (e.g., after the forming of a protective layer on the structure including the first semiconductor layer 160). The protective layer may be formed using, for example, CVD and/or ALD. A thickness of the protective layer may be less than the half of the width of a gap region defined by the first semiconductor layer 160.

Figure 85:
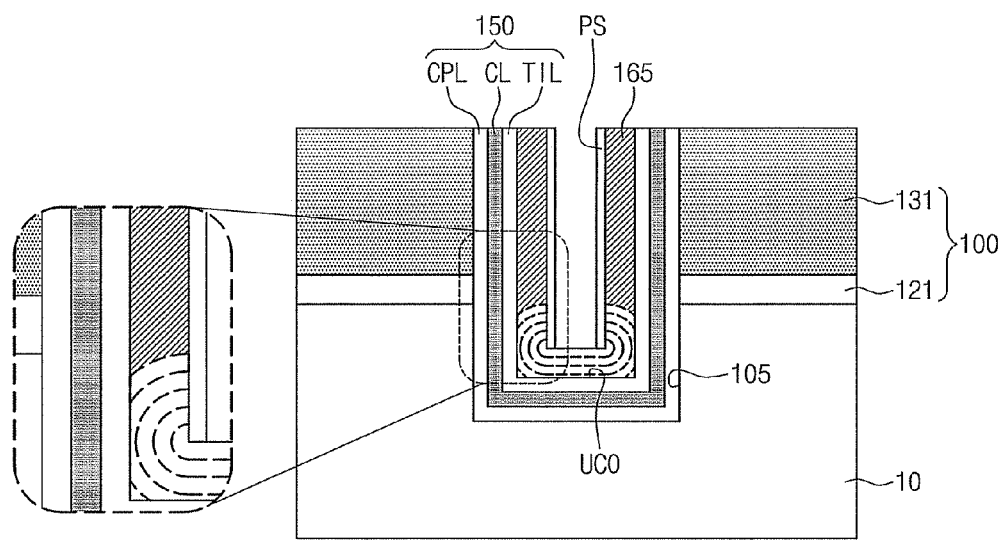

Referring to FIGS. 85-88, by etching the first semiconductor layer 160 and the vertical layer 150 (e.g., sequentially etching), an under-cut region exposing a portion of the sidewall and the bottom surface of the vertical layer 150 may be formed. The forming of the under-cut region, as shown in FIG. 85 may include forming a preliminary under-cut region UC0 that exposes the surface of the tunnel insulating layer TIL by, for example, etching the first semiconductor layer 160 to form a semiconductor spacer 165. For example, the under-cut region UC0 may be formed by isotropically etching the bottom region of the first semiconductor layer 160 using the protective layer spacer PS as an etch mask. According to example embodiments, the first semiconductor layer 160 may be isotropically etched by, for example, a dry etch method without plasma. Because the isotropic etch method may be applied, as shown in the dotted line, the exposed surface of the first semiconductor layer 160 may extend in all directions as an etch process progresses. The bottom surface of the semiconductor spacer 165 may be further spaced from that of the opening 105 than that of the protective layer spacer PS. The bottom surface of the semiconductor spacer 165 may have, for example, a rounded shape using the isotropic etch method.

The isotropic dry etching may be performed using, for example, (1) a first gas including fluorine atoms, (2) a second gas including chlorine atoms, and/or (3) a carrier gas including at least one of argon, helium or nitrogen. According to example embodiments, the first gas may be $CF_4$ and/or $CHF_3$, and the second gas may be $Cl_2$. According to example embodiments, the first gas may be $CF_4$, $CHF_3$, $C_2F_6$, $CCl_2F_2$, $CH_2F_2$, $NF_3$ and/or $SiF_4$, and the second gas may be $Cl_2$, $BCl_3$, and/or $HCl$. According to example embodiments, during the isotropic dry etching, etching gases including HBr, oxygen, and/or hydrogen may be used.

The isotropic dry etch may be performed under a pressure of less than about 1 atmospheric pressure and a temperature of about 200° C. to about 700° C. For example, the isotropic dry etching may be performed under a pressure of about 10 Torr to about 300 Torr and a temperature of about 350° C. to about 500° C. The dry etch may not use plasma so that damage of the first semiconductor layer 160 and/or the vertical layer 150 due to plasma may be prevented and/or reduced. Isotropic etch of the first semiconductor layer 160 may be possible. If an aspect ratio of the opening 105 is large, isotropic dry etch of the first semiconductor layer 160 may be effectively performed.

Figure 86:
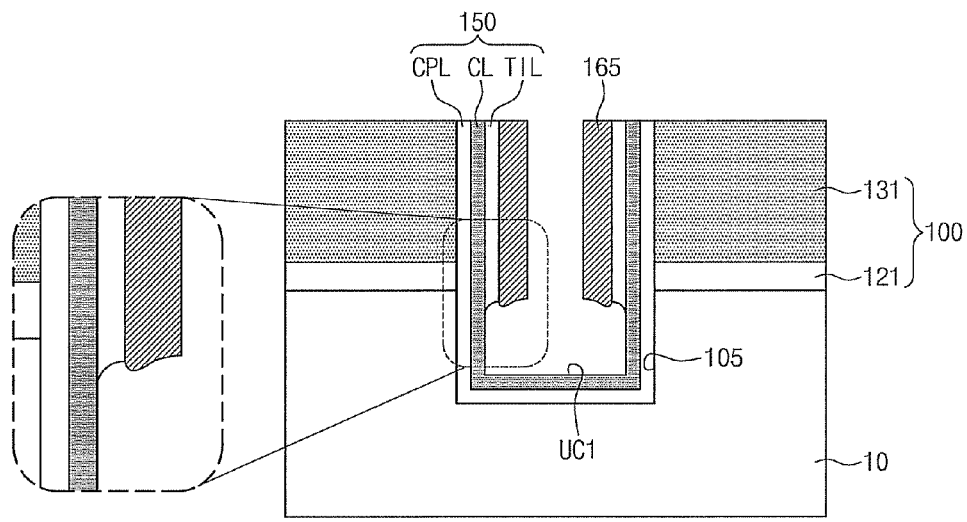
Figure 87:
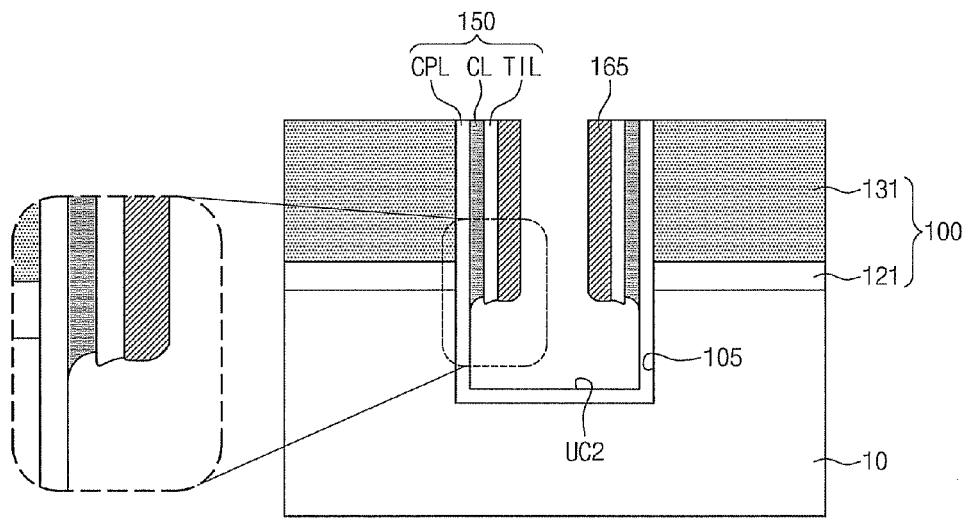
Figure 88:
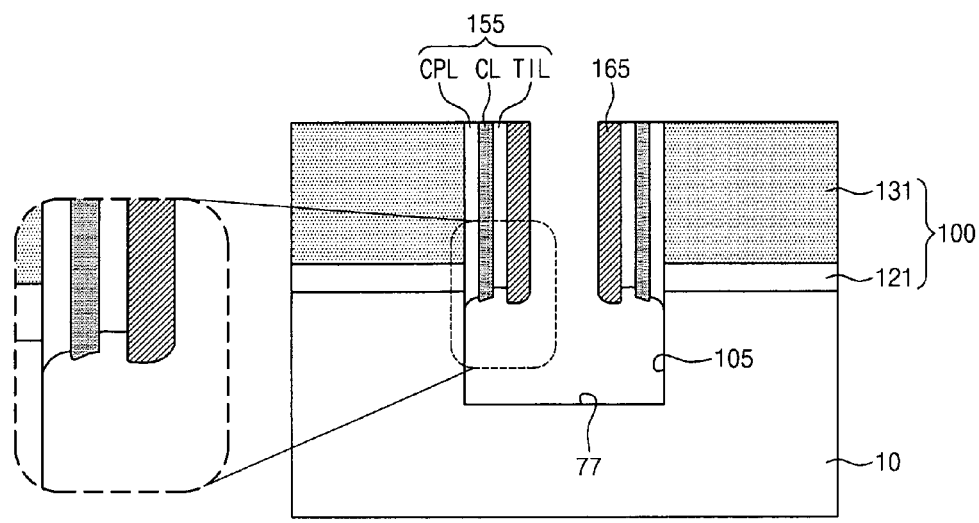

Referring to FIG. 86, a surface of the charge storing layer CL defining a first under-cut region UC1 may be exposed by etching the tunnel insulating layer TIL exposed through the preliminary under-cut region UC0. Referring to FIG. 87, a surface of the capping layer CPL defining a second under-cut region UC2 may be exposed by etching the charge storing layer CL exposed through the first under-cut region UC1. Referring to FIG. 88, the under-cut region 77 may be completed by etching the capping layer CPL exposed through the second under-cut region UC2 to expose the bottom surface and sidewall of the substrate 10.

The etching of the tunnel insulating layer TIL, the charge storing layer CL, and the capping layer CPL may be performed using, for example, a wet etch method. According to example embodiments of the inventive concepts, the tunnel insulating layer TIL and the capping layer CPL may be, for example, a silicon oxide layer and the charge storing layer CL may be, for example, a silicon nitride layer. The tunnel insulating layer TIL and the capping layer CPL may be isotropically etched using, for example, an etchant with phosphoric acid. The above-mentioned kinds of thin layers and kinds of etchants used for the thin layers are examples to describe the inventive concepts of example embodiments, and may be diversely modified.

The protective layer spacer PS may be removed during the etching of the vertical layer 150. For example, if the protective layer spacer PS is a silicon oxide layer, the protective layer spacer PS may be removed by, for example, hydrofluoric acid used for etching the tunnel insulating layer TIL and/or the capping layer CPL. If the protective layer spacer is a silicon nitride layer, the protective layer spacer may be, for example, removed by phosphoric acid used for etching the charge storing layer CL.

According to example embodiments, etching of the tunnel insulating layer TIL, the charge storing layer CL and the capping layer CPL may affect an etch profile of a previously etched thin layer. For example, if phosphoric acid is used to etch the charge storing layer CL, the exposed surface of the semiconductor spacer 165 may be partially etched by the phosphoric acid. Shapes of the semiconductor spacer 165 shown in FIGS. 85 and 88 may be different from each other. The bottom edge of the semiconductor pattern shown in FIG. 88 may be, for example, rounder than that of the semiconductor pattern of FIG. 85. Influence of the following etching step for an etch profile of a thin layer may be similarly shown in the tunnel insulating layer TIL and the charge storing layer CL. The etch profiles of FIGS. 84-88 are examples used to describe the influence of the following etch step, and actual etch profile may be diversely modified by an etch process recipe.

According to example embodiments, if the tunnel insulating layer TIL and the capping layer CPL are formed of materials without effectively large etch selectivity, the tunnel insulating layer TIL may be additionally etched while the capping layer CPL is etched. For example, if all the tunnel insulating layer TIL and the capping layer CPL are formed of a silicon oxide layer, the tunnel insulating layer TIL may be etched twice during the etch methods described with reference to FIGS. 86 and 88, and the capping layer CPL may be etched once during the etch methods described with reference to FIG. 88. The bottom region of the tunnel insulating layer TIL may protrude downward below the charge storing layer CL as shown in FIG. 87, but during the etching of the capping layer CPL, may be additionally etched, so that may be recessed upwardly between the charge storing layer CL and the semiconductor spacer 165 as illustrated in FIG. 88. Referring to FIG. 88, an etch profile of the bottom surface of the vertical pattern 155 may be non-uniform. The charge storing layer CL may protrude further downward towards the substrate 10 than the capping layer CPL and the tunnel insulating layer TIL, and the bottom surface of the capping layer CPL may be more adjacent to the top surface of the substrate 10 below the bottom of the tunnel insulating layer TIL than the bottom of the tunnel insulating layer TIL.

Figure 89:
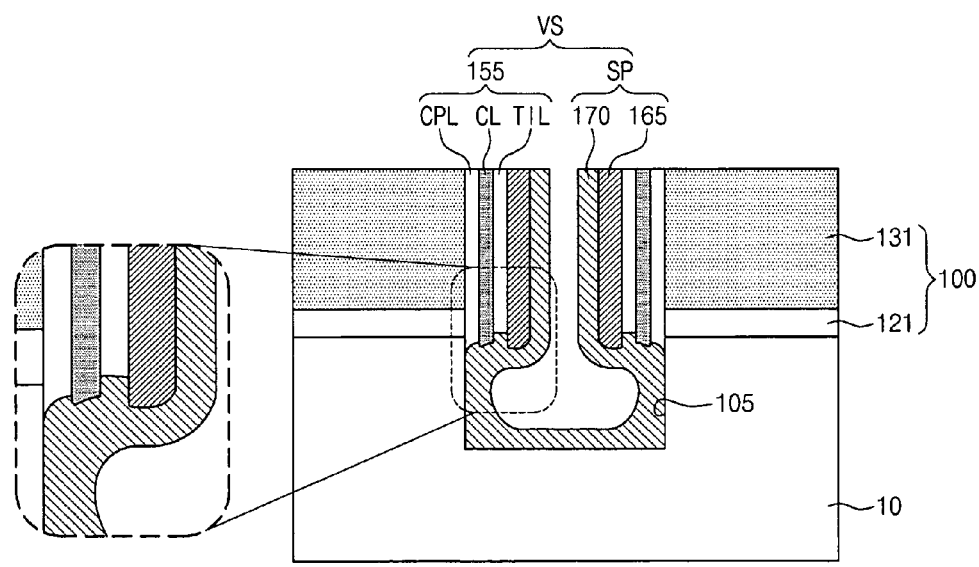
Figure 90:
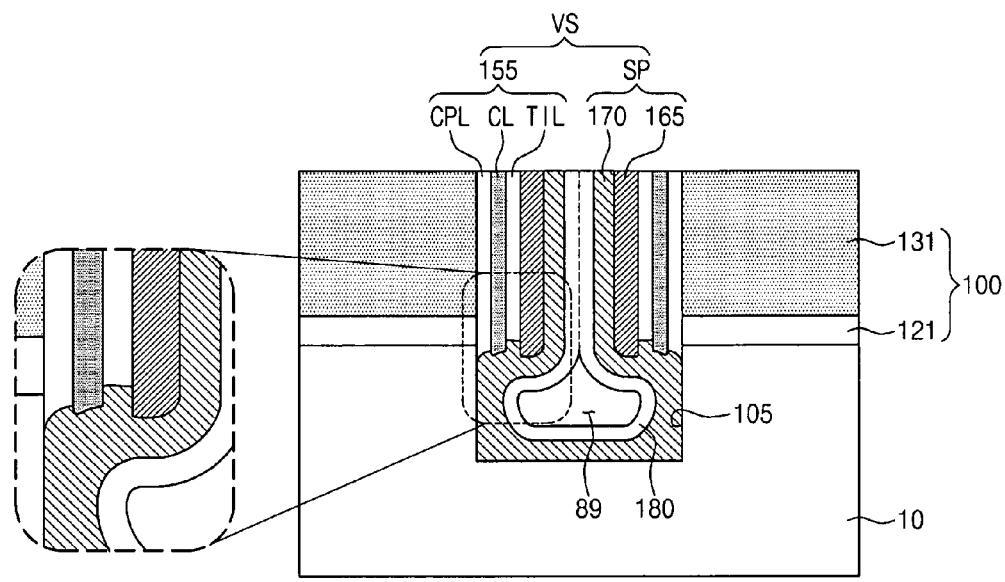

Referring to FIGS. 89 and 90, a second semiconductor layer 170 covering the bottom surface and the sidewall of the substrate exposed through the under-cut region 77 may be formed. A buried insulating layer 180 may be formed on the structure to bury at least a portion of the opening 105. The second semiconductor layer 170 may be a semiconductor material (e.g., polycrystalline silicon) formed using a deposition technique. The second semiconductor layer 170 may extend upwardly from the under-cut region 77 to cover the inner wall of the semiconductor spacer 165 in the mold structure 100. A width and height of the under-cut region 77 may be greater than a width of an empty region defined by the inner wall of the second semiconductor layer 170. As shown in FIG. 90, void 89 not completely filled by the buried insulating layer 180 may be formed in the under-cut region 77.

According to example embodiments, a re-crystallization process for the semiconductor spacer 165 and the second semiconductor layer 170 may be performed (e.g., after the forming of the second semiconductor layer 170). Density of crystal defects in the semiconductor spacer 165 and the second semiconductor layer 170 may be reduced by the re-crystallization process. For example, if the semiconductor spacer 165 and the second semiconductor layer 170 are formed of polycrystalline silicon, the re-crystallization process may increase their grain sizes or may form single crystal structures. The re-crystallization process may be performed using at least one of thermal treatment techniques, laser annealing techniques, and epitaxial techniques. If the substrate 10 is a single crystal wafer, the substrate 10 may have less crystal defects than the semiconductor spacer 165 and the second semiconductor layer 170 on average.

Figure 91:
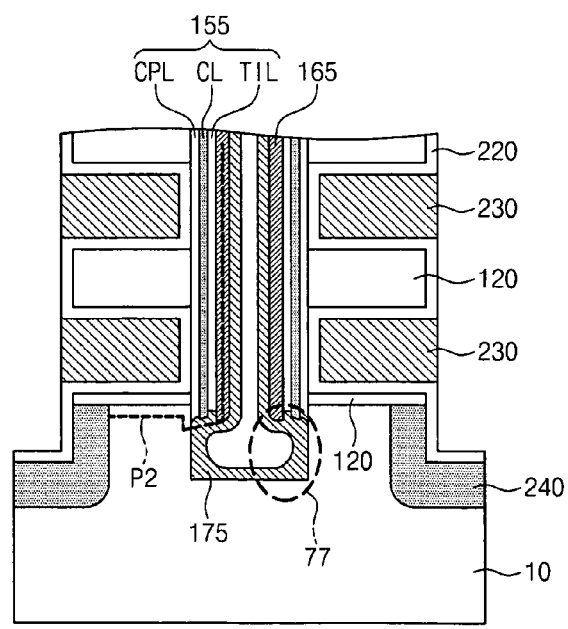
FIG. 91 is a cross-sectional diagram illustrating a current path in a three-dimensional semiconductor device described with reference to FIGS. 84-90.

FIG. 91 is a cross-sectional diagram illustrating a current path in a three-dimensional semiconductor device described with reference to FIGS. 84-90. As described with reference to FIG. 68, in a three-dimensional semiconductor device described with reference to FIGS. 1-21, because of the presence of the vertical pattern 155 extending into a top surface of the substrate 10, a current path P1 passing through the impurity region 240 may lengthen. Referring to FIG. 91, according to example embodiments, because the second semiconductor layer 170 or the semiconductor body portion 175 may be formed adjacent to the lowermost conductive pattern 230 due to the under-cut region 77, a current path P2 may be closer to the lowermost conductive pattern 230 than the current path P1 illustrated in FIG. 68. According to example embodiments, lengthening of the current path and exponential increase of electrical resistance may be prevented and/or reduced.

Figure 92:
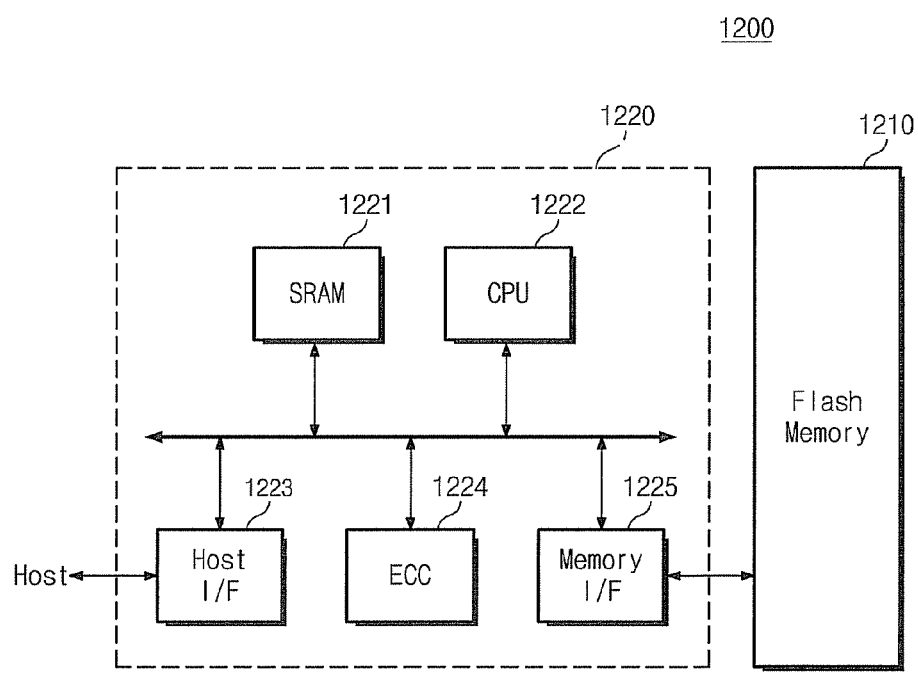
FIG. 92 is a block diagram illustrating memory cards equipped with flash memory devices according to example embodiments of the inventive concepts.

FIG. 92 is a block diagram illustrating memory cards 1200 including flash memory devices 1210 according to example embodiments of the inventive concepts. Referring to FIG. 92, the memory card 1200 for supporting a data storage capability of high capacity may include a flash memory device 1210, for example, including a 3D memory device as described with respect to example embodiments illustrated in FIGS. 1-91. The memory card 1200 according to example embodiments of the inventive concepts may include a memory controller 1220 controlling general data exchanges between a host and the flash memory device 1210.

A SRAM 1221 may be used as an operating memory of a processing unit 1222. A host interface 1223 may include a data exchange protocol of a host connected to a memory card 1200. An error correction block 1224 may detect and correct errors included in data read from a multi-bit flash memory device 1210. A memory interface 1225 may interface with the flash memory device 1210 of example embodiments of the inventive concepts. A processing unit 1222 may perform general control operations for data exchange of the memory controller 1220. Although not shown in the drawing, it is apparent to those skilled in the art that the memory card 1200 may further include ROM (not shown) storing code data to interface with a host.

Figure 93:
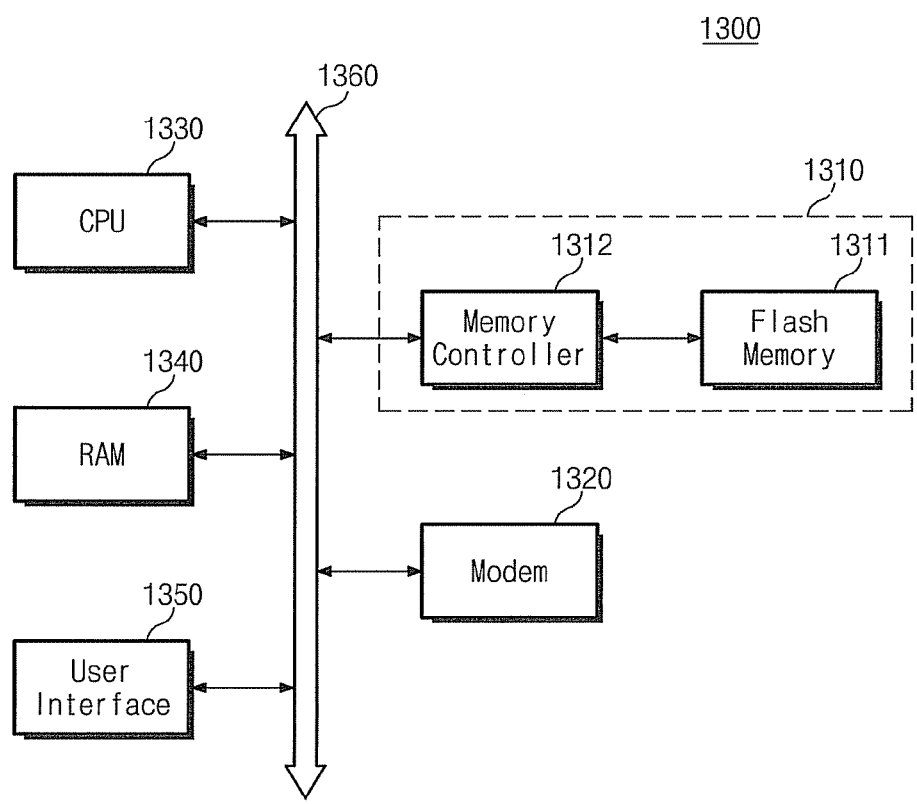

FIG. 93 is a block diagram illustrating information processing systems 1300 including flash memory systems 1310 according to example embodiments of the inventive concepts. Referring to FIG. 93, the flash memory system 1310 may be mounted on an information processing system, for example, a mobile device and/or a desktop computer. The information processing system 1300 may include a flash memory system 1310, a modem 1320, a central processing unit (CPU) 1330, a RAM 1340, and a user interface 1350, electrically connected to a system bus 1360. The flash memory system 1310 may be configured substantially identical to the memory system and/or flash memory system described with respect to FIG. 92. Data processed by the CPU 1330 and/or input from the outside may be stored in the flash memory system 1310. A memory system 1310 may be a solid state drive SSD. The information processing system 1300 may stably store a large amount of data in the flash memory system 1310. As reliability of the information processing system 1300 may be increased, the flash memory system 1310 may conserve resources used for error correction, and a data exchange function of high speed may be provided to the information processing system 1310. Although not shown in the drawing, it is apparent to those of ordinary skill in the art that the information processing system 1300 of example embodiments of the inventive concepts may include an application chipset, a camera image processor (CIS), and/or an input/output device.

A flash memory device and/or a memory system of example embodiments of the inventive concepts may be mounted using various kinds of packages. For instance, the flash memory device and/or the memory system may be mounted with packages such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Point, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

According to example embodiments, a vertical pattern and the horizontal pattern may between a conductive pattern and a semiconductor pattern and may be used as layers for storing information. The vertical pattern may be formed in an opening (e.g., a vertical gap region) before forming of the semiconductor pattern, and the horizontal pattern and the conductive pattern may be formed in a recess region (e.g., a horizontal gap region) after the forming of the semiconductor pattern. Accordingly, three-dimensional semiconductor devices according to example embodiments of the inventive concepts may not be restricted to the technical limitations of a punch-and-plug technique according to a storage-first method described, for example, with reference to FIG. 47. The conductive pattern according to example embodiments of the inventive concepts may be formed of a metallic material. Because the vertical pattern (e.g., a part of layers for storing information) may be aimed in a recess region, a thickness of the conductive pattern according to example embodiments of the inventive concepts may be increased over a plug-first method described, for example, with reference to FIG. 48.

According to example embodiments of the inventive concepts, a crossing structure with horizontally and vertically extended portions may be provided between the sidewalls of the conductive pattern and the semiconductor pattern. The crossing structure may alleviate the technical limitations according to the storage-first method and the plug-first method.

According to example embodiments of the inventive concepts, as described, for example, with reference to FIGS. 1-21, even if a memory gate insulating layer is formed to have a vertical pattern and a horizontal pattern, the semiconductor pattern (e.g., a selection active pattern) used as an active region of the selection transistors may contact the semiconductor substrate without the intervention of an insulation material. Accordingly, a reduction of an operating current and resistance increase of a string described, for example, with reference to FIG. 68 may be prevented and/or reduced.

According to example embodiments, an under-cut region may be formed below a vertical pattern, and a semiconductor material connecting the substrate with the semiconductor spacer may be formed. Accordingly, a reduction of an operating current and resistance increase of a string described, for example, with reference to FIG. 68 may be prevented and/or reduced. According to example embodiments, the under-cut region may be formed using, for example, a dry etch and/or wet etch technique without using plasma. Accordingly, etch damage of the semiconductor spacer due to plasma may be prevented and/or reduced.

While example embodiments have been particularly shown and described, it will be understood by one of ordinary skill in the art that variations in form and detail may be made therein without departing from the spirit and scope of the claims.

What is claimed is:

1. A three-dimensional semiconductor device, comprising:
   an electrode structure including a stacked plurality of electrodes on a substrate;
   a plurality of semiconductor structures extending through the electrode structure; and
   a plurality of memory elements between the semiconductor structures and the electrode structure, the memory elements including a tunnel insulating layer extending in a first direction beyond the plurality of electrodes and a blocking insulating layer extending in a second direction orthogonal to the first direction, wherein the first direction is perpendicular to a top surface of the substrate and the second direction is parallel to the top surface of the substrate.

2. The device of claim 1, wherein the blocking insulating layer covers top and bottom surfaces of the plurality of electrodes.

3. The device of claim 1, further comprising:
   a plurality of interlayer insulating layers between the electrodes in the first direction,
   wherein the tunnel insulating layer extends between sidewalls of the semiconductor structures and sidewalls of the electrodes, and between the sidewalls of the semiconductor structures and sidewalls of the interlayer insulating layers, and
   the blocking insulating layer extends between the sidewalls of the semiconductor structures and the sidewalls of the electrodes, and between surfaces of the interlayer insulating layers.

4. The device of claim 3, further comprising:
   a capping layer between the semiconductor structures and the interlayer insulating layers, the capping layer being of a different material than the interlayer insulating layers.

5. The device of claim 4, wherein the capping layer extends in the first direction between the electrodes and the semiconductor structures, and between the interlayer insulating layers and the semiconductor structures, and
   the capping layer is thinner between the electrodes and the semiconductor structures than between the interlayer insulating layers and the semiconductor structures.

6. The device of claim 4, wherein
   the capping layer includes regions separated in the first direction by the blocking insulating layer.

7. The device of claim 1, further comprising a charge storing layer, wherein:
   the tunnel insulating layer is between the charge storing layer and the semiconductor structures,
   the tunnel insulating layer includes at least one insulating layer,
   the blocking insulating layer includes at least one insulating layer, and
   the blocking insulating layer is between the charge storing layer and the electrodes.

8. The device of claim 7, wherein
   the charge storing layer extends in the second direction.

9. The device of claim 7, wherein
   the charge storing layer extends in the first direction.

10. The device of claim 9, wherein the blocking insulating layer is a different material than the charge storing layer, and
    the device further comprises a capping layer between the charge storing layer and the blocking insulating layer.

11. The device of claim 7, wherein
    at least one insulating layer of the tunnel insulating layer and at least one insulating layer of the blocking insulating layer include materials with a higher band gap than the charge storing layer, and
    a dielectric constant of a material of at least one insulating layer of the blocking insulating layer is larger than a dielectric constant of a material of at least one insulating layer of the tunnel insulating layer.

12. The device of claim 7, wherein
    the tunnel insulating layer includes at least one silicon oxide layer,
    the charge storing layer includes one of an insulating layer with a higher density of trap sites than a silicon oxide layer and an insulating layer with intrinsic conductive nano particles, and
    the blocking insulating layer includes at least one of an aluminum oxide layer, a hafnium oxide layer, a zirconium oxide layer, a tantalum oxide layer, a titanium oxide layer, a silicon nitride layer, a silicon oxynitride layer, and a silicon oxide layer.

* * * * *